(12) United States Patent
Sharma

(10) Patent No.: US 11,502,179 B2
(45) Date of Patent: Nov. 15, 2022

(54) INTEGRATED ASSEMBLIES CONTAINING FERROELECTRIC TRANSISTORS, AND METHODS OF FORMING INTEGRATED ASSEMBLIES

(71) Applicant: Micron Technology, Inc., Boise, ID (US)

(72) Inventor: Pankaj Sharma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 46 days.

(21) Appl. No.: 17/001,660

(22) Filed: Aug. 24, 2020

(65) Prior Publication Data

US 2022/0059667 A1 Feb. 24, 2022

(51) Int. Cl.
| | | |
|---|---|---|
| *H01L 29/423* | (2006.01) | |
| *H01L 29/78* | (2006.01) | |
| *H01L 27/11597* | (2017.01) | |
| *H01L 27/1159* | (2017.01) | |
| *H01L 29/24* | (2006.01) | |
| *H01L 29/16* | (2006.01) | |

(52) U.S. Cl.
CPC .... *H01L 29/42324* (2013.01); *H01L 27/1159* (2013.01); *H01L 27/11597* (2013.01); *H01L 29/7827* (2013.01); *H01L 29/78391* (2014.09); *H01L 29/16* (2013.01); *H01L 29/24* (2013.01)

(58) Field of Classification Search
CPC ........ H01L 27/11553; H01L 27/11556; H01L 27/11585; H01L 27/1159; H01L 27/11597; H01L 29/16; H01L 29/24; H01L 29/42324; H01L 29/7827; H01L 29/78391; H01L 29/7889
See application file for complete search history.

(56) References Cited

U.S. PATENT DOCUMENTS

| | | | | |
|---|---|---|---|---|
| 6,124,729 | A | * | 9/2000 | Noble ............... H01L 27/11556 257/E27.103 |
| 10,535,710 | B2 | | 1/2020 | Sukekawa |
| 10,636,471 | B2 | | 4/2020 | Ramaswamy |
| 10,748,931 | B2 | * | 8/2020 | Karda ............... H01L 27/11597 |

(Continued)

FOREIGN PATENT DOCUMENTS

| | | | | |
|---|---|---|---|---|
| CN | 109768087 | A | * | 5/2019 |
| CN | 110120424 | A | * | 8/2019 |

(Continued)

OTHER PUBLICATIONS

U.S. Appl. No. 16/983,841, filed Aug. 3, 2020, by Karda, et al.

*Primary Examiner* — Matthew E Warren
(74) *Attorney, Agent, or Firm* — Wells St. John P.S.

(57) ABSTRACT

Some embodiments include a ferroelectric transistor having an active region which includes a first source/drain region, a second source/drain region vertically offset from the first source/drain region, and a channel region between the first and second source/drain regions. A first conductive gate is operatively adjacent to the channel region of the active region. Insulative material is between the first conductive gate and the channel region. A second conductive gate is adjacent to the first conductive gate. Ferroelectric material is between the first and second conductive gates. Some embodiments include integrated memory. Some embodiments include methods of forming integrated assemblies.

26 Claims, 56 Drawing Sheets

(56) References Cited

U.S. PATENT DOCUMENTS

2019/0027535 A1\* 1/2019 Kumar .................... H01L 43/02
2020/0006383 A1\* 1/2020 Petti ..................... G11C 15/046
2020/0152644 A1   5/2020 Karda

FOREIGN PATENT DOCUMENTS

| CN | 109755242 B   | \* | 1/2021  |             |
|----|---------------|----|---------|-------------|
| CN | 113454779 A   | \* | 9/2021  | ............. G11C 5/025 |
| DE | 102007054641 A1 | \* | 5/2009 | ......... H01L 27/2445 |
| EP | 1577953 A2    | \* | 9/2005  | ............ H01L 27/115 |
| WO | WO2019/240846 A1 |  | 12/2019 |             |

\* cited by examiner

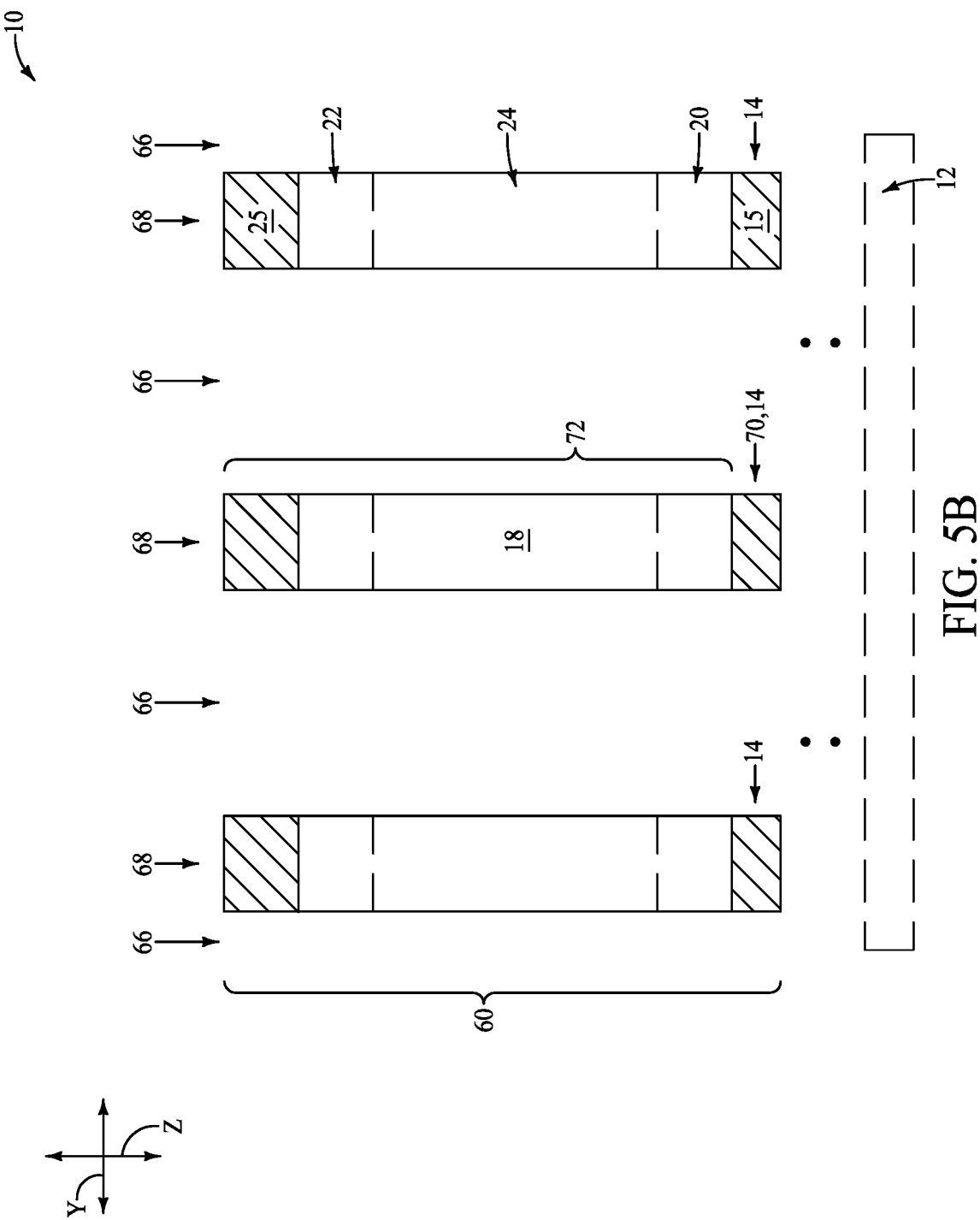

INTEGRATED ASSEMBLIES CONTAINING FERROELECTRIC TRANSISTORS, AND METHODS OF FORMING INTEGRATED ASSEMBLIES

TECHNICAL FIELD

Ferroelectric transistors. Integrated assemblies containing ferroelectric transistors (e.g., integrated memory). Methods of forming integrated assemblies.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, sense lines, or data/sense lines) and access lines (which may also be referred to as wordlines). The digit lines may conductively interconnect memory cells along columns of the array, and the access lines may conductively interconnect memory cells along rows of the array.

Memory cells may be volatile or nonvolatile. Nonvolatile memory can store data for extended periods of time including when the computer is turned off. Volatile memory dissipates and therefore requires being refreshed/rewritten, in many instances, multiple times per second. Regardless, memory cells are configured to retain or store memory in at least two different selectable states. In a binary system the states are considered as either a "0" or a "1". In other systems at least some individual memory cells may be configured to store more than two levels or states of information.

Ferroelectric field effect transistors (FeFETs) may be utilized as memory cells. Specifically, the FeFETs may have two selectable memory states corresponding to two different polarization modes of ferroelectric material within the FeFETS. The different polarization modes may be characterized by, for example, different threshold voltages ($V_T$) or by different channel conductivities for a selected operating voltage. The ferroelectric polarization mode of a FeFET may remain in the absence of power (at least for a measurable duration).

One type of ferroelectric transistor is a metal-ferroelectric-metal-insulator-semiconductor (MFMIS) transistor. Such has a gate dielectric (insulator, I) between a metal (M) and a semiconductor substrate (S). Such also has ferroelectric (F) material adjacent to the metal, and has a gate (typically comprising metal, M) adjacent to the ferroelectric material. In operation, an electric field across the ferroelectric material is used to switch the ferroelectric material from one polarization mode to another. The ferroelectric transistor comprises a pair of source/drain regions, and a channel region between the source/drain regions. Conductivity across the channel region is influenced by the polarization mode of the ferroelectric material.

Channel regions of FeFETS may be considered to be contained within body regions of the ferroelectric transistors. During programming operations, carriers (holes and/or electrons) migrate into and out of the body regions.

It is desired to develop ferroelectric transistors which may be rapidly programmed, and yet which are scalable to ever-increasing levels of integration. It is proving difficult to achieve desired rapid programming with conventional ferroelectric transistor configurations. A problem with conventional ferroelectric transistors may be that the body regions of such transistors are electrically "floating", and thus may be isolated from a source of carrier (either holes or electrons), resulting in floating-body-effects (FBE). The floating-body-effects may be problematic during programming operations. A limiting factor in the speed of the programming operations may be the rate at which carriers are refreshed within the body regions of the transistors, and such rate may be reduced by floating-body-effects. For instance, the ferroelectric transistors may be n-channel devices (i.e., may have n-type source/drain regions, and may have the channel regions operated to conduct electrons between the n-type source/drain regions). The source/drain regions may provide one type of carrier to the body region of a ferroelectric transistor during programming operations (electrons for n-channel devices), but the other type of carrier (holes for n-channel devices) may need to come from bulk material adjacent the body region. In conventional structures the floating body region may be too isolated from the bulk material for rapid replenishment of such other type of carrier, and thus performance may suffer.

It would be desirable to develop new ferroelectric transistors, and to develop new memory array architectures utilizing such transistors.

DETAILED DESCRIPTION OF THE ILLUSTRATED EMBODIMENTS

Some embodiments include ferroelectric transistors. Some embodiments include integrated memory comprising ferroelectric transistors. Some embodiments include methods of forming integrated assemblies comprising ferroelectric transistors. Example embodiments are described with reference to FIGS. 1-22.

Figure 1:
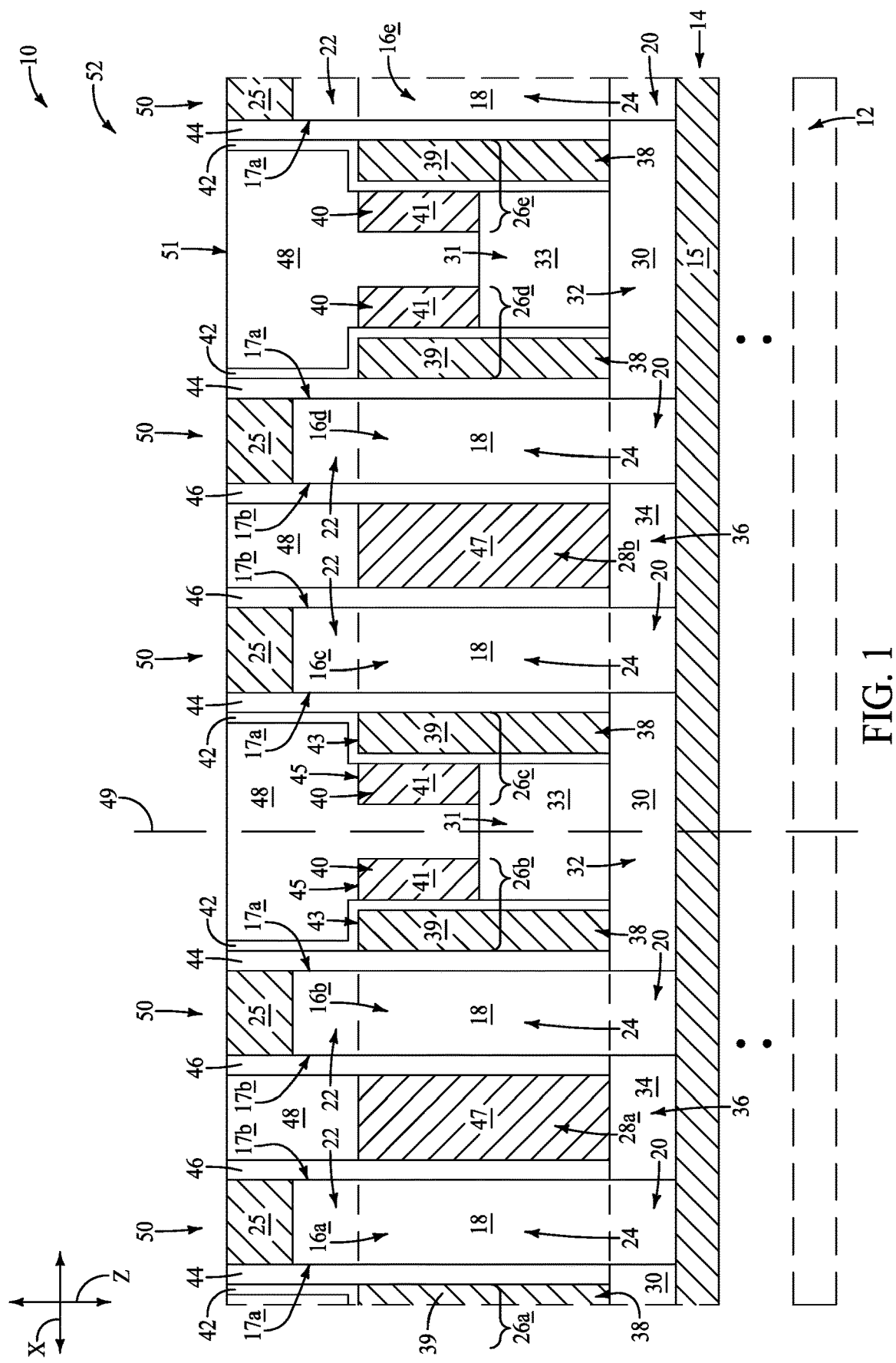
FIGS. 1 and 2 are diagrammatic cross-sectional side views of example regions of example integrated assemblies.

Referring to FIG. 1, an integrated assembly 10 includes a conductive structure 14 supported over a base 12.

The conductive structure 14 may correspond to a digit line (bitline, sense line, etc.), and is shown extending along an x-axis direction (i.e., a direction along the plane of the cross-section of FIG. 1). In some embodiments, the x-axis direction may be referred to as a first direction.

The conductive structure 14 comprises conductive material 15. The conductive material 15 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive structure 14 is an electrical line, and may be referred to as a first comparative digit line. The first comparative digit line may be configured to be compared with a second comparative digit line (described below with reference to FIG. 20) through sense-amplifier-circuitry.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials, such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

Active region pillars 16 are supported by digit line 14, and extend upwardly from digit line. In the illustrated embodiment, the pillars 16 extend vertically along an illustrated z-axis direction, and accordingly extend orthogonally (or at least substantially orthogonally) relative to the horizontally-extending digit line 14. The term "substantially orthogonally" means orthogonally to within reasonable tolerances of fabrication and measurement. The pillars are labeled 16a-e so that they may be distinguished relative to one another.

The pillars 16 may be considered to extend vertically, or at least substantially vertically. In some embodiments, the pillars 16 may extend at an angle of about 90° (i.e., 90°±10°) relative to an upper surface of the horizontally-extending digit line 14.

The pillars 16 comprise semiconductor material 18. The semiconductor material 18 may comprise any suitable composition(s); and in some embodiments may comprise, consist essentially of, or consist of one or more of silicon, germanium, III/V semiconductor material (e.g., gallium phosphide), semiconductor oxide (e.g., semiconductor material comprising gallium, indium, zinc and oxygen), etc.; with the term III/V semiconductor material referring to semiconductor materials comprising elements selected from groups III and V of the periodic table (with groups III and V being old nomenclature, and now being referred to as groups 13 and 15).

In some embodiments, the semiconductor material 18 may comprise, consist essentially of, or consist of silicon. The silicon may be in any suitable crystalline phase (e.g., amorphous, polycrystalline, monocrystalline, etc.).

In some embodiments, the semiconductor material 18 may comprise, consist essentially of, or consist of at least one metal (e.g., one or more of aluminum, gallium, indium, thallium, tin, cadmium, zinc, etc.) in combination with one or more of oxygen, sulfur, selenium and tellurium. In some embodiments, the semiconductor material 18 may comprise at least one element from Group 13 of the periodic table (e.g., gallium) in combination with at least one element from Group 16 of the periodic table (e.g., oxygen). For instance, the semiconductor material 18 may comprise at least one element selected from the group consisting of gallium, indium and mixtures thereof, in combination with at least one element selected from the group consisting of oxygen, sulfur, selenium, tellurium and mixtures thereof. In some embodiments, the semiconductor material 18 may comprise, consist essentially of, or consist of a semiconductor oxide (i.e., a semiconductor material comprising oxygen). For instance, in some embodiments the semiconductor material 18 may comprise, consist essentially of, or consist of InGaZnO (where the chemical formula indicates primary constituents rather than a specific stoichiometry).

Each of the pillars 16 includes a first source/drain region 20 and a second source/drain region 22 vertically offset from first source/drain region. Each of the pillars 16 also includes a channel region 24 between the first and second source of drain regions 20 and 22. Dashed lines are provided to show approximate boundaries between source/drain regions and the channel region.

The source/drain regions 20 and 22 may be n-type regions in some embodiments. For instance, if the semiconductor material 18 comprises silicon, the source/drain regions 20 and 22 may be heavily-doped (e.g., doped to a concentration of at least about $10^{20}$ atoms/cm$^3$) with appropriate n-type dopant (e.g., phosphorus, arsenic, etc.). The channel regions 24 may comprise suitable doping to have desired threshold voltage ($V_T$) characteristics.

The lower source/drain regions 20 are electrically coupled with the digit line 14, and in the illustrated embodiment are shown to be directly against an upper surface of the digit line 14.

Each of the pillars 16 has a first surface (front surface) 17a and an opposing second surface (back surface) 17b along the cross-section of FIG. 1. The surfaces 17a and 17b may be referred to as side surfaces in some embodiments.

Gating structures 26 are adjacent the front surfaces 17a, and conductive structures 28 are adjacent the back surfaces 17b. The gating structures are supported by first insulative steps 32 comprising insulative material 30, and the conductive structures 28 are supported by second insulative steps 36 comprising insulative material 34. The insulative materials 30 and 34 may comprise any suitable composition(s), and may comprise the same composition as one another or may comprise different compositions relative to one another. In some embodiments, the insulative materials 30 and 34 may both comprise, consist essentially of, or consist of silicon dioxide.

The gating structures are labeled as 26a-e so that they may be distinguished relative to one another. Each of the gating structures includes a first conductive component 38, a second conductive component 40, and a ferroelectric material 42 between the conductive components 38 and 40.

The conductive components 38 and 40 comprise conductive materials 39 and 41, respectively. The conductive materials 39 and 41 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive materials 39 and 41 may comprise the same composition as one another, or may comprise different compositions relative to one another. In some embodiments, the conductive materials 39 and 41 may be metal-containing materials, such as, for example, materials comprising one or more of titanium nitride, tungsten nitride, tungsten, titanium, etc.

The ferroelectric material 42 may comprise any suitable composition(s); and may, for example, comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and may have dopant therein which comprises one or more of silicon, aluminum, lanthanum, yttrium, erbium, calcium, magnesium, strontium, and a rare earth element. The ferroelectric material may be provided in any suitable configuration, such as, for example, a single homogeneous material, or a laminate of two or more discrete separate materials.

In some embodiments, the conductive component 38 may be referred to as a first conductive gate, and the conductive component 40 may be referred to as a second conductive gate. The second conductive gates 40 are spaced from the first conductive gates 38 by the ferroelectric material 42. In the illustrated embodiment, the first and second conductive gates 39 and 40 have upper surfaces 43 and 45 (only some of which are labeled) which are at about the same height as one another, and the second conductive gates 40 are shorter than the first conductive gates 38. The second conductive gates 40 may be referred to as being "vertically shorter" than the first conductive gates 38 in the illustrated embodiment in which the gates 38 and 40 both extend along the vertical z-axis.

In the illustrated embodiment, the second components 40 are supported by a second insulative step 31 which comprises insulative material 33. The insulative material 33 may comprise any suitable composition(s), and in some embodiments may comprise, consist essentially of, or consist of silicon dioxide. The insulative material 33 may be the same composition as one or both of the insulative materials 30 and 34, or may be a different composition relative to one or both of the insulative materials 30 and 34.

The first conductive gates 38 may be electrically floating, and the second conductive gates 40 may be coupled with appropriate driver circuitry (e.g., wordline-driver-circuitry). The gating structures 26 vertically overlap the channel regions 24. In some embodiments, the gating structures 26 may be considered to be operatively adjacent to (operatively proximate to) the channel regions 24 such that a sufficient voltage applied to a component 40 of a gating structure will induce an electric field which enables current flow through an adjacent channel region 24 to electrically couple the source/drain regions 20 and 22 on opposing sides of the channel region with one another. If the voltage to the component 40 is below a threshold level, the current will not flow through the channel region, and the source/drain regions on opposing sides of the channel region will not be electrically coupled with one another. The selective control of the coupling/decoupling of the source/drain regions through the level of voltage applied to the component 40 of the gating structure 26 may be referred to as gated coupling of the source/drain regions. In some embodiments, each of the components 38 and 40 of an individual gating structure 26 may be considered to be operatively adjacent to the channel region 24 associated with such gating structure.

The components 38 of the gating structures 26 are spaced from the pillars 16 by insulative material 44. The insulative material 44 may comprise any suitable composition(s), and in some embodiments may comprise, consist essentially of, or consist of silicon dioxide.

The conductive structures 28 comprise conductive material 47. The conductive material 47 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 47 may be a metal-containing material, such as, for example, a material comprising one or more of titanium nitride, tungsten nitride, tungsten, titanium, etc. The conductive material 47 may be a same composition as one or both of the materials 39 and 41 of the gating structures 26, or may be a different composition relative to one or both of the compositions 39 and 41 of the gating structures.

The conductive structures 28 vertically overlap the channel regions 24, and are spaced from the channel regions 24 by insulative material 46. The insulative material 46 may comprise any suitable composition(s), and in some embodiments may comprise, consist essentially of, or consist of silicon dioxide.

The insulative materials 44 and 46 may be referred to as first and second insulative materials, respectively. Such first and second insulative materials may comprise a same composition as one another, or may comprise different compositions relative to one another.

The conductive structures 28 may be electrically coupled to suitable reference voltage structures (not shown) configured to maintain the conductive structures 28 at suitable reference voltages. In some embodiments, such suitable reference voltages may be within a range of from greater than or equal to ground to less than or equal to VCC/2.

The conductive structures 28 may be configured to drain excess carrier from the channel regions 24, and to thereby alleviate floating body effects (FBEs).

The conductive structures 28 of FIG. 1 are labeled as 28a and 28b so that they may be distinguished relative to one another. In the shown embodiment, each of the conductive structures 28 is shared by two of the pillars 16. For instance, the conductive structure 28b is between the pillars 16c and 16d, and is configured to drain excess voltage from the channel region 24 associated with each of the pillars 16c and 16d. In some embodiments, the pillars 16c and 16d may be referred to as first and second pillars, respectively; with such first and second pillars being neighboring to another. The first and second pillars 16c and 16d have second sidewall surfaces (back surfaces) 17b which face one another. The conductive structure 28b is between the facing surfaces 17b of the first and second pillars 16c and 16d.

The pillars 16c and 16d are one example of neighboring pillars. The pillars 16b and 16c may also be considered to be neighboring to one another, and may be referred to as first and second pillars. The first and second pillars 16b and 16c have first sidewall surfaces 17a which face one another. The gating structure 26b may be referred to as a first gating structure which is adjacent the first sidewall 17a of the first pillar 16b, and the gating structure 26c may be referred to as a second gating structure which is adjacent the first sidewall 17a of the second pillar 16c. The first and second gating structures 26b and 26c are substantially mirror images of one another across a plane 49 located centrally between the gating structures 26b and 26c. The term "substantial mirror image" means a mirror image to within reasonable tolerances of fabrication and measurement.

In the illustrated embodiment, conductive material 25 is provided over the upper source/drain regions 22 and is electrically coupled with such upper source/drain regions. The conductive material 25 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 25 may comprise metal (e.g., tungsten, titanium, etc.) and/or metal-containing composition(s) (e.g., tungsten silicide, titanium silicide, etc.). The conductive material 25 is optional, but may be provided to form electrical interconnects for coupling the upper source/drain regions 22 with additional conductive components (e.g., with a second comparative digit line described below with reference to FIG. 20).

The pillars 16 are incorporated into ferroelectric transistors 50, with each of the ferroelectric transistors including one of the pillars and the gating structure 26 operatively adjacent the channel region of the pillar. The ferroelectric transistors 50 correspond to memory cells of a memory array 52.

In the illustrated embodiment, insulative material 48 is provided within gaps between the pillars 16, and a planarized surface 51 is formed to extend across the insulative material 48, the ferroelectric material 42, the insulative materials 44 and 46, and the conductive material 25. The planarized surface 51 may be formed with any suitable processing, including, for example, chemical-mechanical polishing (CMP).

An advantage of the vertically-extending gating structures 26 is that the controlled components 40 (i.e., the components coupled to driver circuitry) may be substantially longer than the average grain size within the ferroelectric material 42. For instance, in some embodiments the ferroelectric material 42 may have an average grain size of at least about 10 nanometers (nm), and the controlled components 40 may have vertical lengths at least about double such average grain size of the ferroelectric material, at least about triple the average grain size of the ferroelectric material, at least about five-times greater than the average grain size of the ferroelectric material, at least about ten-times greater than the average grain size of the ferroelectric material, etc. The relatively large vertical lengths of the controlled components 40 relative to the grain size of the ferroelectric material 42 may alleviate or prevent uniformity problems associated with variations in grain locations within the ferroelectric material 42 across a multitude of ferroelectric transistors of a memory array. Specifically, if the grain size within the ferroelectric material 42 is similar to the vertical lengths of the controlled components 40, then variations amongst the grain boundaries within individual ferroelectric transistors of a memory array may substantially alter performance characteristics of the ferroelectric transistors. If the ferroelectric transistors (i.e., memory cells) across the memory array have different performance characteristics relative to one another, some of the ferroelectric transistors may be outside of operational tolerances, which may reduce available storage within the memory array, and which may even render the memory array unsuitable for intended applications. In contrast, embodiments described herein may enable the vertical lengths of the controlled components 40 to be substantially larger than the grain size within the ferroelectric material 42, which can avoid the problematic variation in performance characteristics across an array of ferroelectric transistors, and which may thereby improve suitability of the memory array for intended applications.

The embodiment of FIG. 1 shows the ferroelectric material 42 extending above the gating structures 26 and along the insulative material 44. In other embodiments, the ferroelectric material 42 may be configured to not extend to above the gating structures 26, as shown in FIG. 2.

Figure 2:
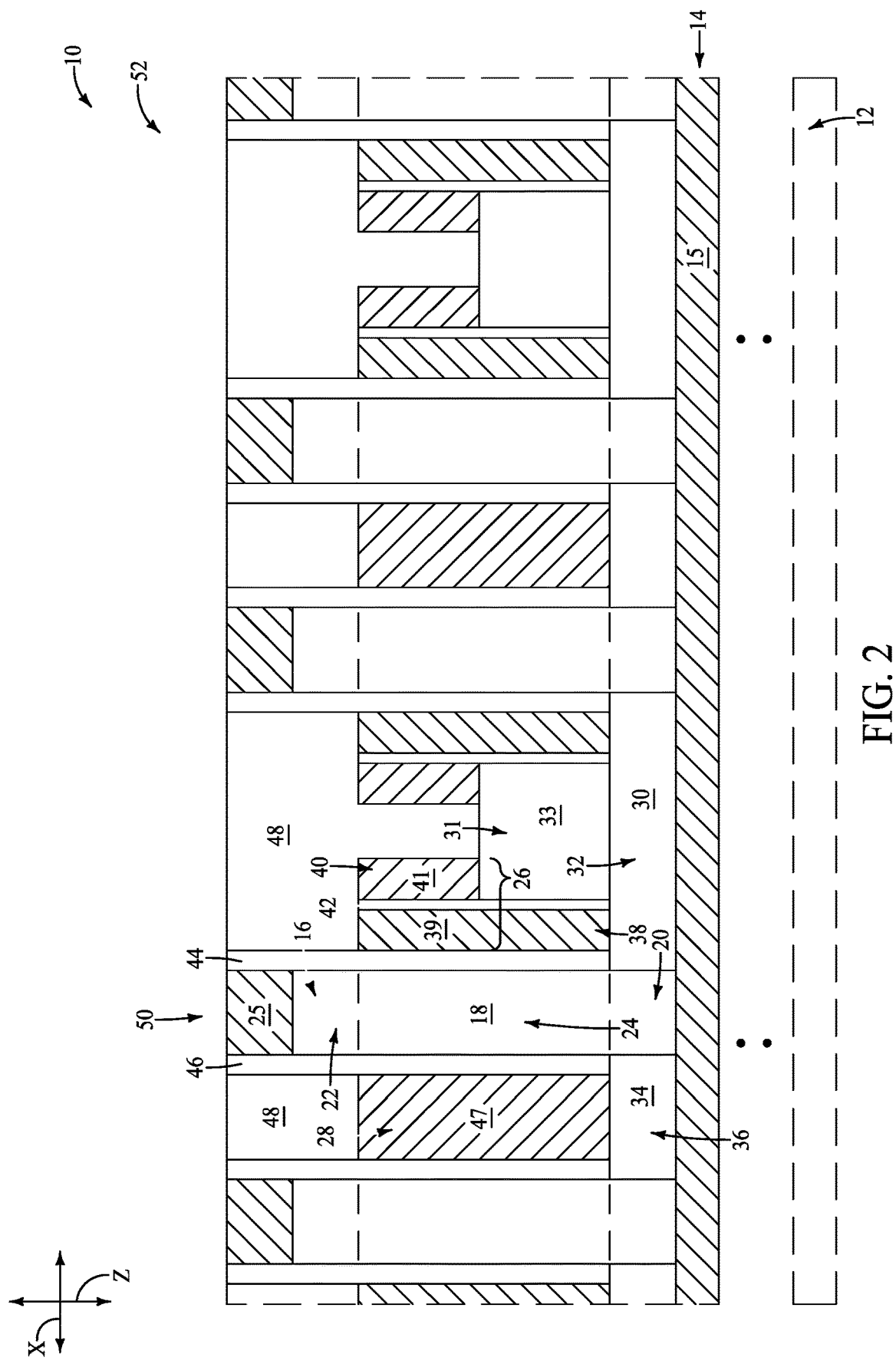

The integrated assemblies 10 of FIGS. 1 and 2 may be formed with any suitable processing. Example processing for forming the memory array of FIG. 1 is described with reference to FIGS. 3-19.

Figure 3:
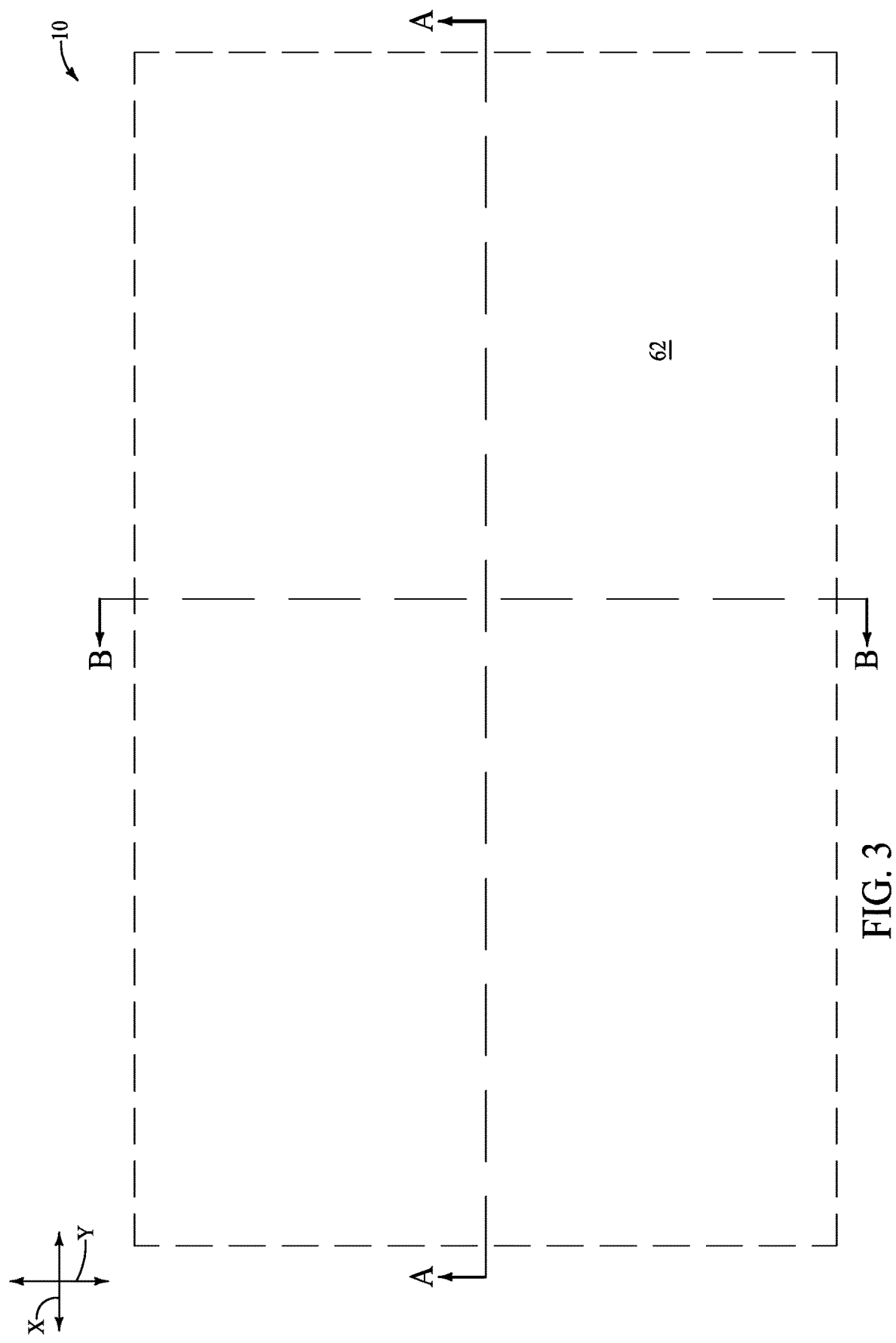
FIGS. 3-3B are a diagrammatic top-down view (FIG. 3) and diagrammatic cross-sectional side views (FIGS. 3A and 3B) of example regions of an example integrated assembly at an example process stage of an example method. The views of FIGS. 3A and 3B are along the lines A-A and B-B, respectively, of FIG. 3.
Figure 3A:
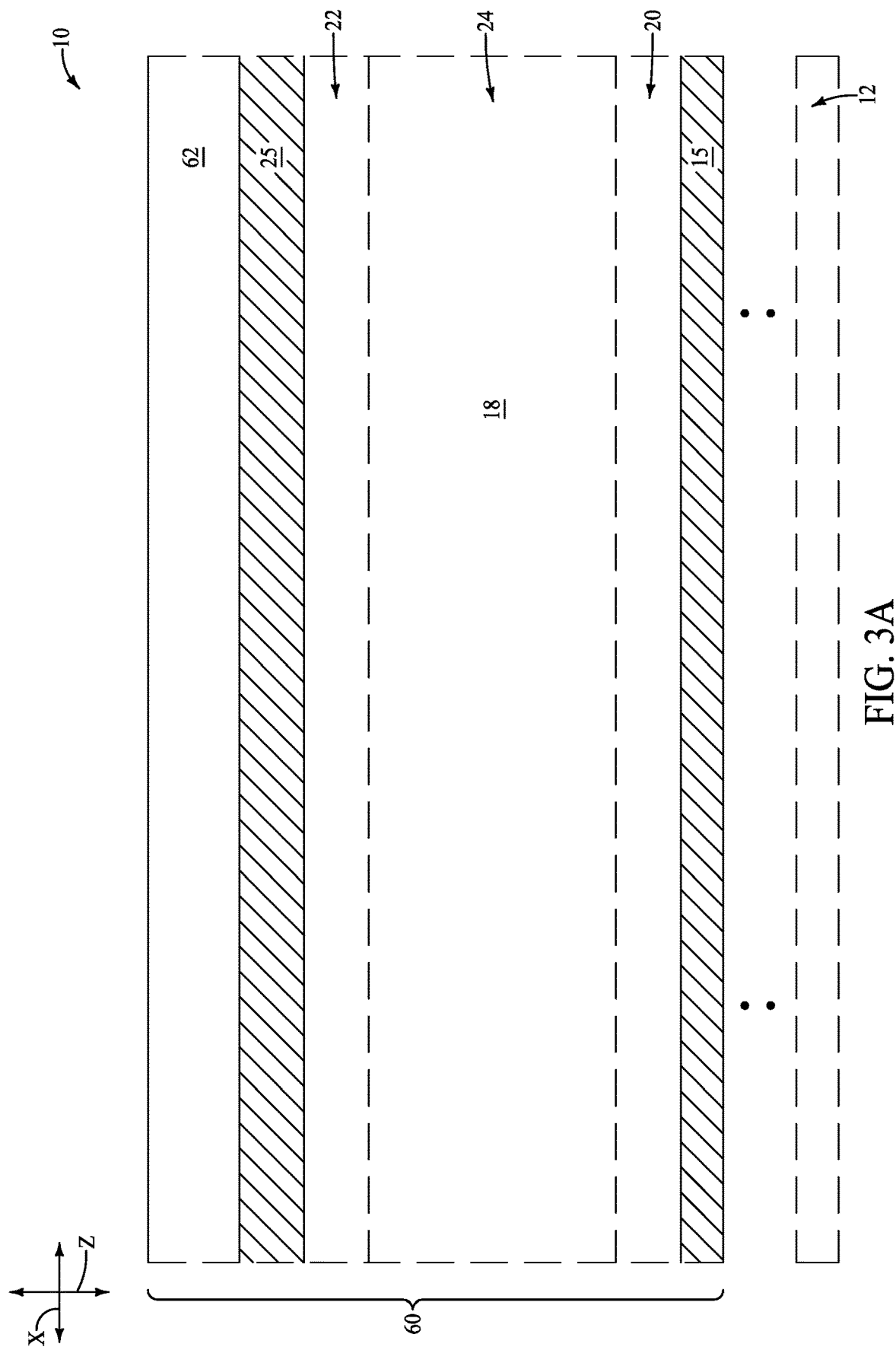
Figure 3B:
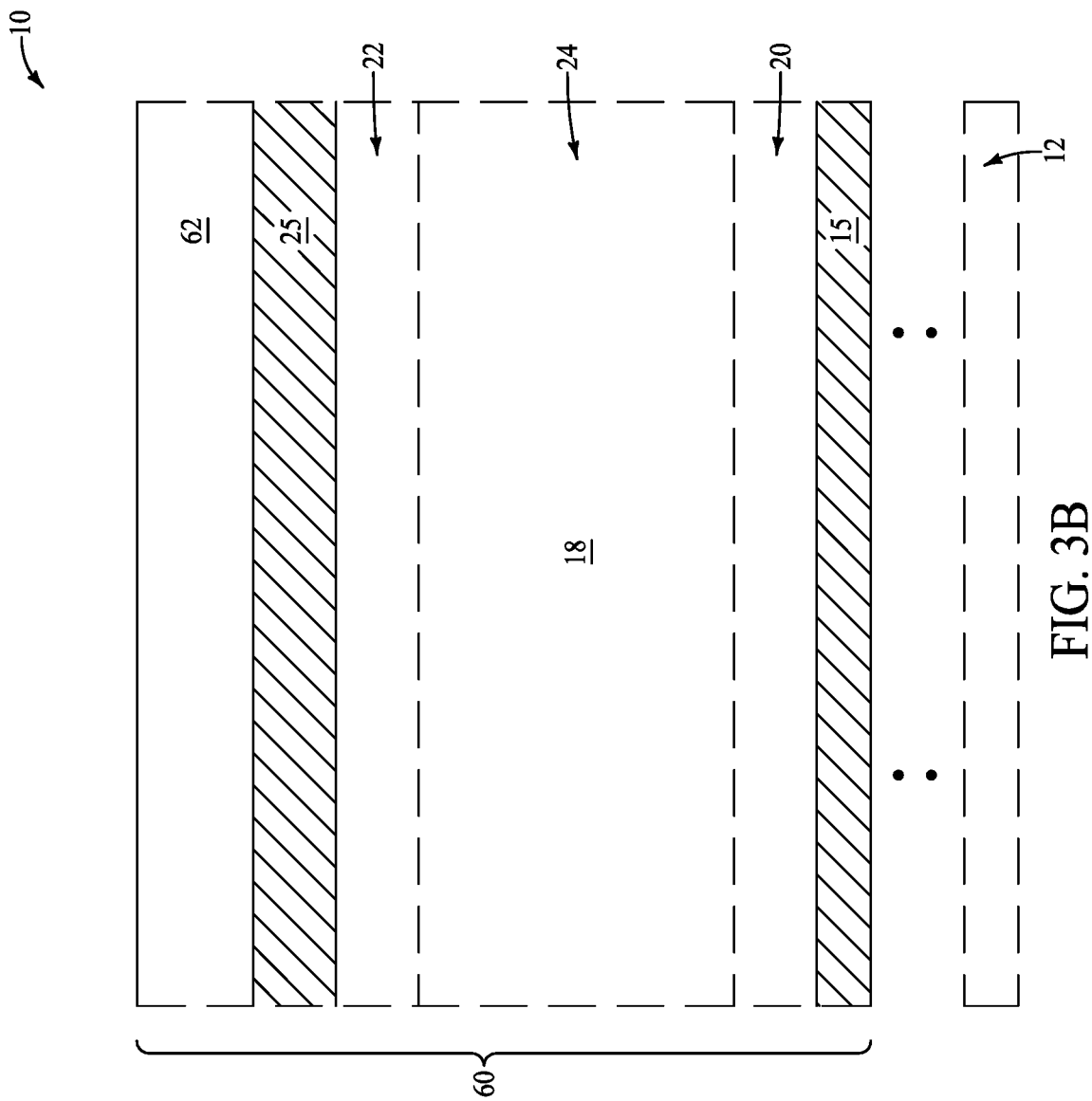

Referring to FIGS. 3-3B, the integrated assembly 10 is shown at a processing stage in which a stack 60 is formed over the base 12. The stack 60 comprises the conductive material 15 as a lower conductive material, the conductive material 25 as an upper conductive material, and the semiconductor material 18 between the lower and upper conductive materials. In the illustrated embodiment, the semiconductor material 18 includes regions 20 and 22 which may ultimately become source/drain regions of ferroelectric transistors, and comprises the region 24 which may ultimately become channel regions of the ferroelectric transistors. Dopant(s) may be within the regions 20 and 22 (and possibly also within the region 24), and such dopant(s) may be activated through suitable processing (e.g., thermal processing).

A masking material 62 is provided over the stack 60. The masking material may comprise any suitable composition(s), and in some embodiments may comprise photoresist.

Figure 4:
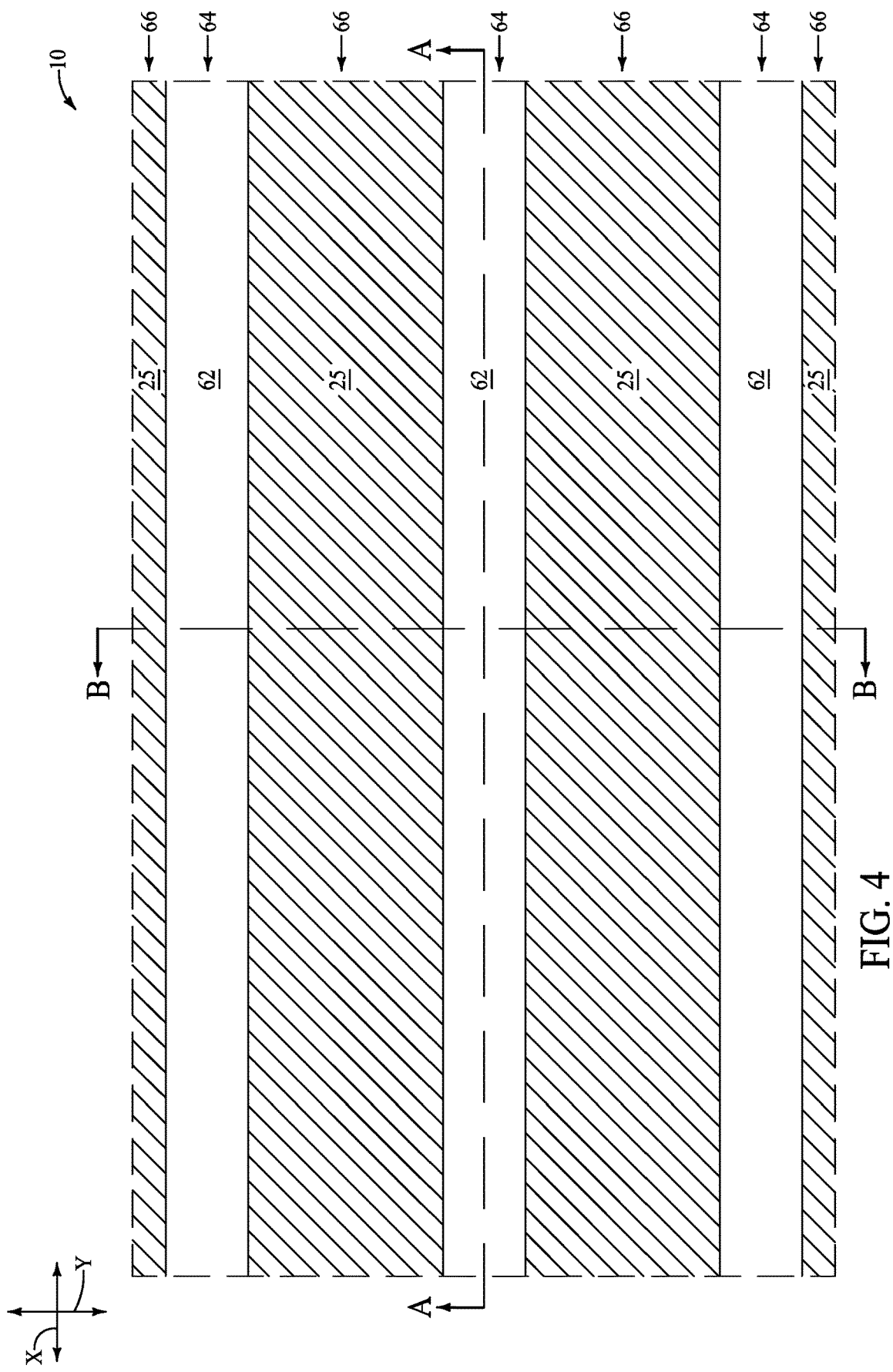
FIGS. 4-4B are a diagrammatic top-down view (FIG. 4) and diagrammatic cross-sectional side views (FIGS. 4A and 4B) of the example regions of the example integrated assembly at an example process stage following the process stage of FIGS. 3-3B. The views of FIGS. 4A and 4B are along the lines A-A and B-B, respectively, of FIG. 4.
Figure 4A:
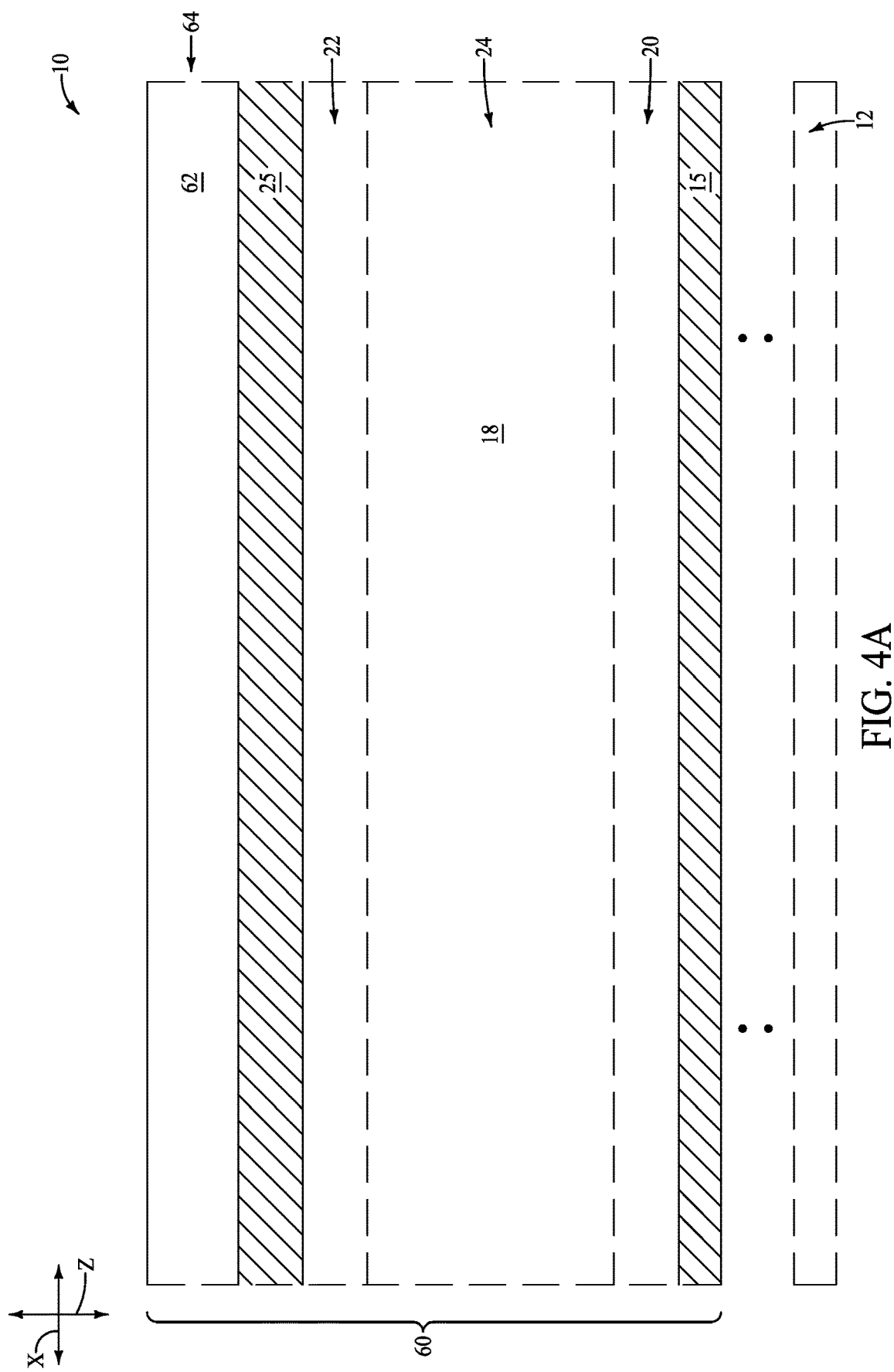
Figure 4B:
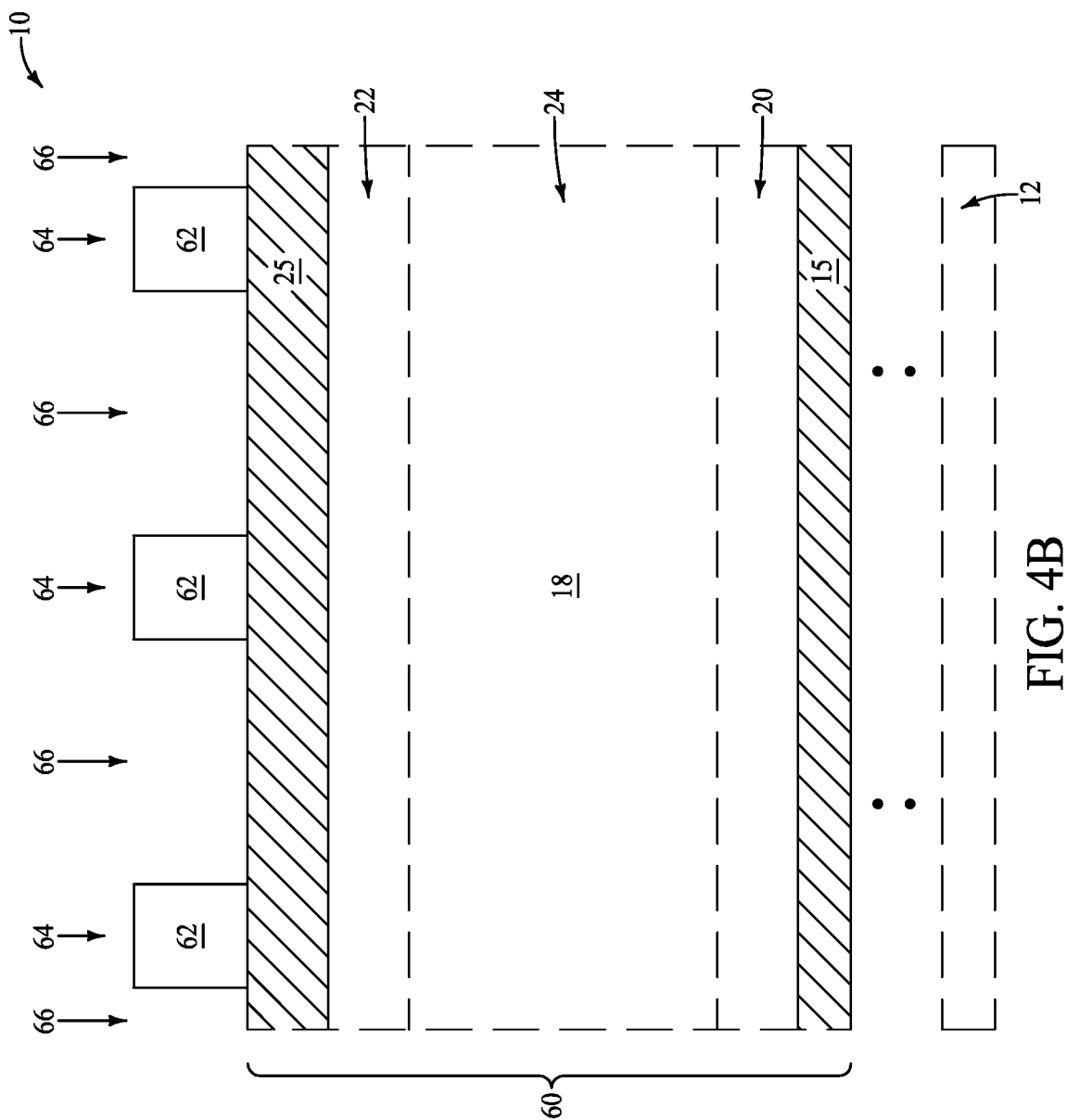

Referring to FIGS. 4-4B, the masking material 62 is patterned into linear blocks 64. Openings 66 extend through the patterned masking material 62. In embodiments in which the masking material 62 comprises photoresist, the photoresist may be patterned with suitable actinic radiation. The linear blocks 64 extend along a first direction (the illustrated x-axis direction). The linear blocks 64 may be referred to as first linear blocks.

Figure 5:
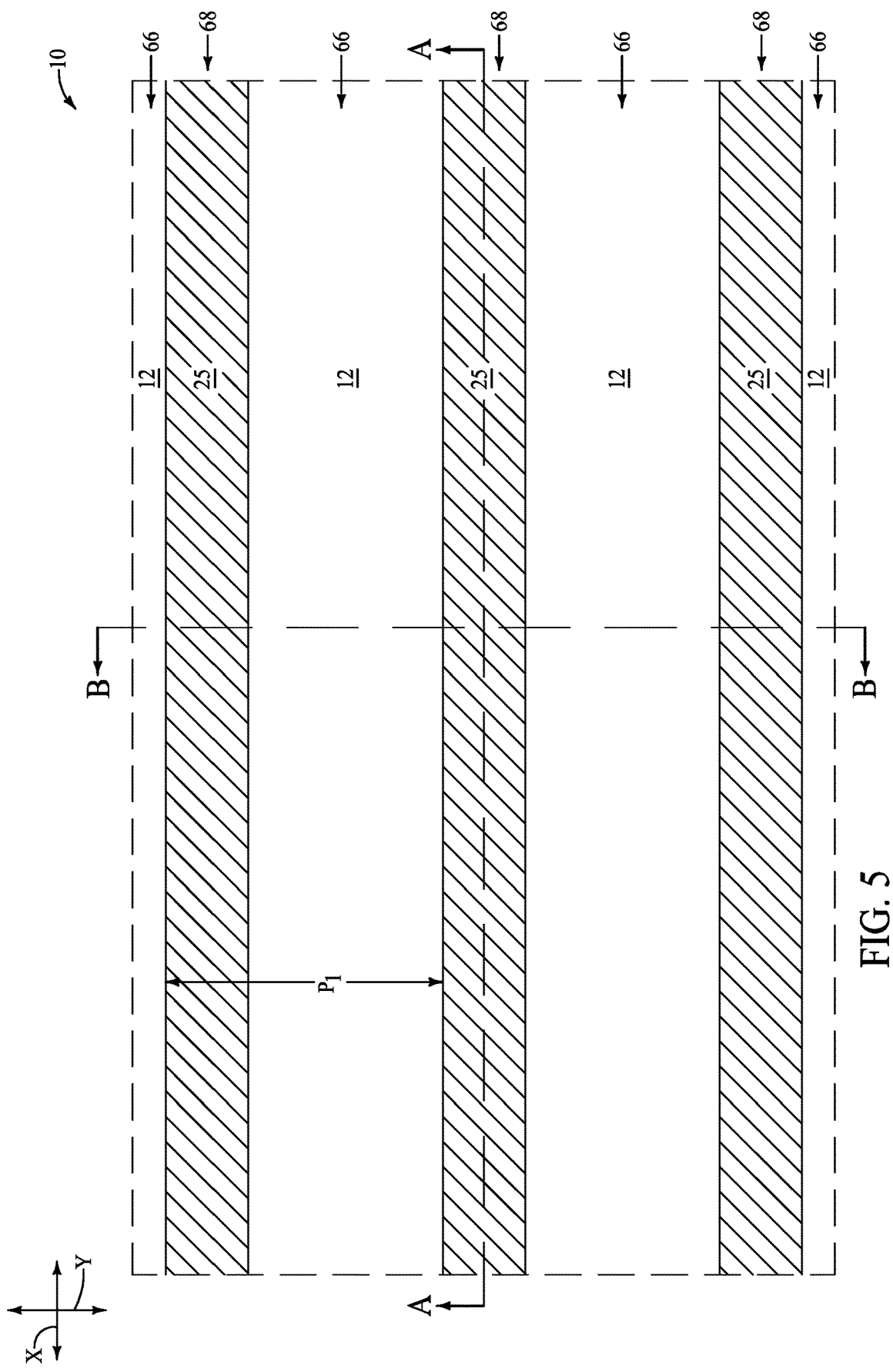
FIGS. 5-5B are a diagrammatic top-down view (FIG. 5) and diagrammatic cross-sectional side views (FIGS. 5A and 5B) of the example regions of the example integrated assembly at an example process stage following the process stage of FIGS. 4-4B. The views of FIGS. 5A and 5B are along the lines A-A and B-B, respectively, of FIG. 5.
Figure 5A:
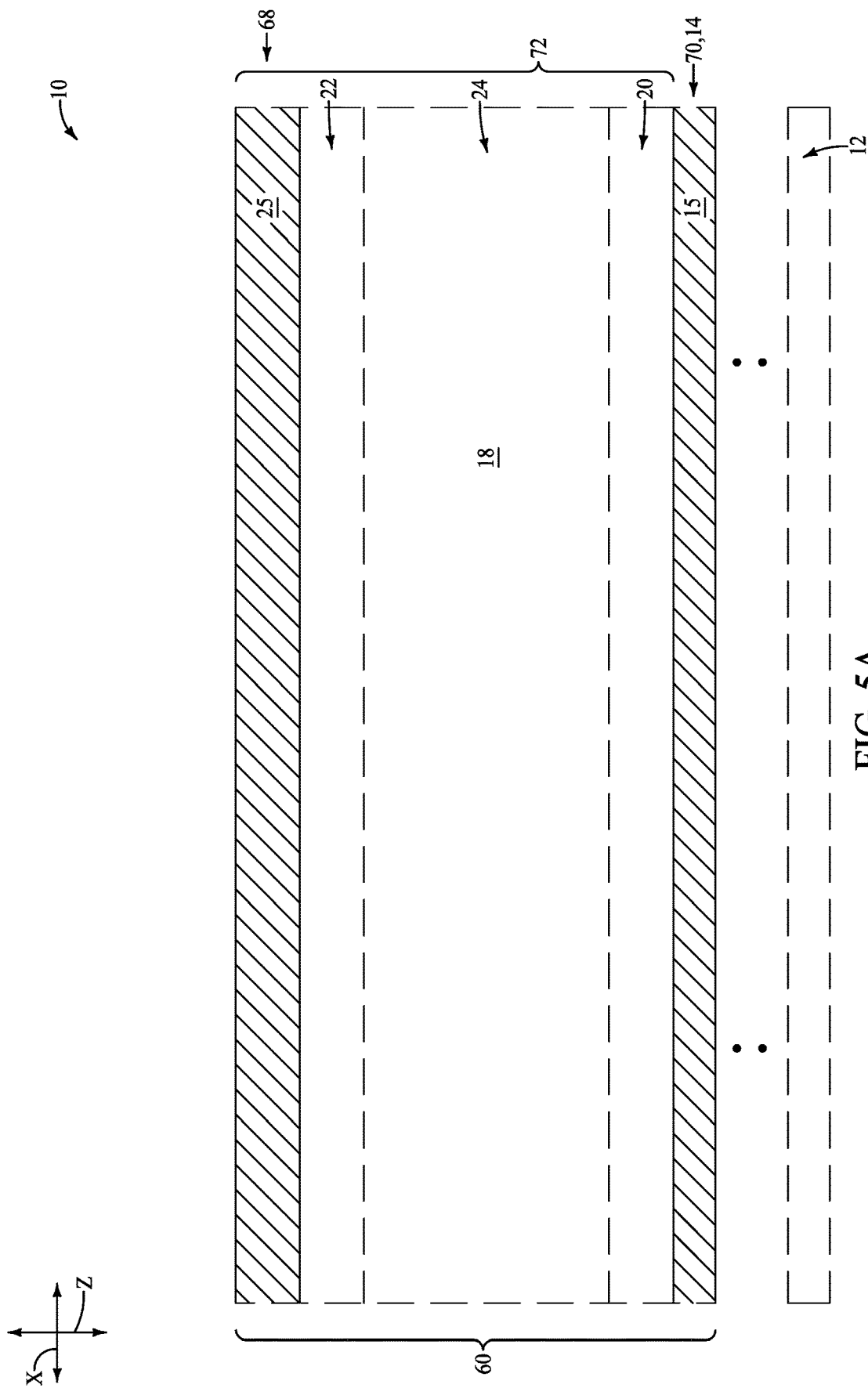

Referring to FIGS. 5-5B, the openings 66 are transferred through the stack 60 with one or more suitable etches, and then the masking material 62 is removed. The stack 60 is patterned into linear structures 68. The linear structures 68 extend along the first direction (the illustrated x-axis direction). Although the linear structures 68 are shown to be straight, in other embodiments such structures may be curved, wavy, etc.

The linear structures 68 may each be considered to comprise a lower portion (bottom portion) 70 and an upper portion 72 over the lower portion. The lower portions 70 are conductive lines 14 of the type described above with reference to FIG. 1, and may ultimately correspond to comparative digit lines. The upper portions 72 include the conductive material 25 and the semiconductor material 18. In some embodiments, the linear structures 68 may be referred to as first linear structures.

The linear structures 68 are on a first pitch $P_1$, as shown in FIG. 5.

Figure 6:
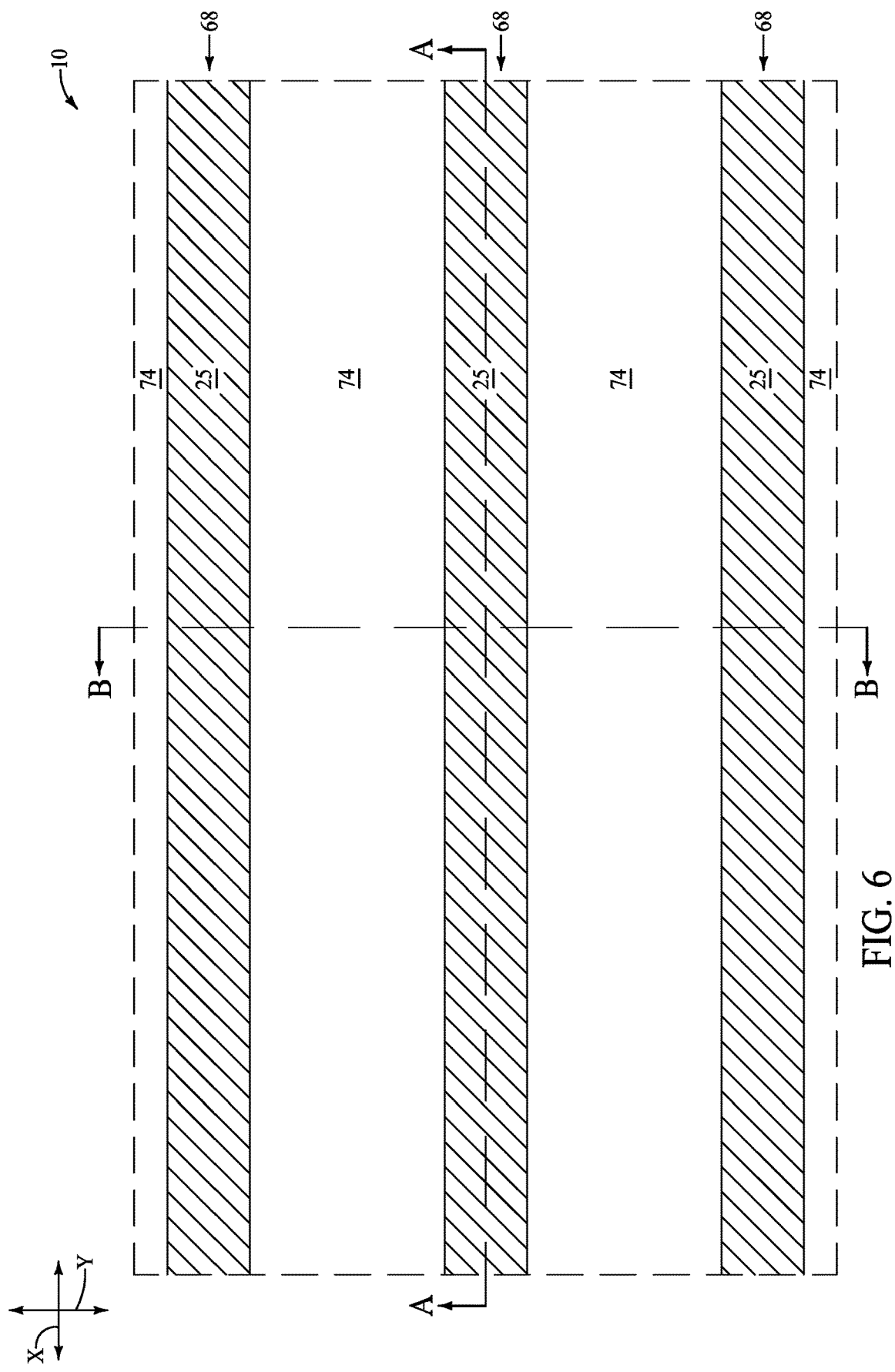
FIGS. 6-6B are a diagrammatic top-down view (FIG. 6) and diagrammatic cross-sectional side views (FIGS. 6A and 6B) of the example regions of the example integrated assembly at an example process stage following the process stage of FIGS. 5-5B. The views of FIGS. 6A and 6B are along the lines A-A and B-B, respectively, of FIG. 6.
Figure 6A:
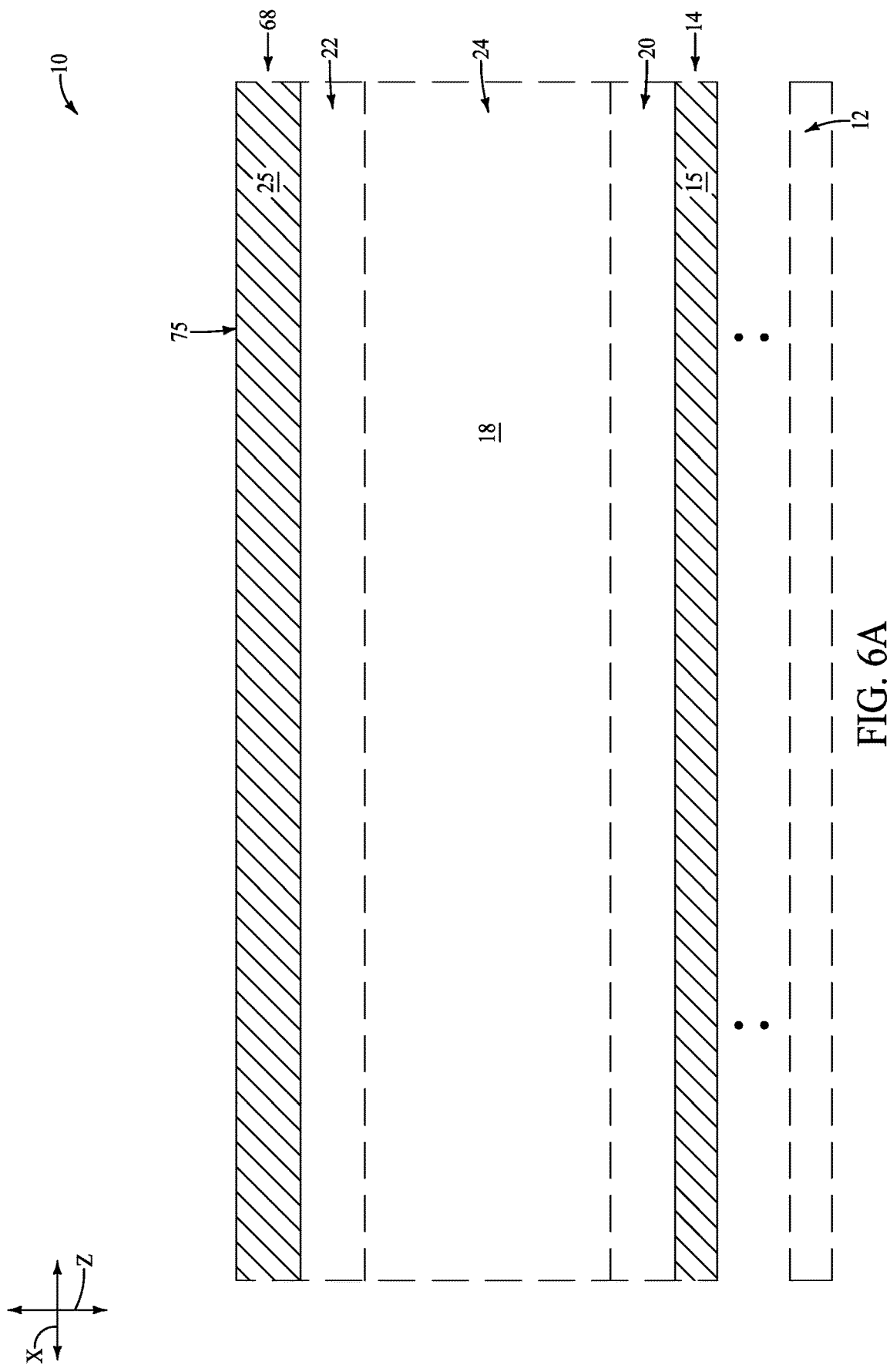
Figure 6B:
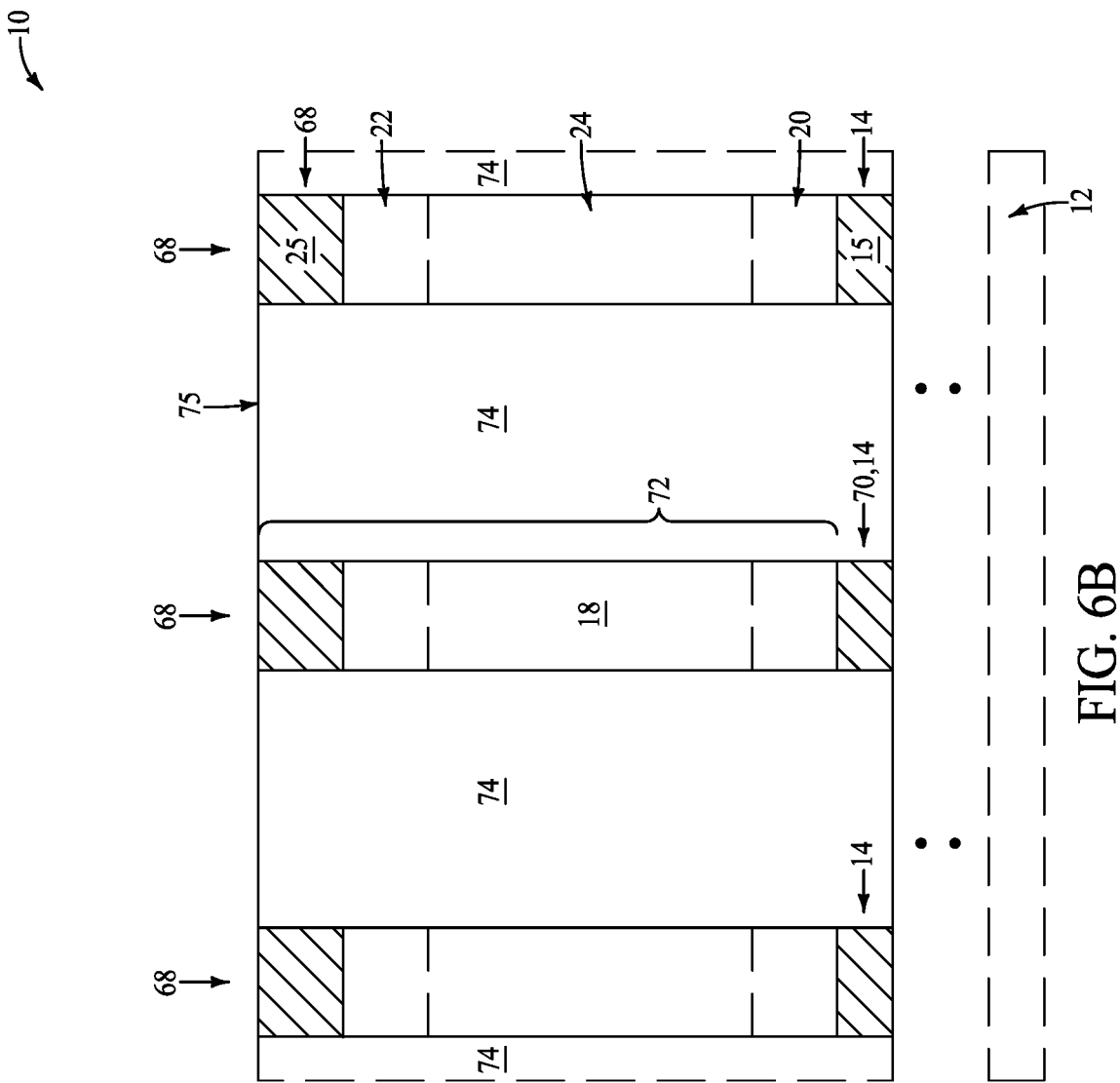

Referring to FIGS. 6-6B, insulative material 74 is formed between the linear structures 68. The insulative material 74 may comprise any suitable composition(s), and in some embodiments may comprise, consist essentially of, or consist of silicon dioxide. A planarized surface 75 is formed to extend across the materials 25 and 74. The planarized surface 75 may be formed with any suitable processing, including, for example, CMP.

Figure 7:
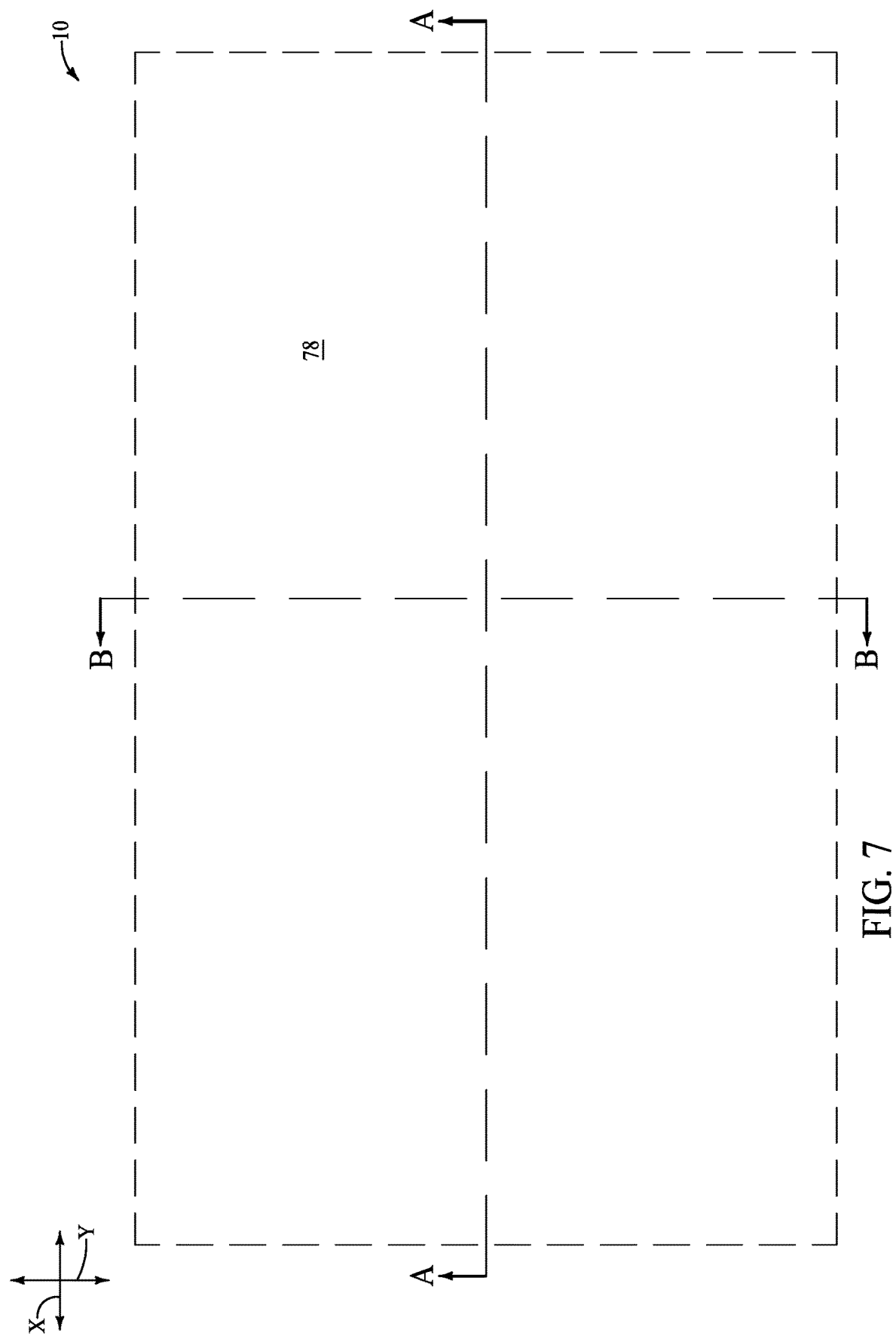
FIGS. 7-7B are a diagrammatic top-down view (FIG. 7) and diagrammatic cross-sectional side views (FIGS. 7A and 7B) of the example regions of the example integrated assembly at an example process stage following the process stage of FIGS. 6-6B. The views of FIGS. 7A and 7B are along the lines A-A and B-B, respectively, of FIG. 7.
Figure 7A:
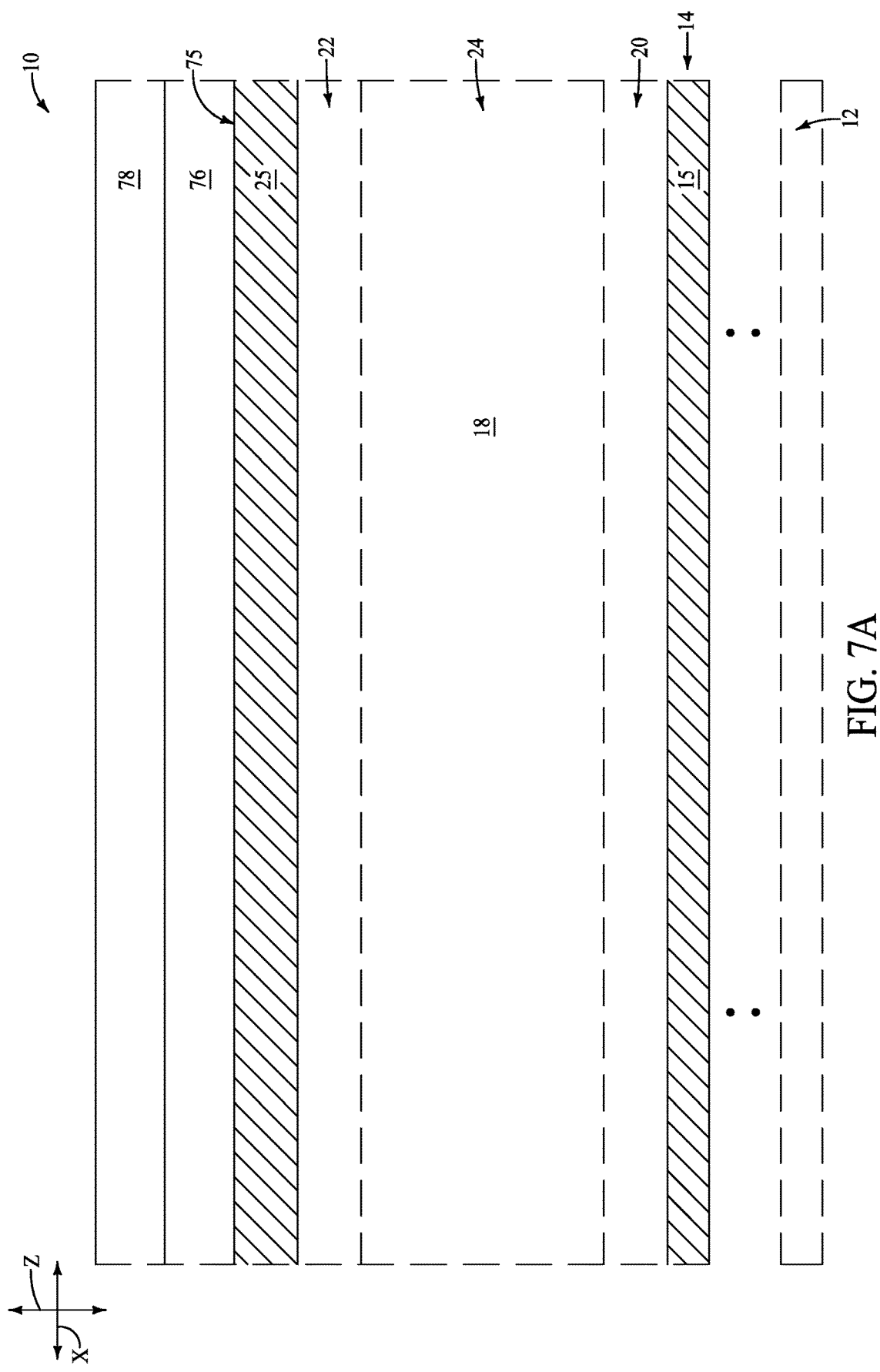
Figure 7B:
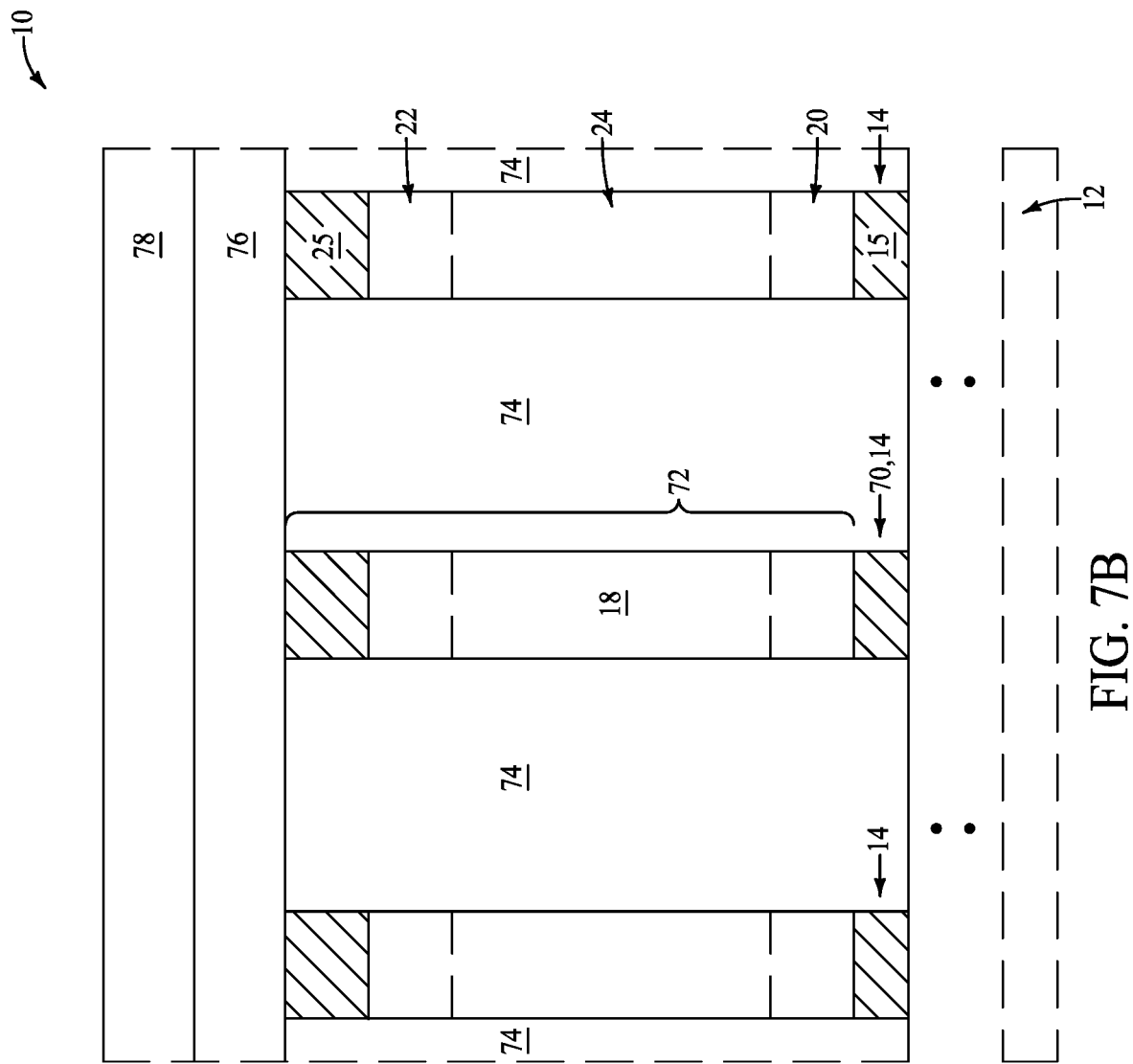

Referring to FIGS. 7-7B, a protective material 76 is formed over the planarized surface 75, and a masking material 78 is formed over the protective material 76.

The protective material 76 may comprise any suitable composition(s), and in some embodiments may comprise, consist essentially of, or consist of silicon nitride. The protective material 76 may comprise a composition which is selectively etchable relative to the materials 25 and 74.

The masking material 78 may comprise any suitable composition(s), and in some embodiments may comprise photoresist.

Figure 8:
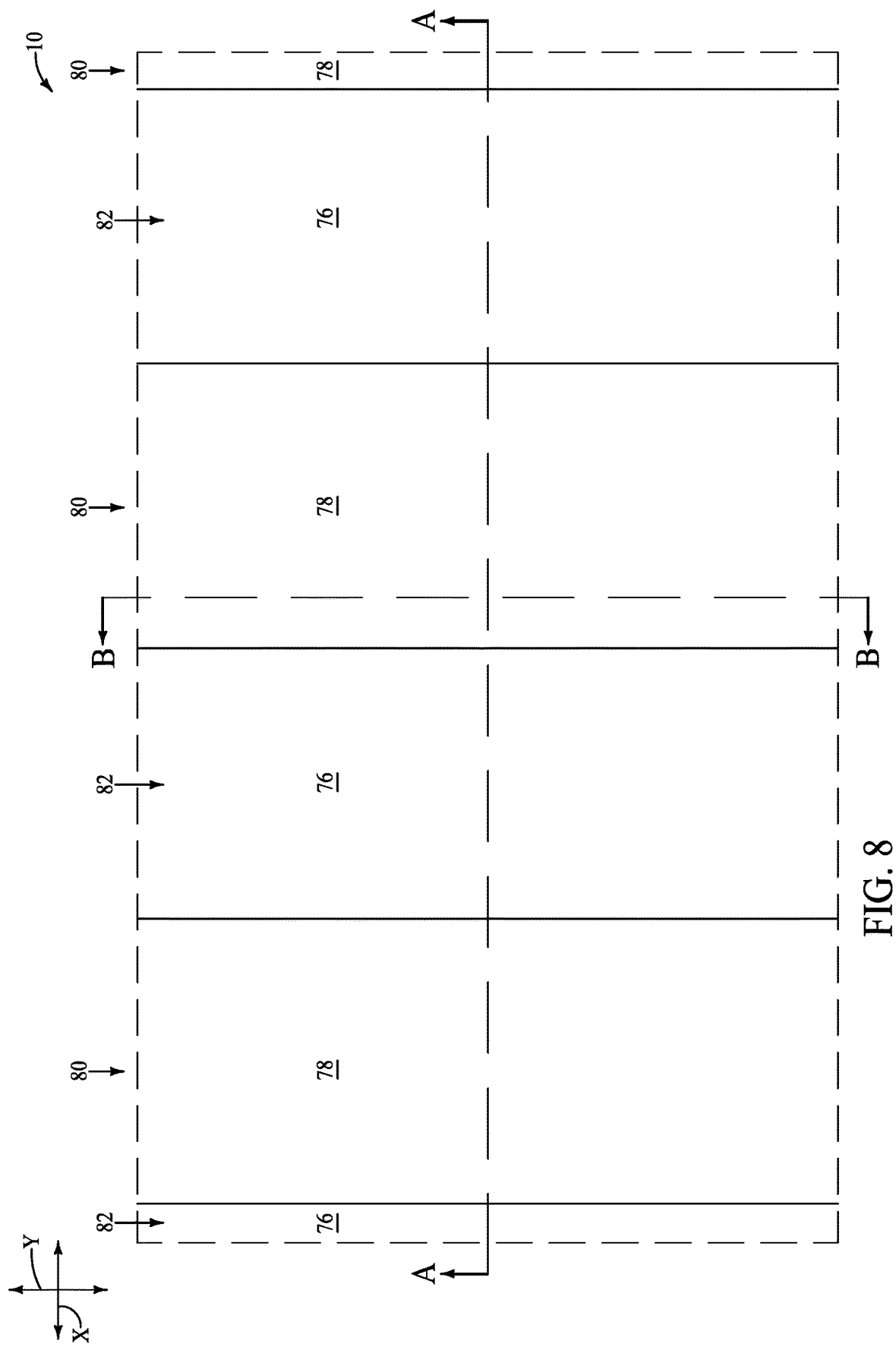
FIGS. 8-8B are a diagrammatic top-down view (FIG. 8) and diagrammatic cross-sectional side views (FIGS. 8A and 8B) of the example regions of the example integrated assembly at an example process stage following the process stage of FIGS. 7-7B. The views of FIGS. 8A and 8B are along the lines A-A and B-B, respectively, of FIG. 8.
Figure 8A:
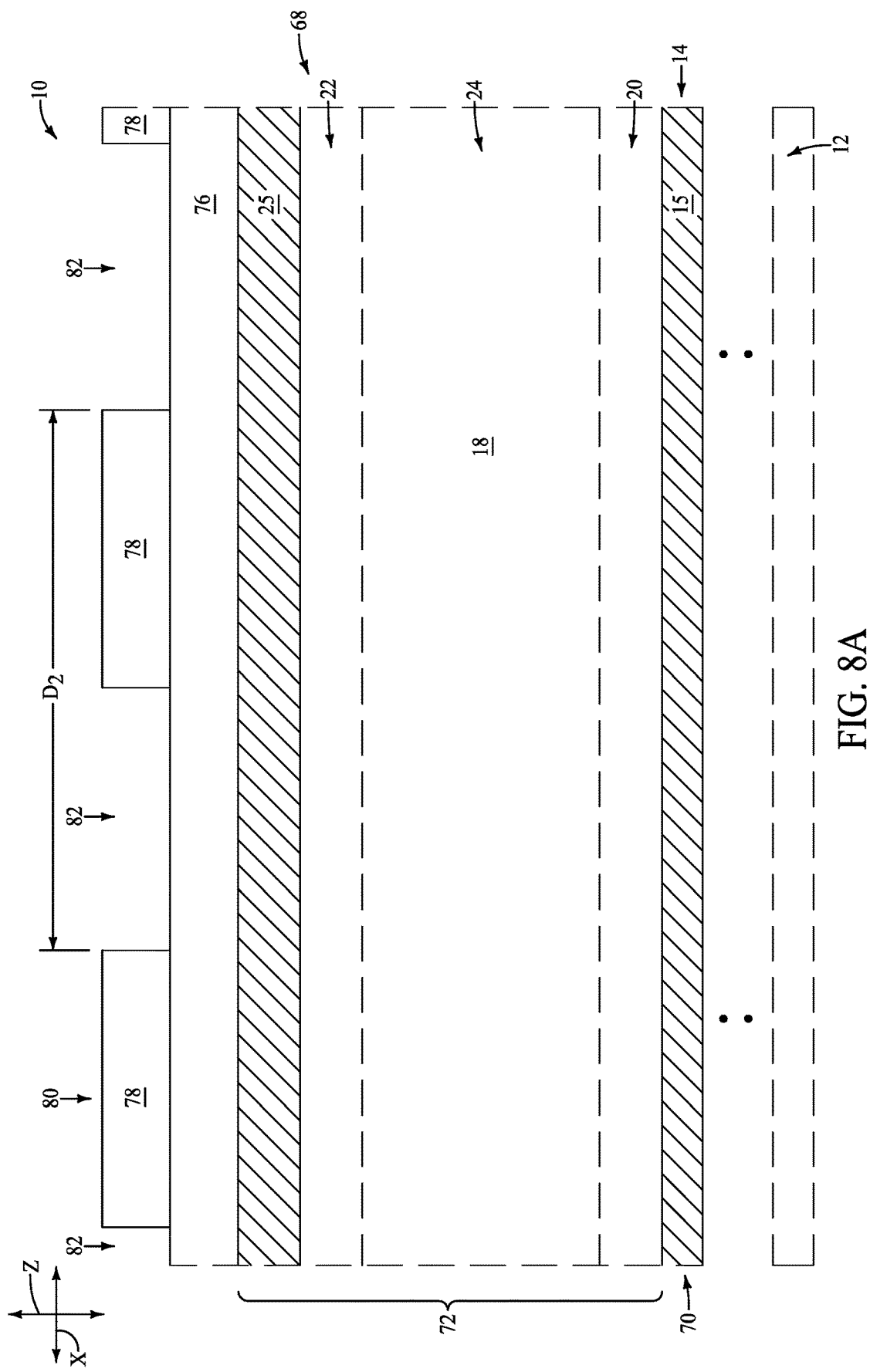
Figure 8B:
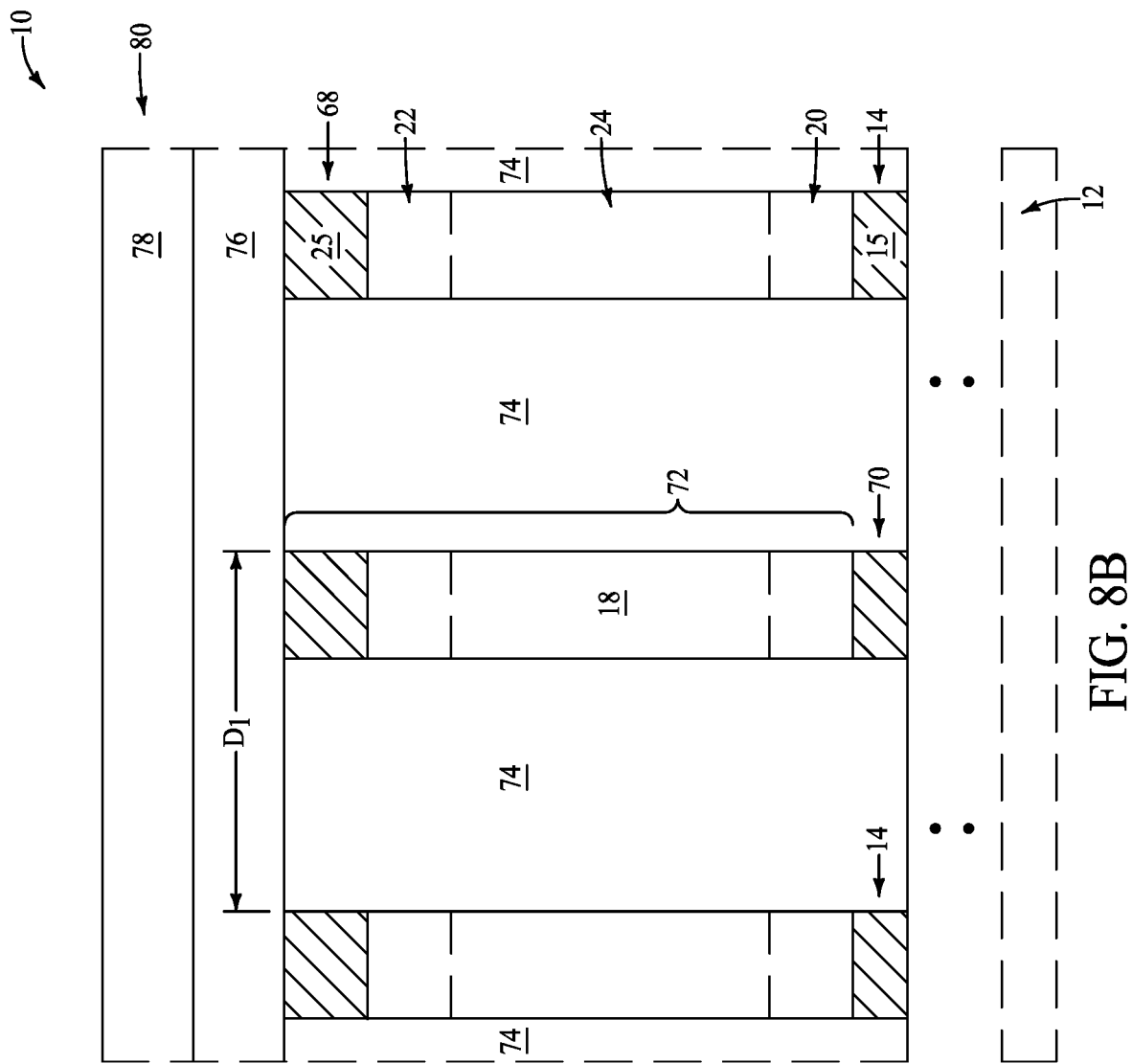

Referring to FIGS. 8-8B, the masking material 78 is patterned into linear blocks 80 which extend along a second direction (the illustrated y-axis direction). The linear blocks 80 may be referred to as second linear blocks to distinguish them from the first linear blocks 64 of FIGS. 4-4B. Although the second linear blocks 80 are shown extending along a second direction which is orthogonal to (or at least substantially orthogonal to) the first direction of the first linear blocks 64, in other embodiments the second direction of the second linear blocks 80 may intersect the first direction of the first linear blocks 74 without being orthogonal to such first direction. The term "substantially orthogonal" means orthogonal to within reasonable tolerances of fabrication and measurement.

Openings 82 extend through the masking material 78 to the upper surface of the protective material 76.

In the illustrated embodiment, the linear structures 68 are along a first pitch corresponding to a distance $D_1$, and the second linear blocks 78 are along a second pitch corresponding to a distance $D_2$. The distance $D_1$ is the same as the pitch $P_1$ of FIG. 5.

In some embodiments, the distance $D_2$ may be about twice as large as the distance $D_1$. For instance, the distance $D_1$ may be about 25 nm and the distance $D_2$ may be about 50 nm. In some embodiments, the distance $D_1$ may be less than or equal to about 30 nm, less than or equal to about 25 nm, less than or equal to about 20 nm, within a range of from about 15 nm to about 50 nm, etc.; and the distance $D_2$ may be less than or equal to about 60 nm, less than or equal to about 50 nm, less than or equal to about 40 nm, within a range of from about 30 nm to about 100 nm, etc.

Figure 9:
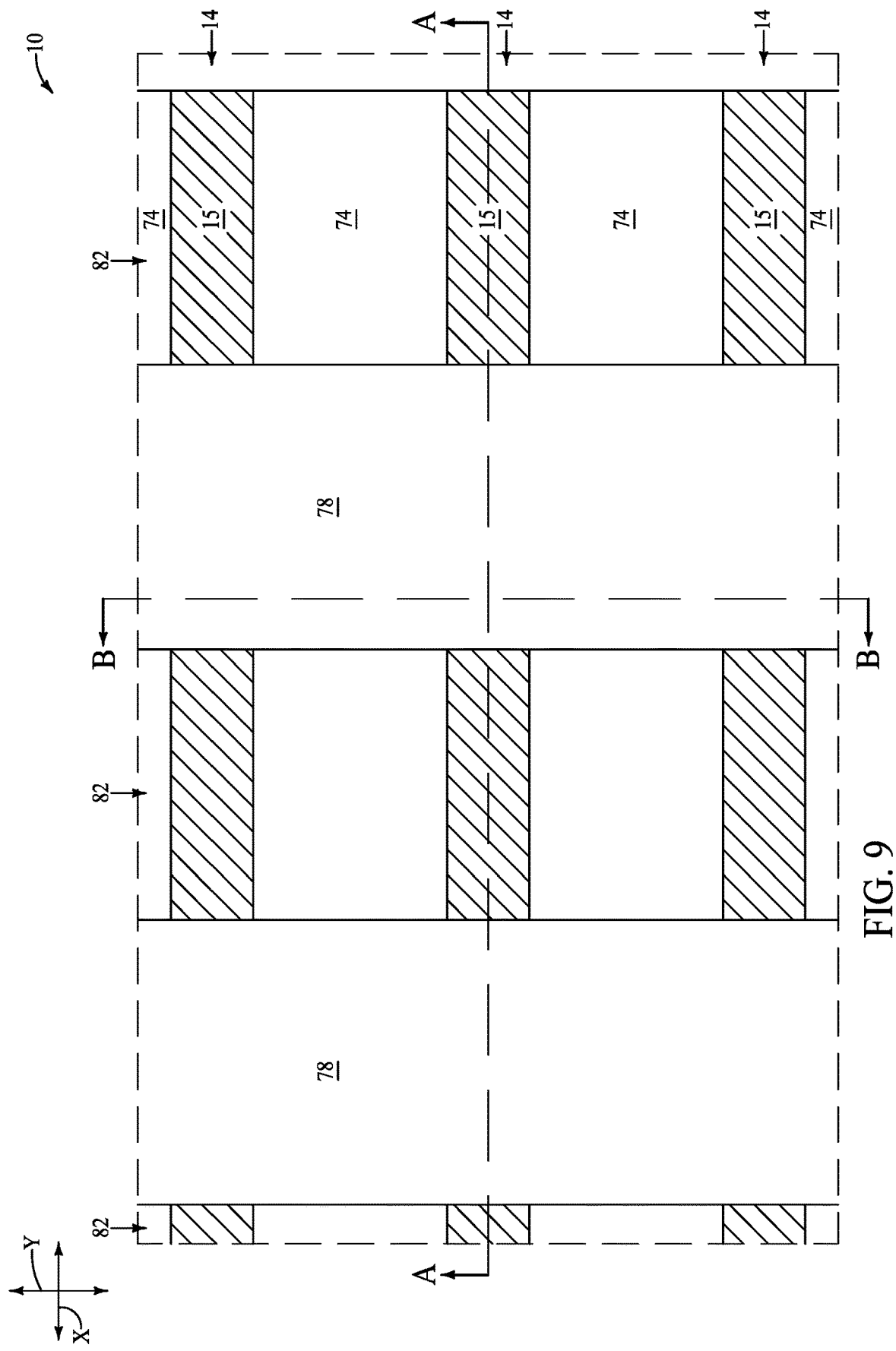
FIGS. 9-9B are a diagrammatic top-down view (FIG. 9) and diagrammatic cross-sectional side views (FIGS. 9A and 9B) of the example regions of the example integrated assembly at an example process stage following the process stage of FIGS. 8-8B. The views of FIGS. 9A and 9B are along the lines A-A and B-B, respectively, of FIG. 9.
Figure 9A:
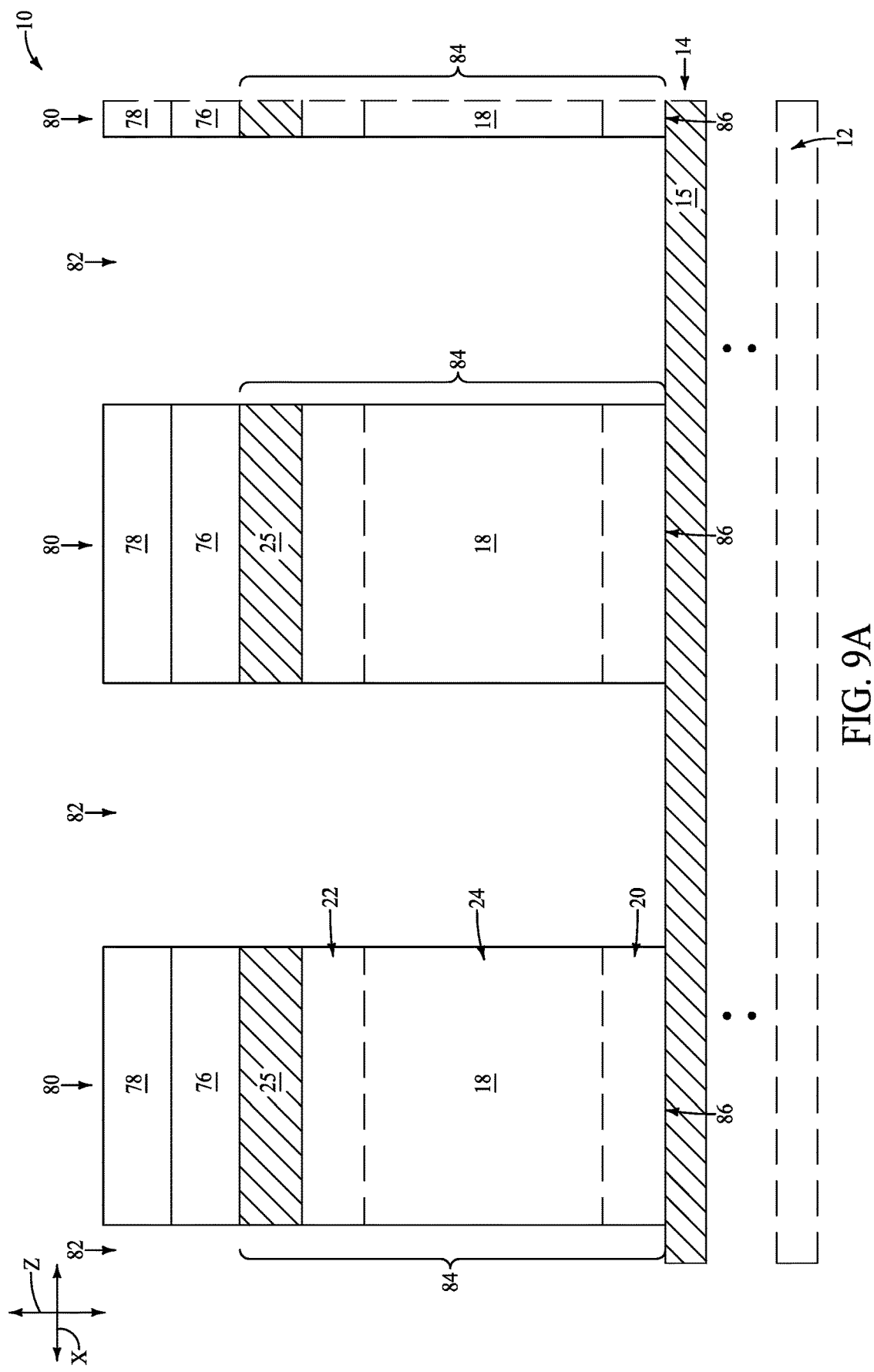
Figure 9B:
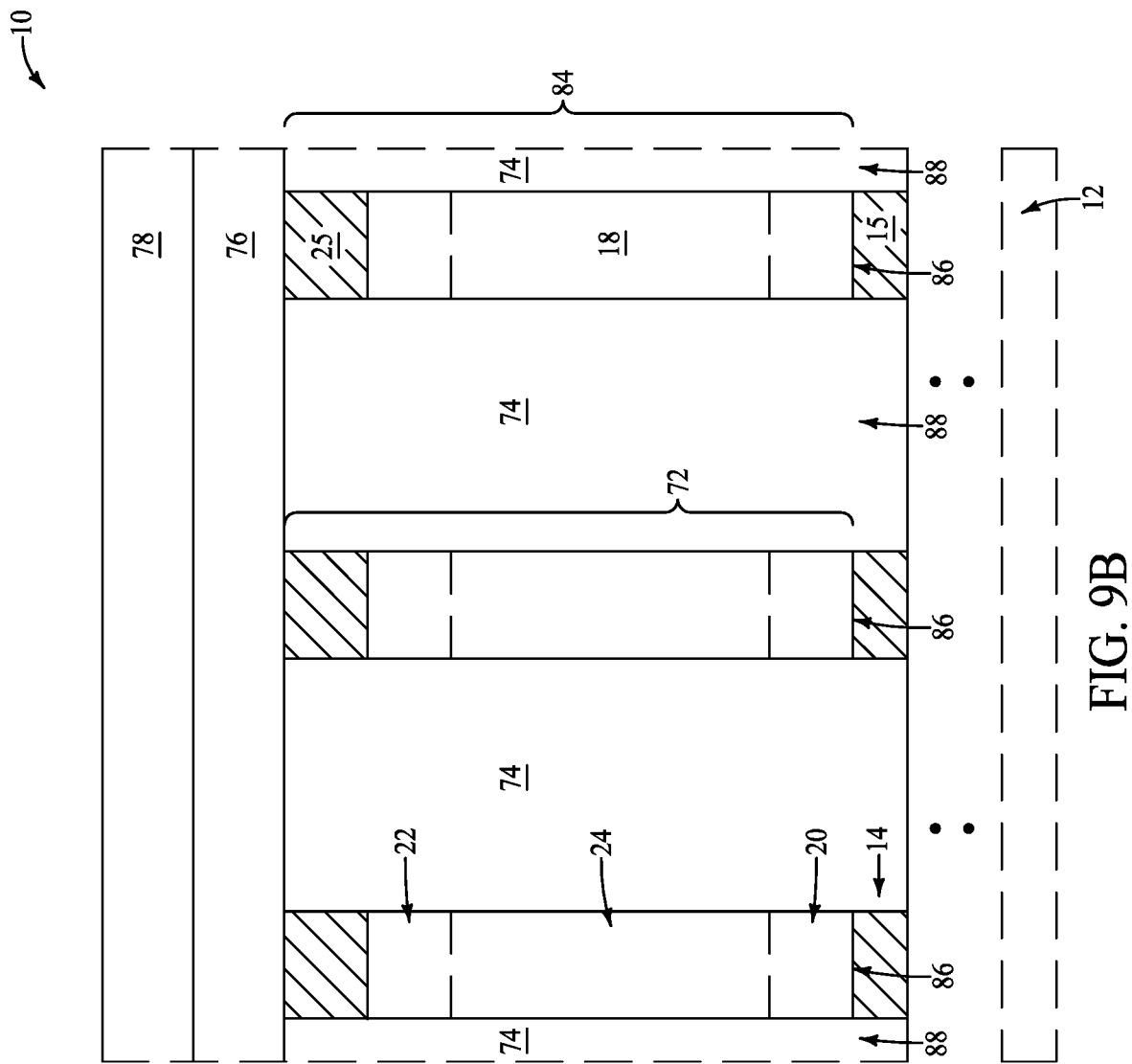

Referring to FIGS. 9-9B, one or more suitable etches are utilized to transfer the openings 82 into the insulative material 74, and through the upper regions 72 of the linear structures 68 (FIGS. 8A and 8B). Such forms second linear structures 84 from the materials 18, 25 and 74. The second linear structures 84 extend along the second direction (the y-axis direction). Regions of the second linear structures 84 are over the conductive lines 14, as shown in FIG. 9A.

Each of the second linear structures 84 includes first and second column structures (vertically-projecting structures) 86 and 88 which alternate with one another along the second direction (the y-axis direction), as shown in FIG. 9B (and as is also shown in a top-down view of FIG. 16, described below). The first column structures 86 comprise the upper portions 72 of the linear structures 68 (with an example linear structure 68 being shown in FIG. 8A), and the second column structures 88 comprise the insulative material 74. The etching of the materials 18 and 25 patterns the linear structures 68 into the first column structures 86, as can be understood by comparing FIG. 9A (the processing stage after the etching of the materials 18 and 25) with FIG. 8A (the processing stage prior to the etching of the materials 18 and 25).

Figure 10:
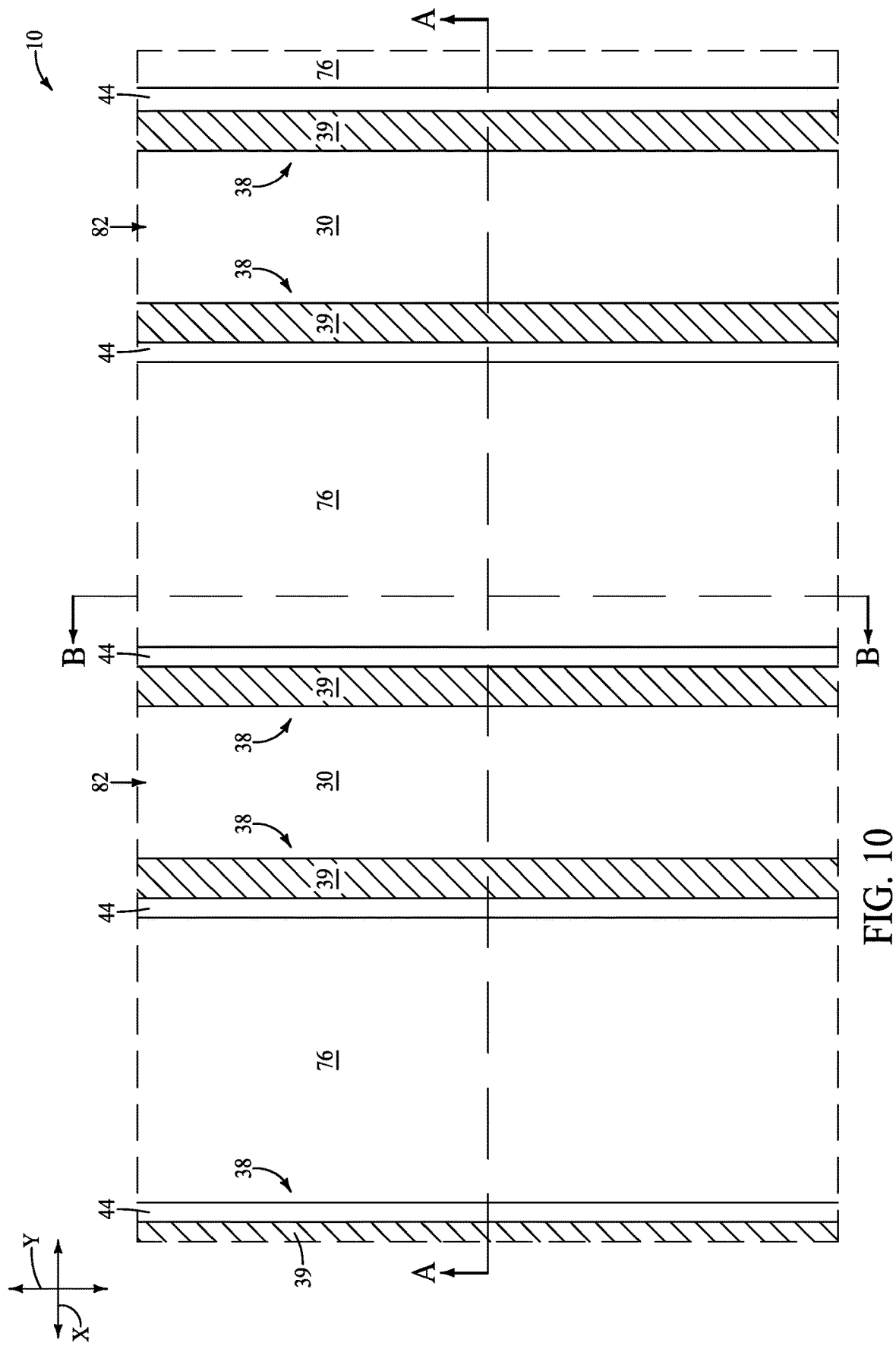
FIGS. 10-10B are a diagrammatic top-down view (FIG. 10) and diagrammatic cross-sectional side views (FIGS. 10A and 10B) of the example regions of the example integrated assembly at an example process stage following the process stage of FIGS. 9-9B. The views of FIGS. 10A and 10B are along the lines A-A and B-B, respectively, of FIG. 10.
Figure 10A:
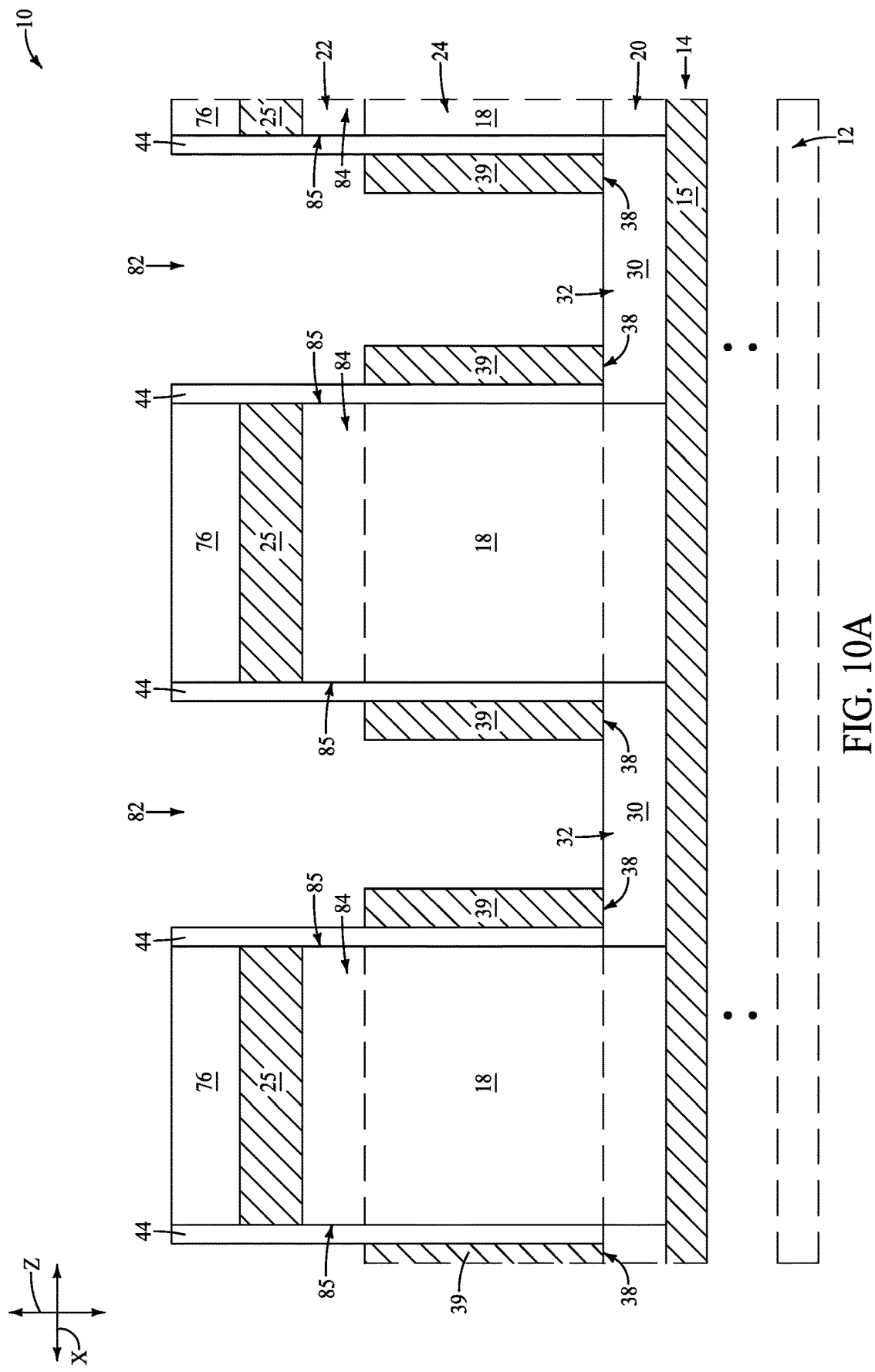
Figure 10B:
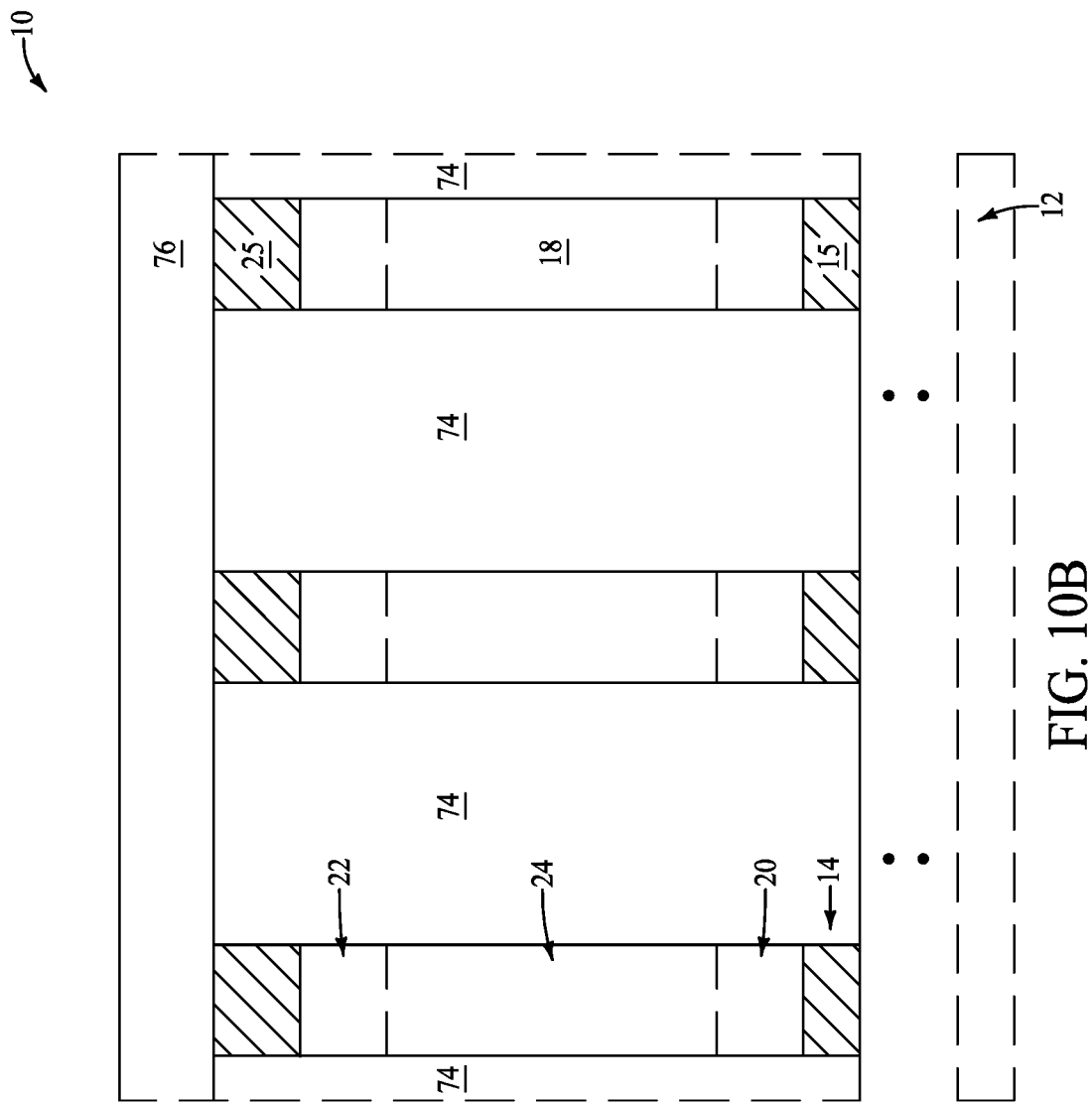

Referring to FIGS. 10-10B, the masking material 78 (FIGS. 9-9B) is removed.

The insulative steps 32 are formed within the openings 82, and between the linear structures 84. The insulative steps 32 may have a vertical thickness within a range of from about 5 nm to about 40 nm.

The insulative material 44 is formed along sidewall surfaces 85 of the linear structures 84, and in the shown embodiment is formed over the steps 32. In other embodiments, the insulative material 44 may be formed prior to the steps 32, and accordingly may extend along sides of the steps 32.

The conductive material 39 is formed over the steps 32 and is patterned into the first conductive gate components 38.

Figure 11:
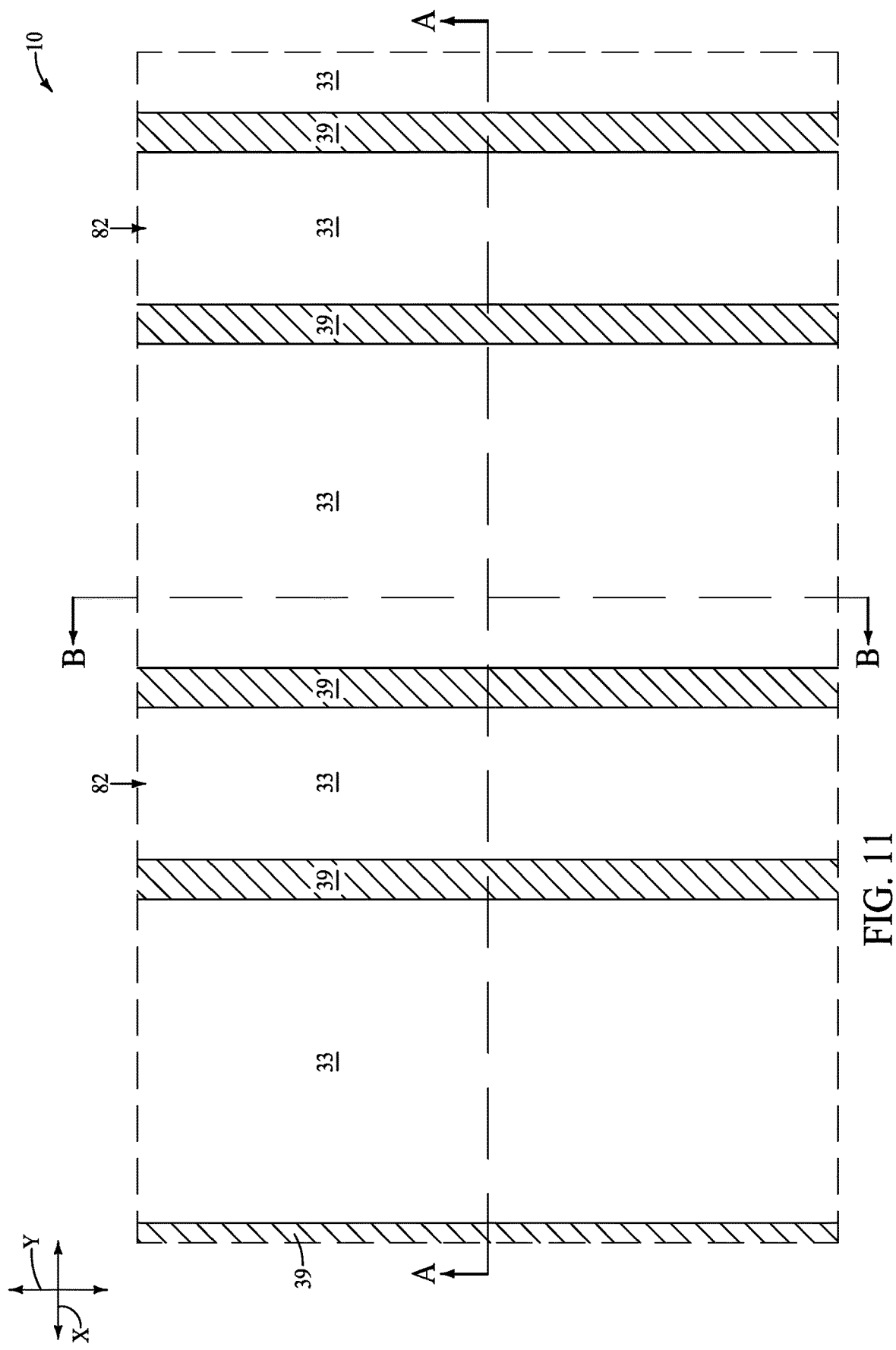
FIGS. 11-11B are a diagrammatic top-down view (FIG. 11) and diagrammatic cross-sectional side views (FIGS. 11A and 11B) of the example regions of the example integrated assembly at an example process stage following the process stage of FIGS. 10-10B. The views of FIGS. 11A and 11B are along the lines A-A and B-B, respectively, of FIG. 11.
Figure 11A:
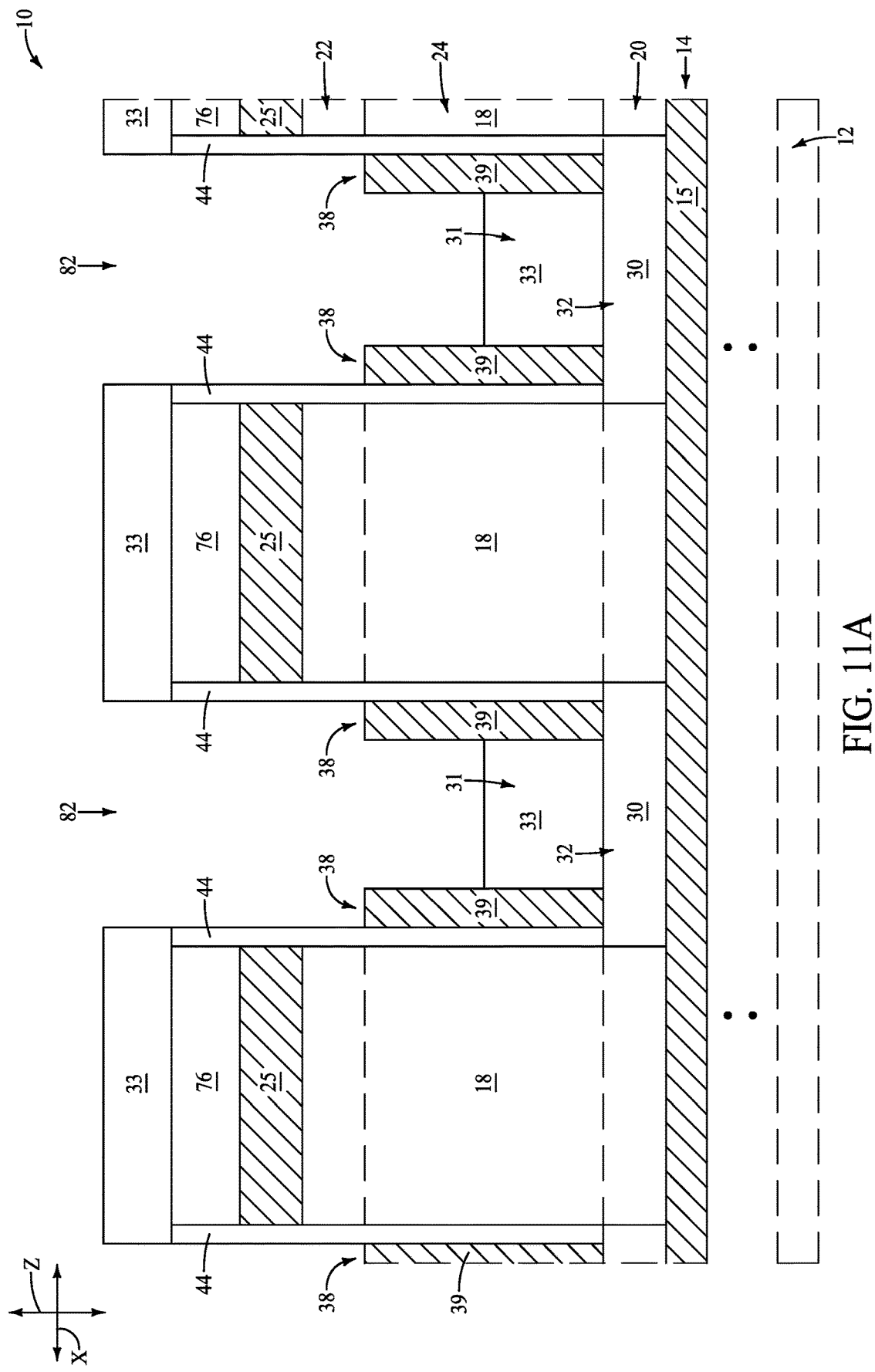
Figure 11B:
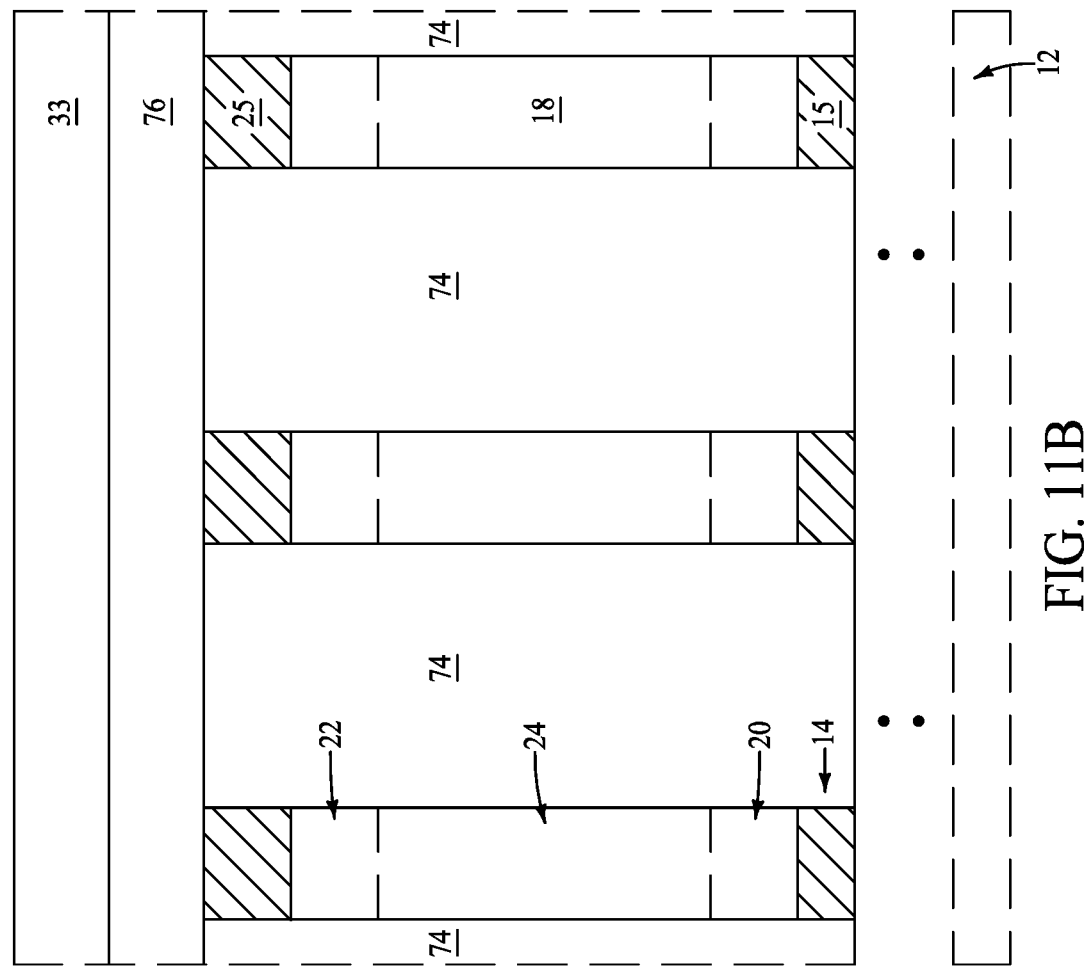

Referring to FIGS. 11-11B, the material 33 is formed over the steps 32. The material 33 may comprise silicon dioxide, and may be formed by physical vapor deposition (PVD) so that the material 33 is along horizontally-extending surfaces, and is not along the vertically-extending surfaces of the assembly 10. The material 33 forms the steps 31 between the conductive gate components 38. In some embodiments, the steps 31 may be referred to as second insulative steps to distinguish them from the first insulative steps 32. The first and second insulative steps 31 and 32 may comprise the same composition as one another, or may comprise different compositions relative to one another.

Figure 12:
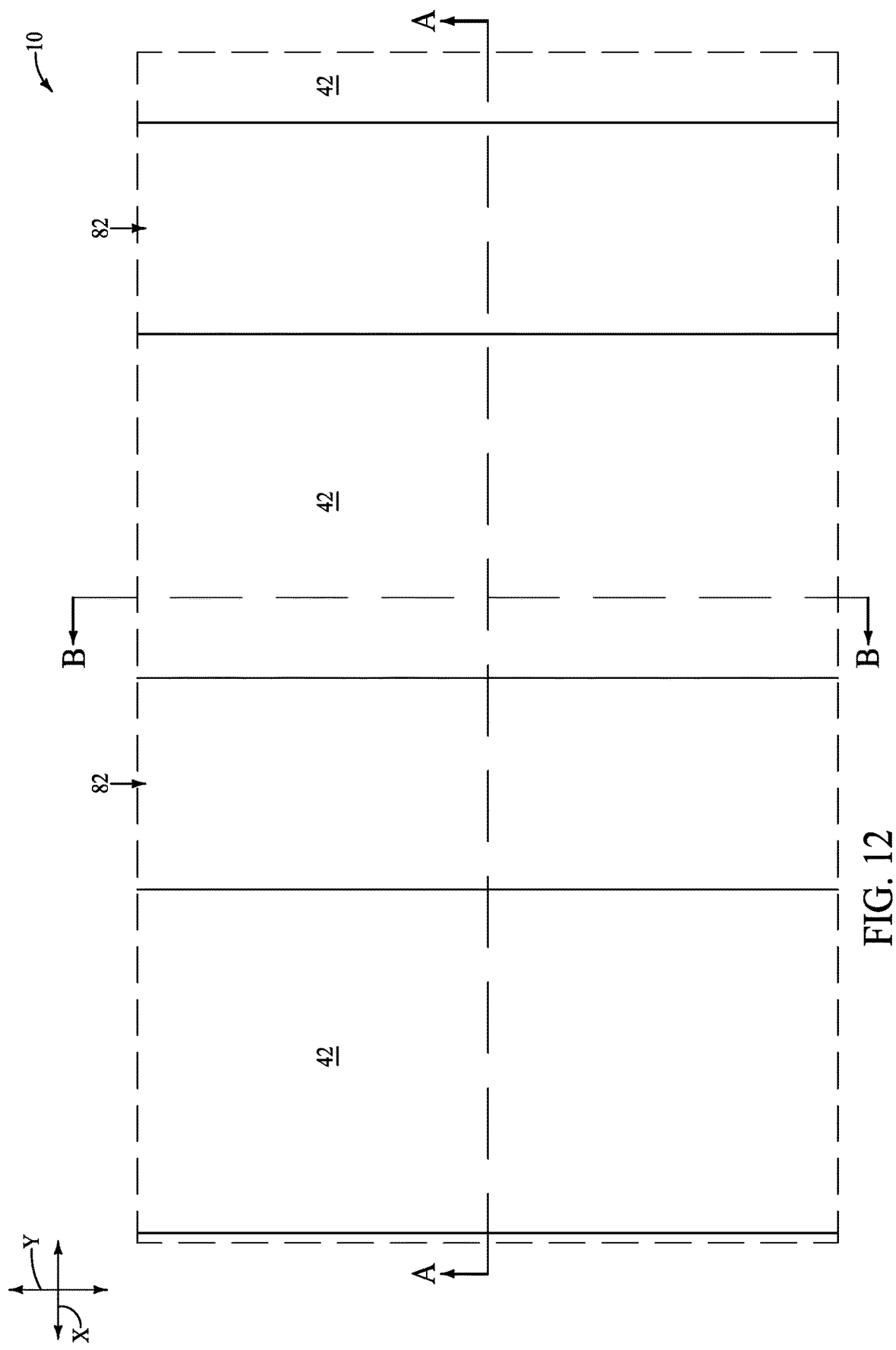
FIGS. 12-12B are a diagrammatic top-down view (FIG. 12) and diagrammatic cross-sectional side views (FIGS. 12A and 12B) of the example regions of the example integrated assembly at an example process stage following the process stage of FIGS. 11-11B. The views of FIGS. 12A and 12B are along the lines A-A and B-B, respectively, of FIG. 12.
Figure 12A:
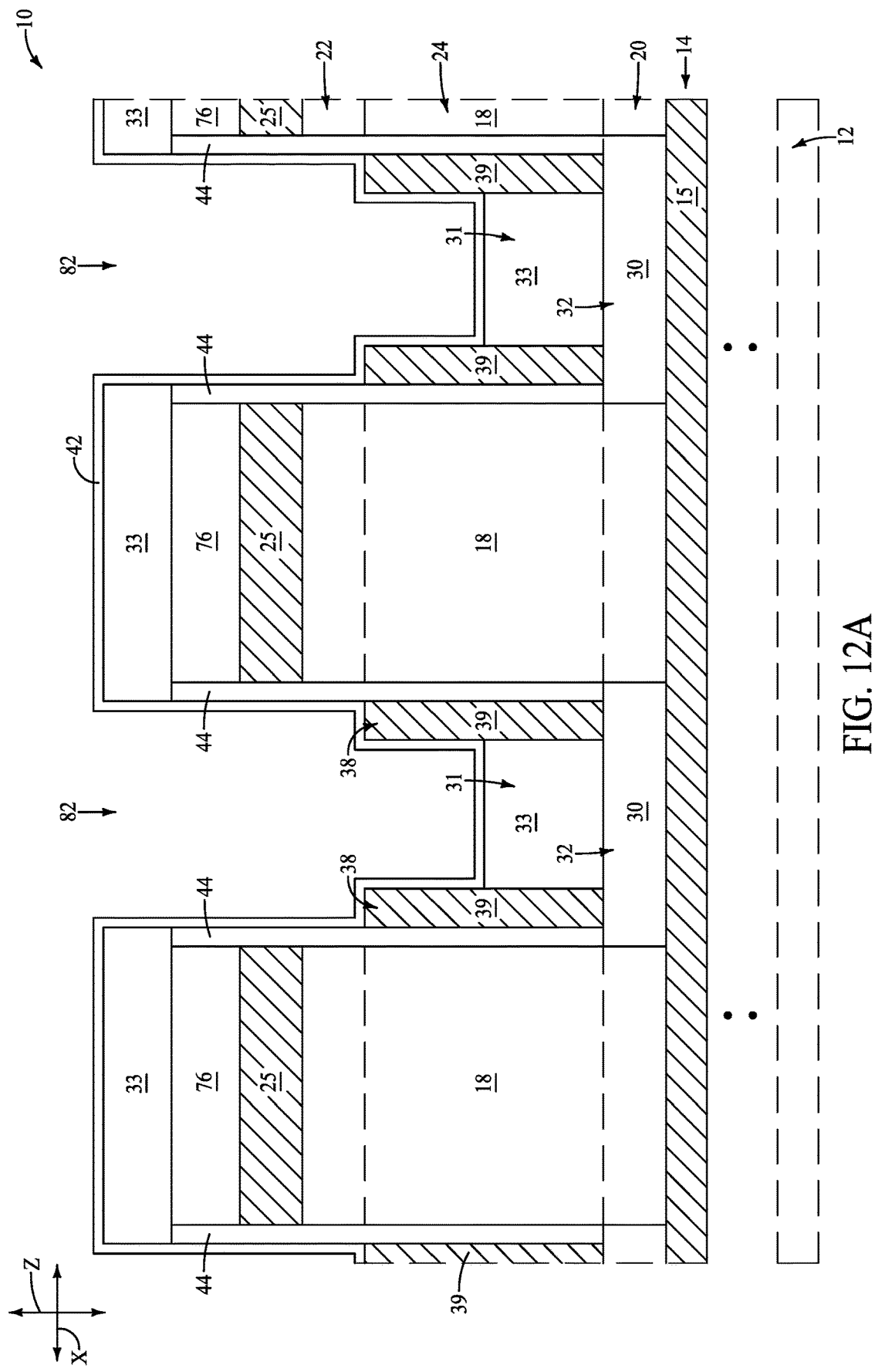
Figure 12B:
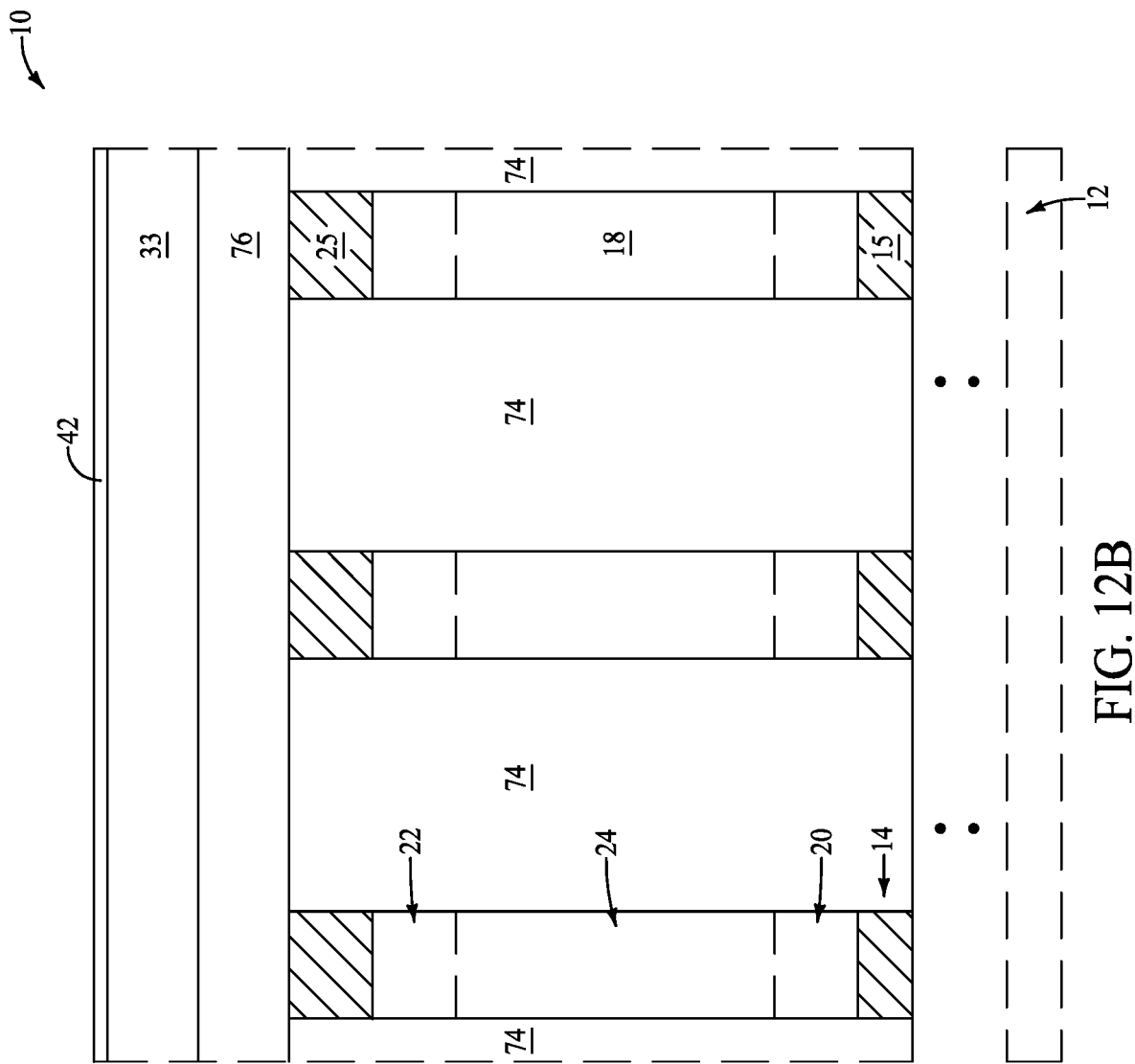

Referring to FIGS. 12-12B, the ferroelectric material 42 is formed across the integrated assembly 10. The ferroelectric material 42 extends across upper surfaces of the material 33, and along the sidewalls and upper surfaces of the conductive gate components 38.

Figure 13:
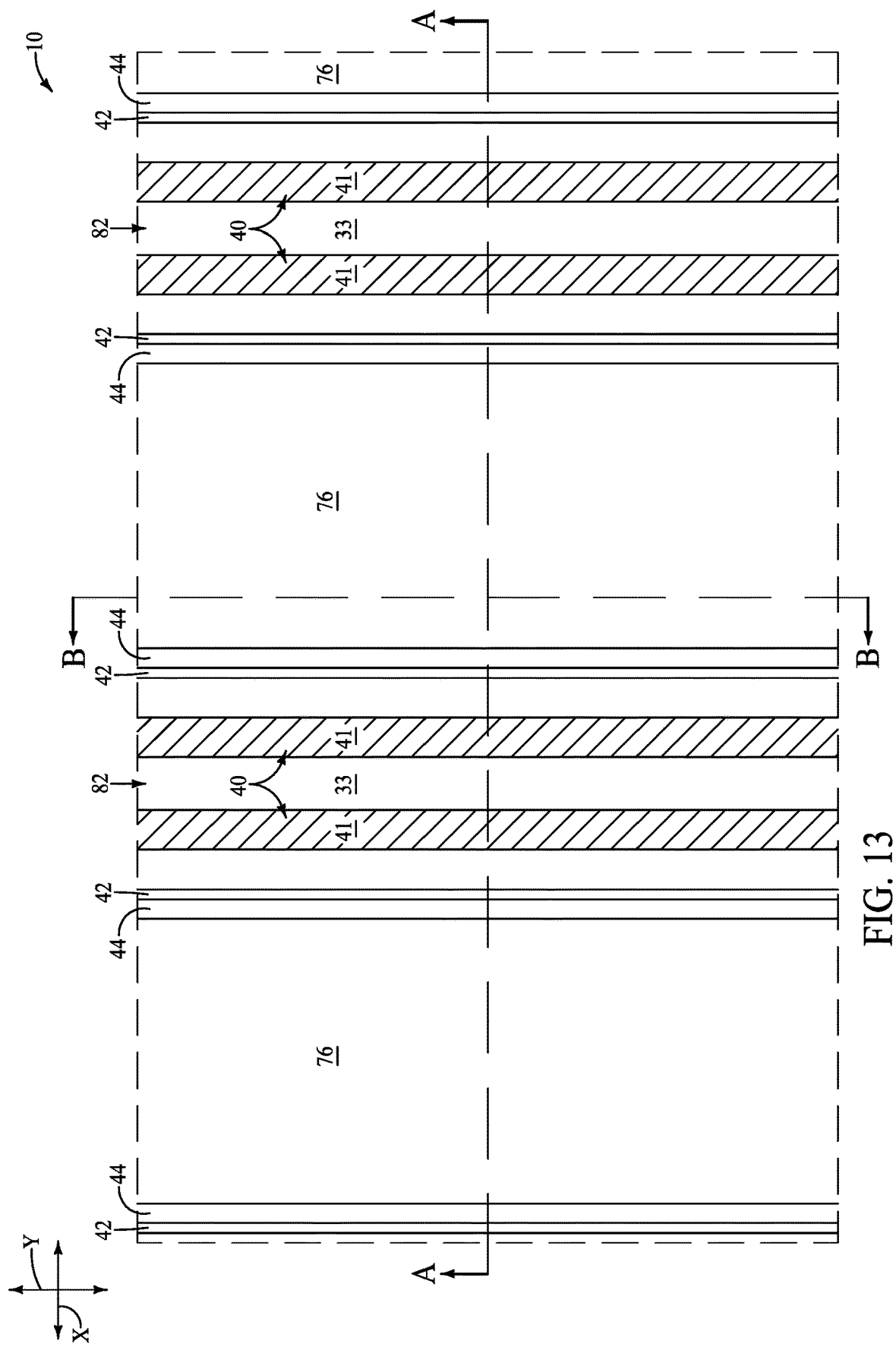
FIGS. 13-13B are a diagrammatic top-down view (FIG. 13) and diagrammatic cross-sectional side views (FIGS. 13A and 13B) of the example regions of the example integrated assembly at an example process stage following the process stage of FIGS. 12-12B. The views of FIGS. 13A and 13B are along the lines A-A and B-B, respectively, of FIG. 13.
Figure 13A:
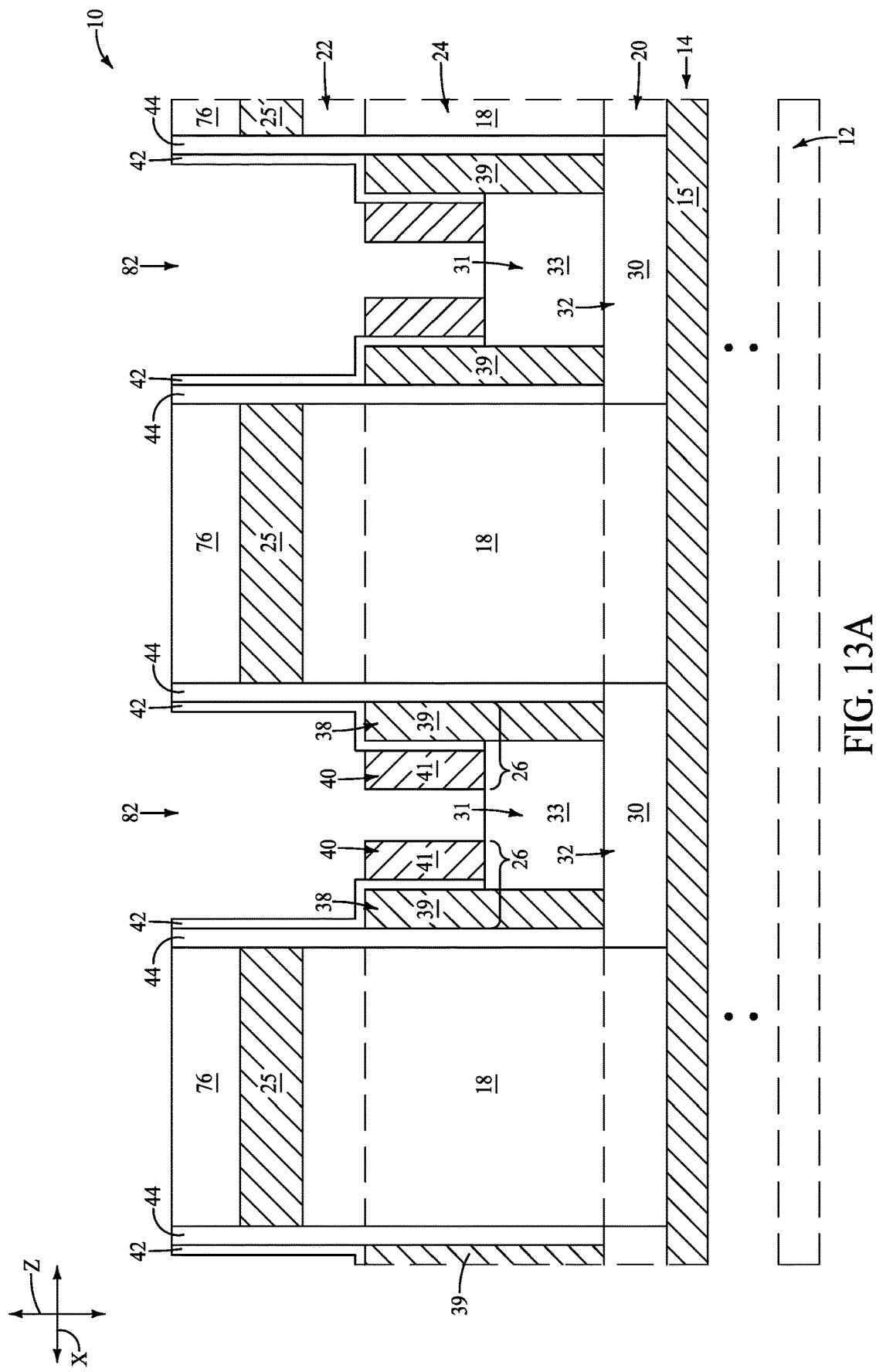
Figure 13B:
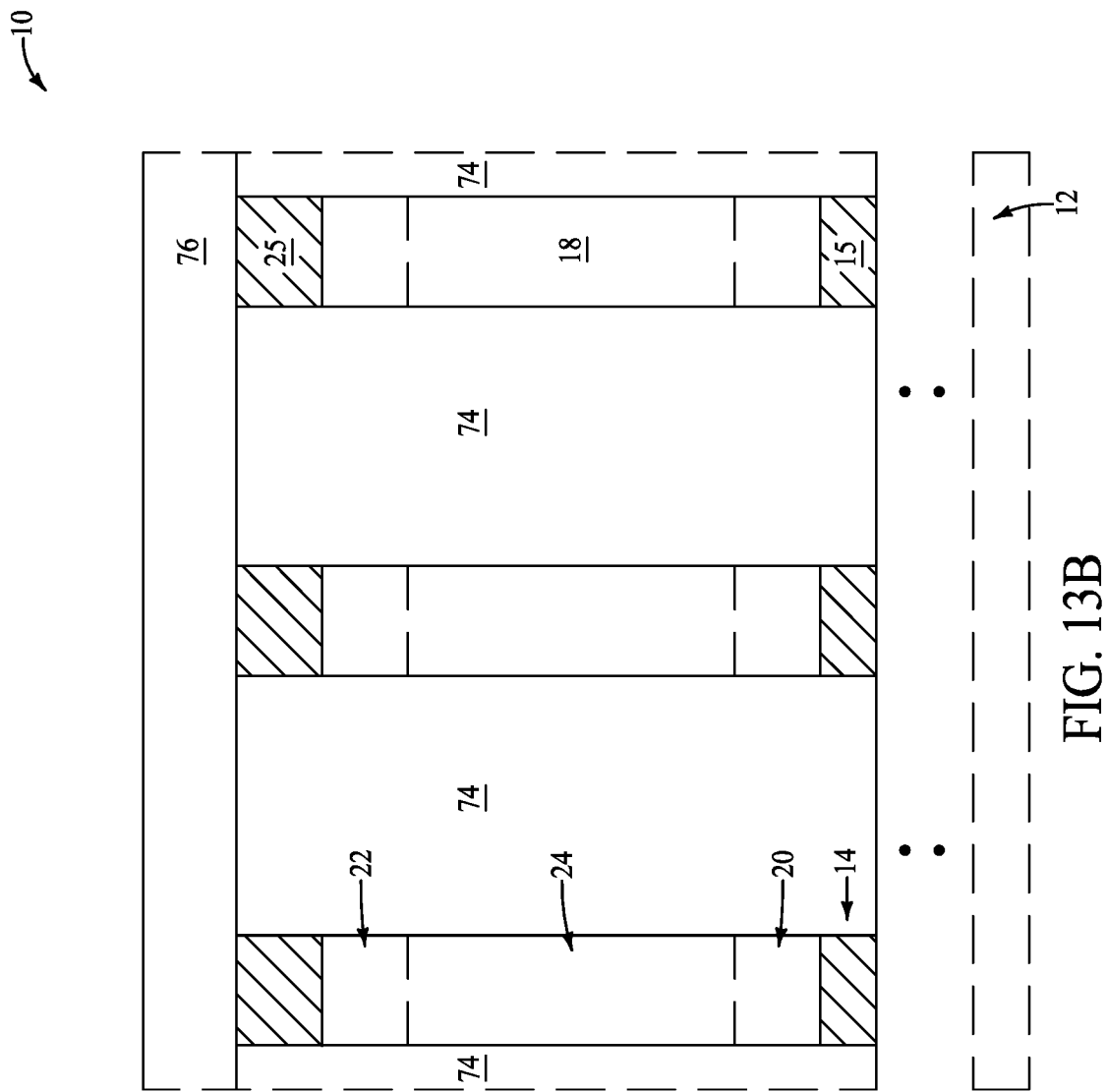

Referring to FIGS. 13-13B, portions of the materials 42 and 33 are removed with suitable etching and/or planarization. Such removes the materials 42 and 33 from over the protective material 76, and removes the material 42 from over upper surfaces of the steps 31, while leaving the material 42 along the sidewalls of the conductive gate components 38, and the shown embodiment leaving the material 42 along sides of the insulative material 44. In other embodiments, the material 42 may be removed from along the insulative material 44 while being left along sidewalls (side surfaces) of the conductive gate components 38.

The conductive material 41 is formed within the openings 82, and is patterned into the second conductive gate components 40. The conductive gate components 40 are formed adjacent the ferroelectric material 42, and are supported by the insulative steps 31.

In some embodiments, the openings 82 may be considered to be configured as linearly-extending trenches, and the conductive gate components 38 and 40 may be considered to be linear conductive components which extend along sidewalls of the trenches 82. The linear conductive components 38 and 40 together form the gating structures 26. In some embodiments, the conductive lines 14 may correspond to digit lines which extend along a first direction (the x-axis direction), and the conductive lines 38 and 40 may be incorporated into wordlines which extend along the second direction (the y-axis direction). The wordlines may be considered to comprise the gating structures 26 which are shown along the cross-section of FIG. 13A.

Figure 14:
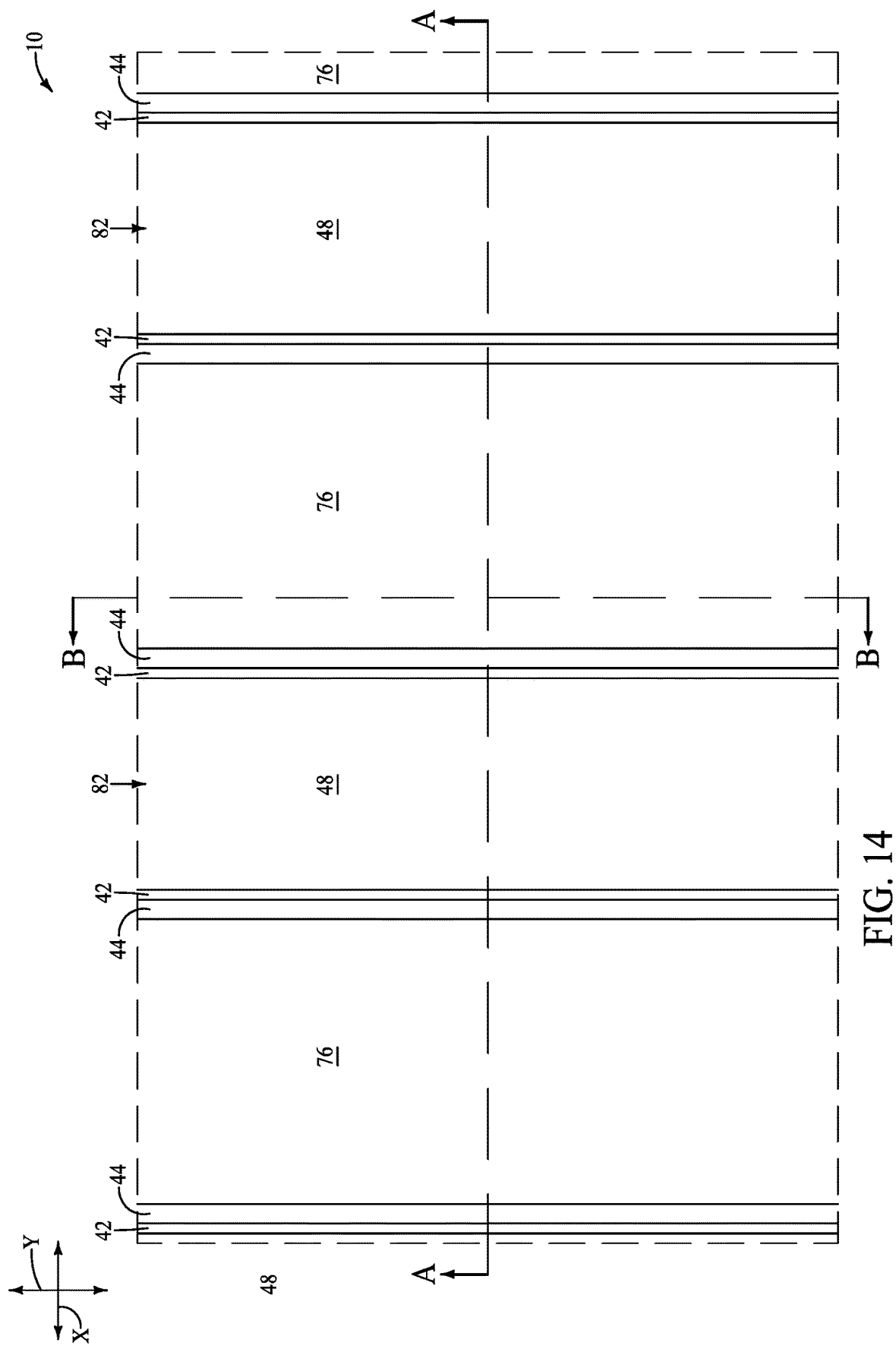
FIGS. 14-14B are a diagrammatic top-down view (FIG. 14) and diagrammatic cross-sectional side views (FIGS. 14A and 14B) of the example regions of the example integrated assembly at an example process stage following the process stage of FIGS. 13-13B. The views of FIGS. 14A and 14B are along the lines A-A and B-B, respectively, of FIG. 14.
Figure 14A:
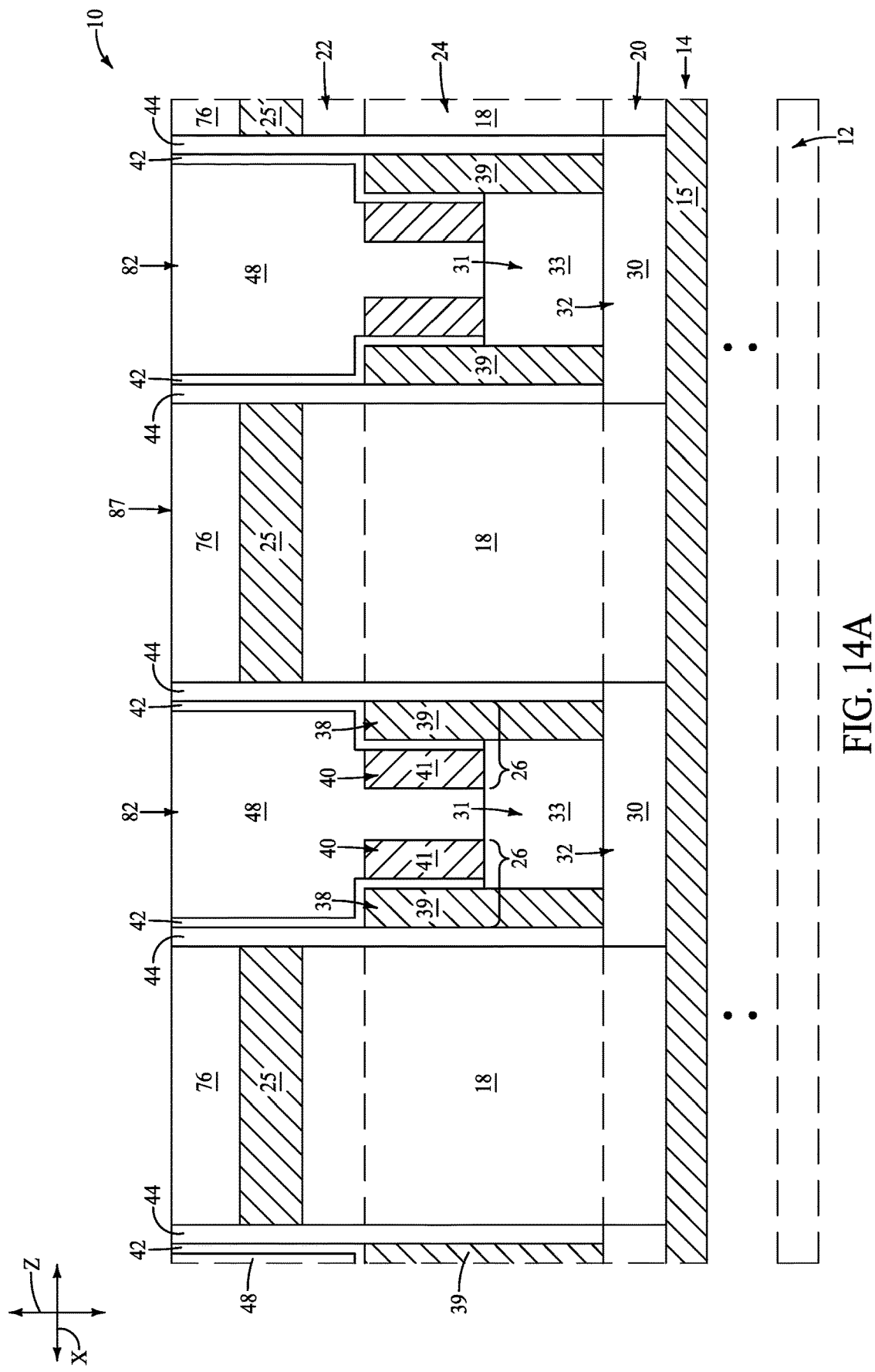
Figure 14B:
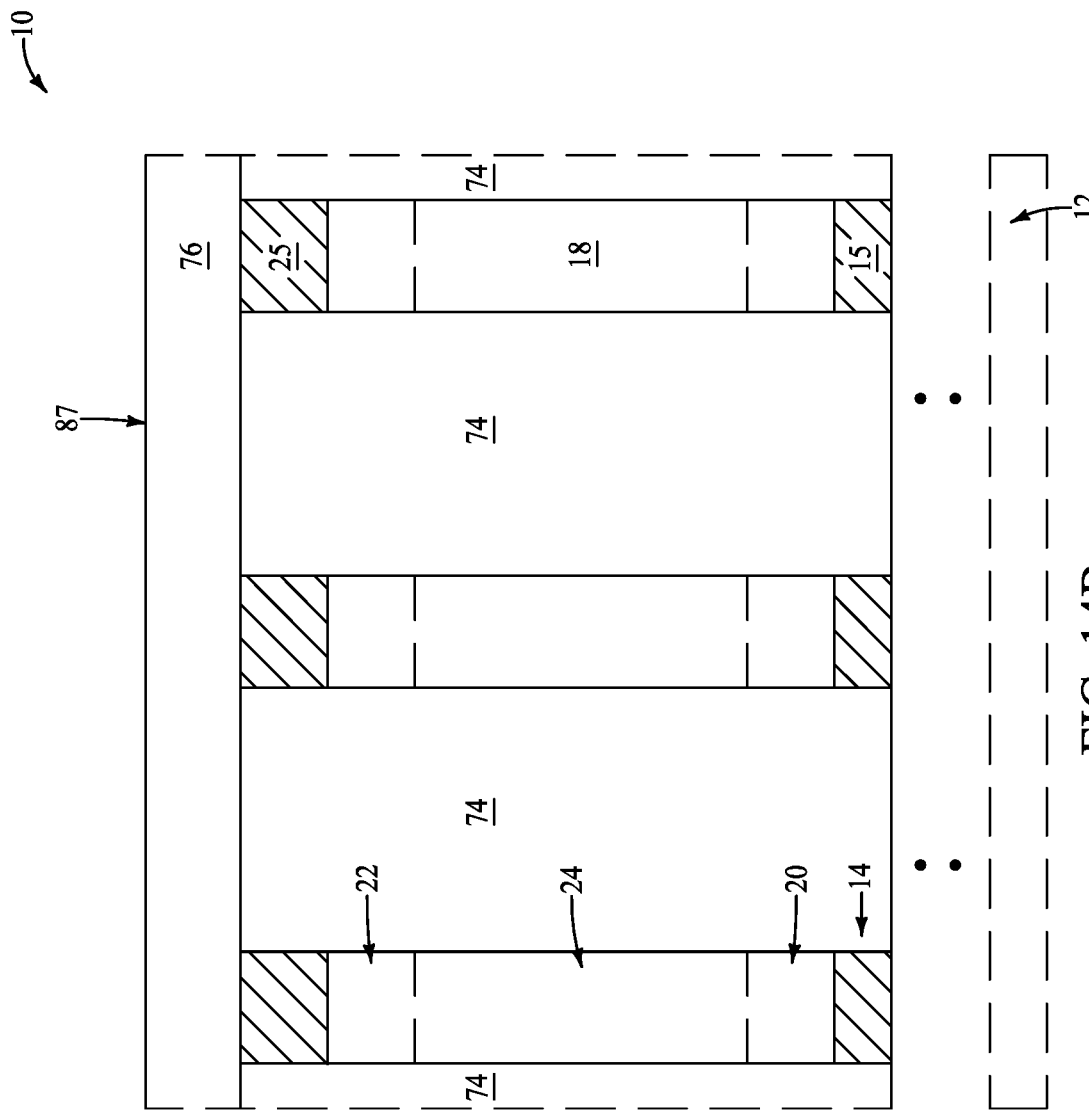

Referring to FIGS. 14-14B, the insulative material 48 is formed within the openings 82, and a planarized surface 87 is formed to extend across the materials 76, 42, 44 and 48. The planarized surface 87 may be formed with any suitable processing, including, for example, CMP.

Figure 15:
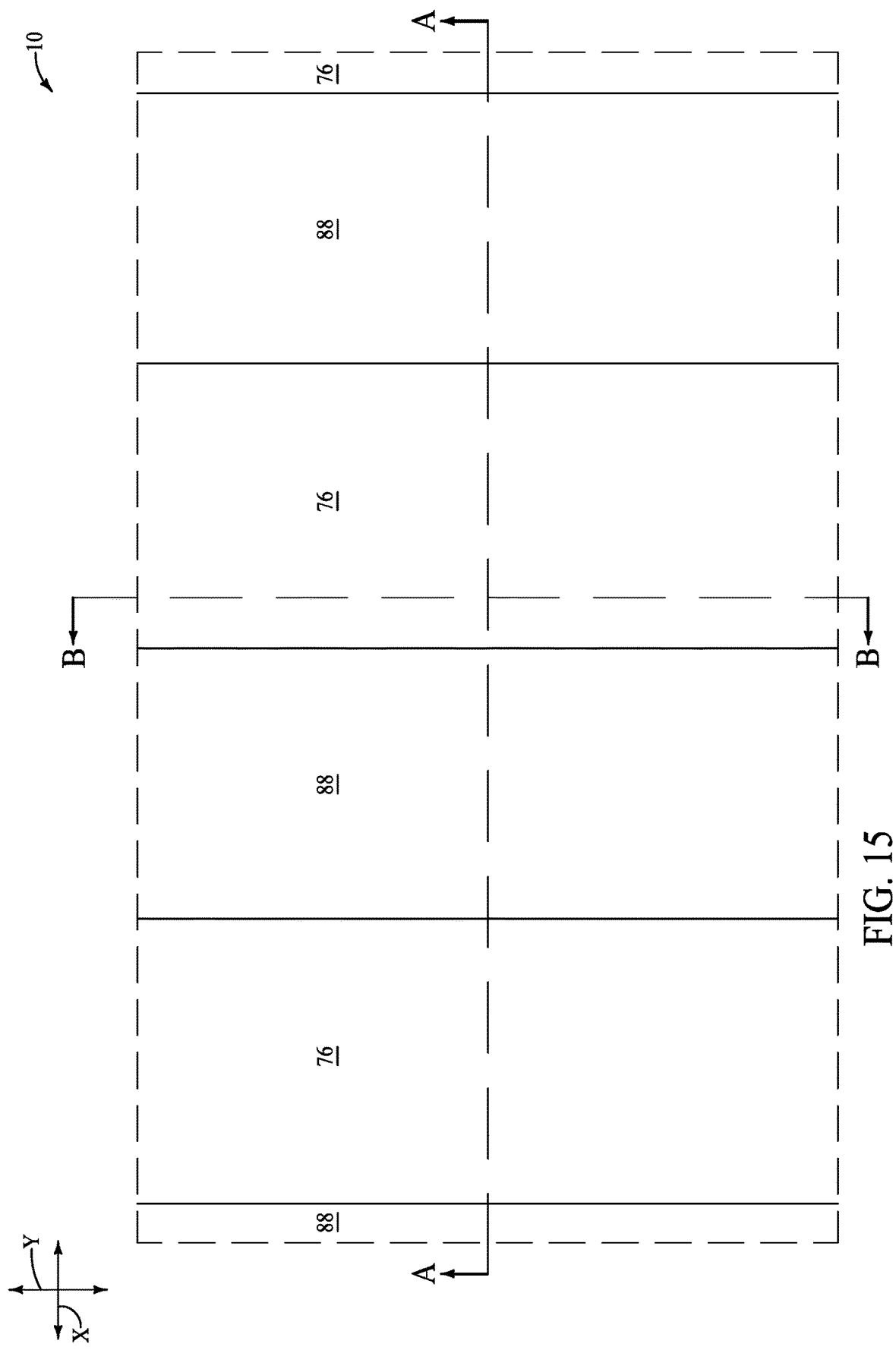
FIGS. 15-15B are a diagrammatic top-down view (FIG. 15) and diagrammatic cross-sectional side views (FIGS. 15A and 15B) of the example regions of the example integrated assembly at an example process stage following the process stage of FIGS. 14-14B. The views of FIGS. 15A and 15B are along the lines A-A and B-B, respectively, of FIG. 15.
Figure 15A:
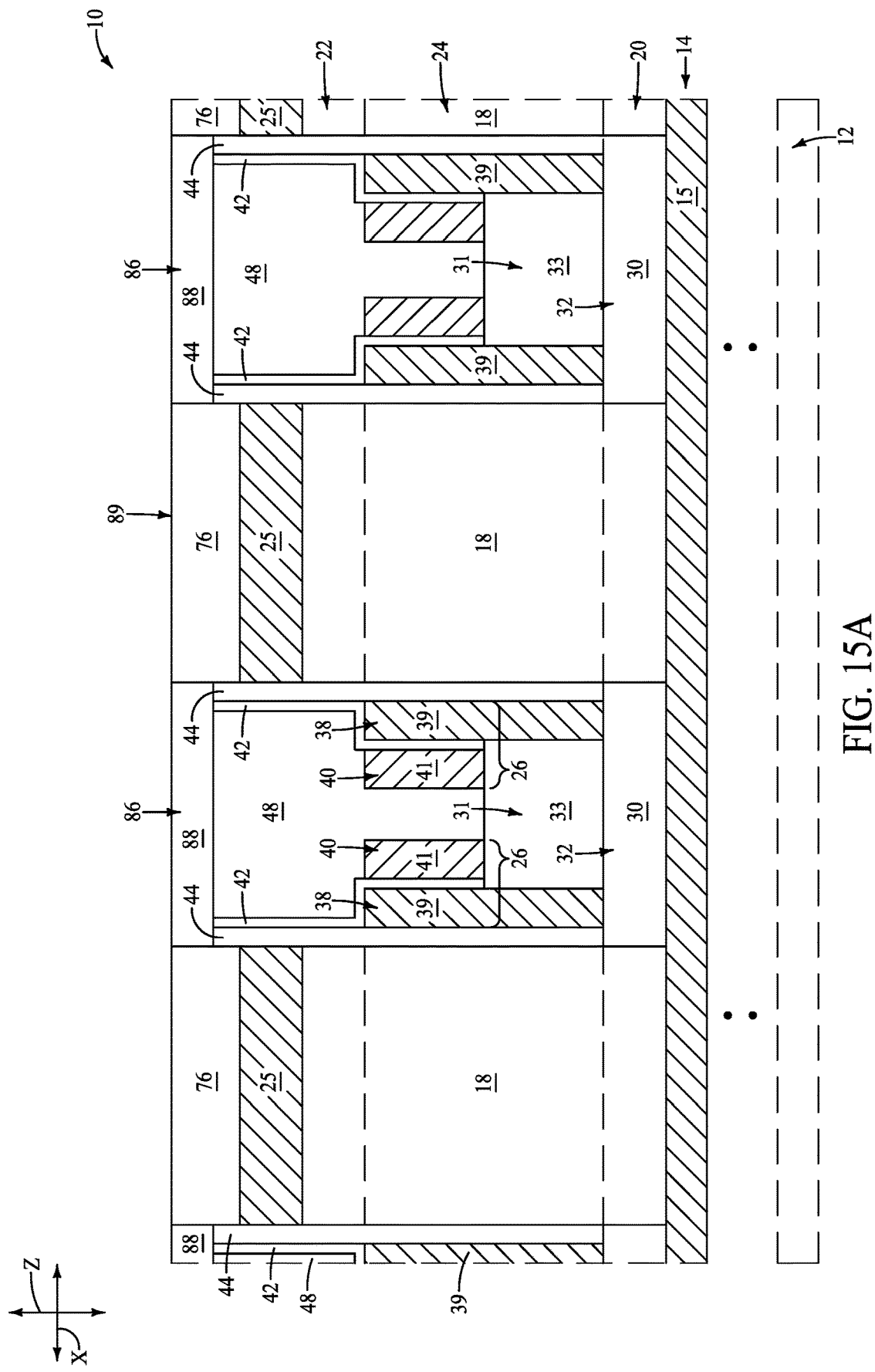
Figure 15B:
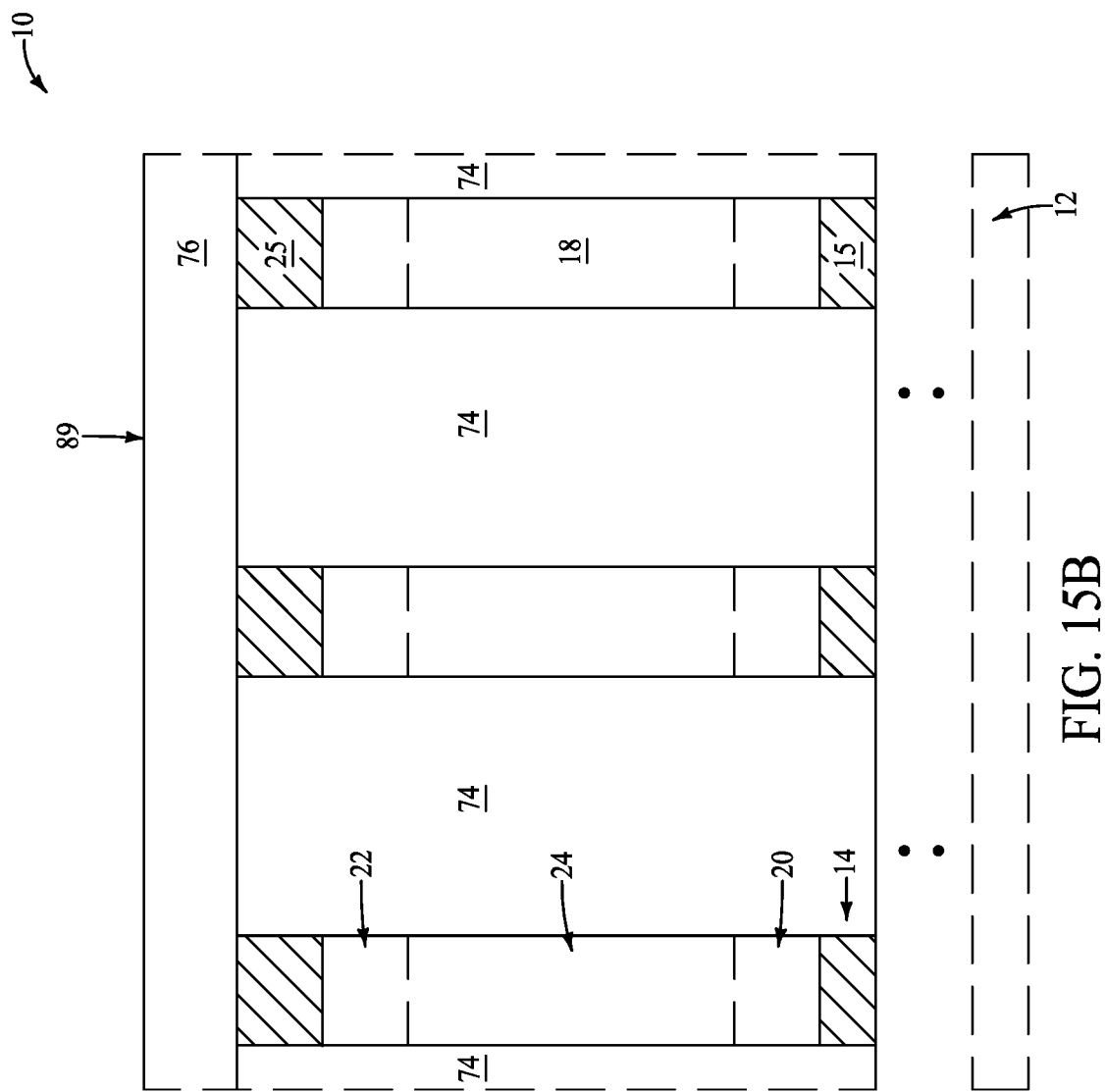

Referring to FIGS. 15-15B, recesses 86 are formed over the gating structures 26, and such recesses are filled with a second protective material 88. The second protective material may comprise any suitable composition(s), and in some embodiments may comprise, consist essentially of, or consist of aluminum oxide. In some embodiments, the material 76 is selectively removable relative to the material 88, and additionally silicon dioxide (e.g., material 48) and other materials of the assembly 10 may also be selectively removable relative to the protective material 88.

A planarized surface 89 is formed to extend across the materials 76 and 88. The planarized surface 89 may be formed with any suitable processing, including, for example, CMP.

Figure 16:
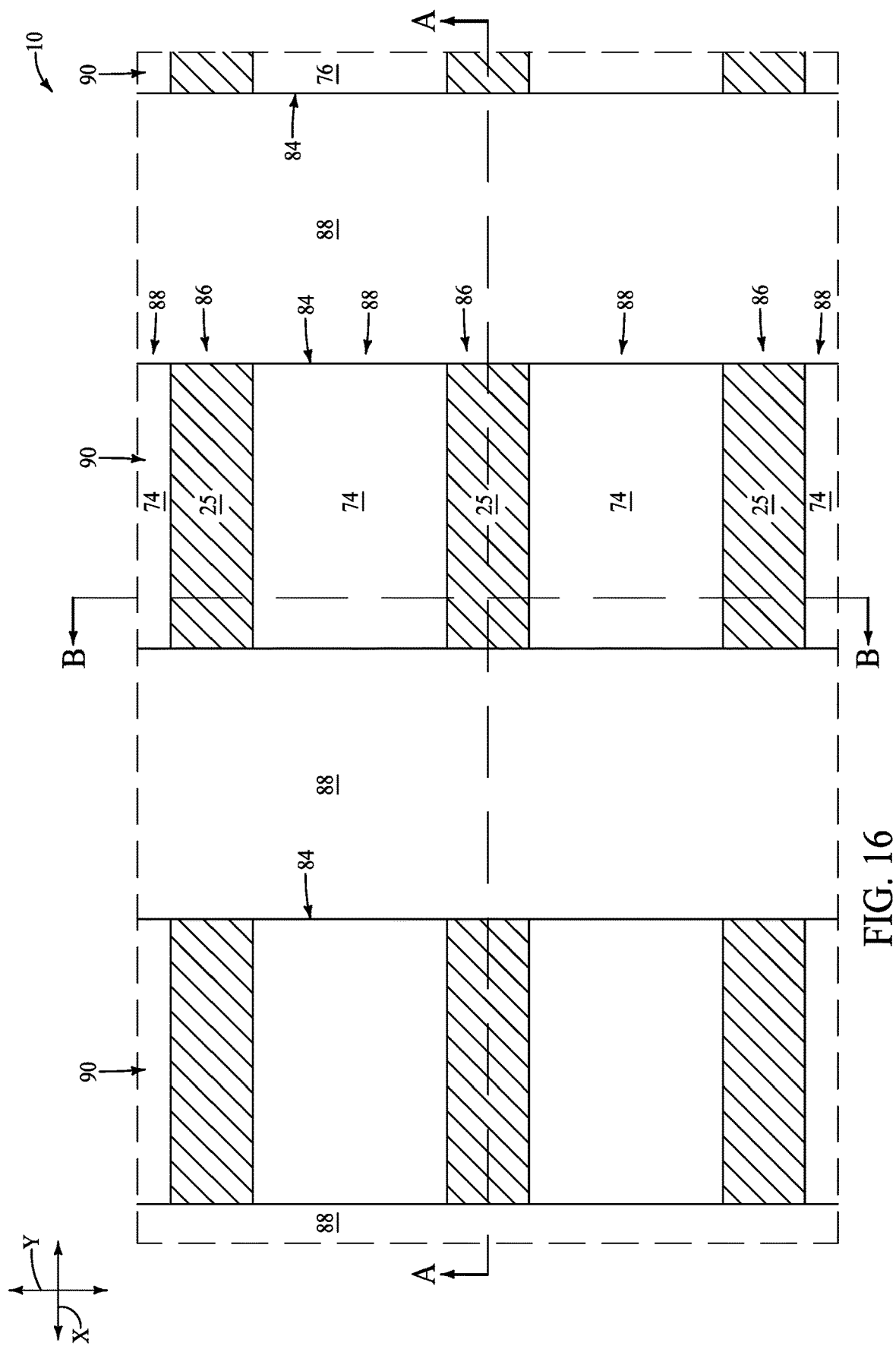
FIGS. 16-16B are a diagrammatic top-down view (FIG. 16) and diagrammatic cross-sectional side views (FIGS. 16A and 16B) of the example regions of the example integrated assembly at an example process stage following the process stage of FIGS. 15-15B. The views of FIGS. 16A and 16B are along the lines A-A and B-B, respectively, of FIG. 16.
Figure 16A:
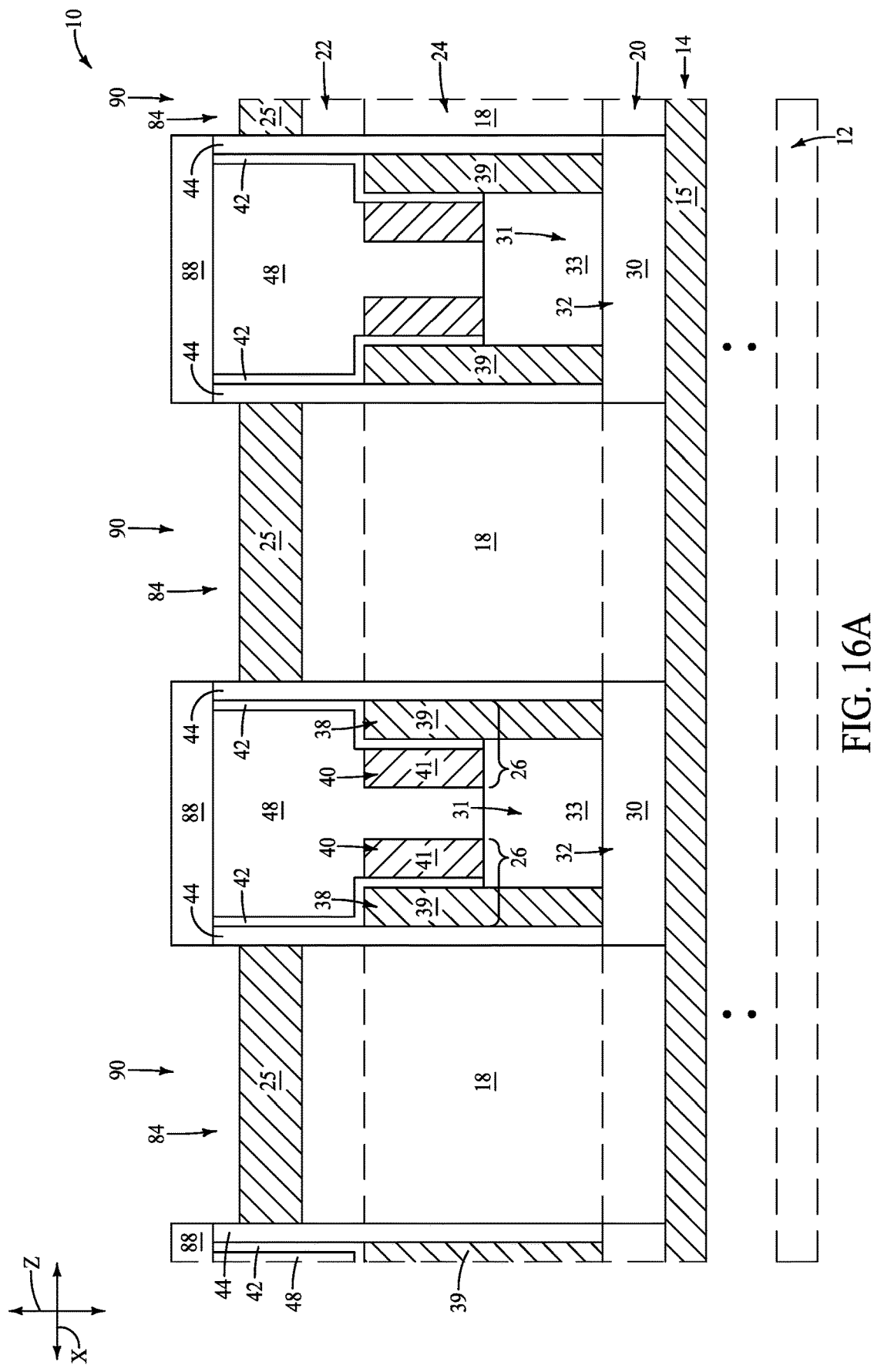
Figure 16B:
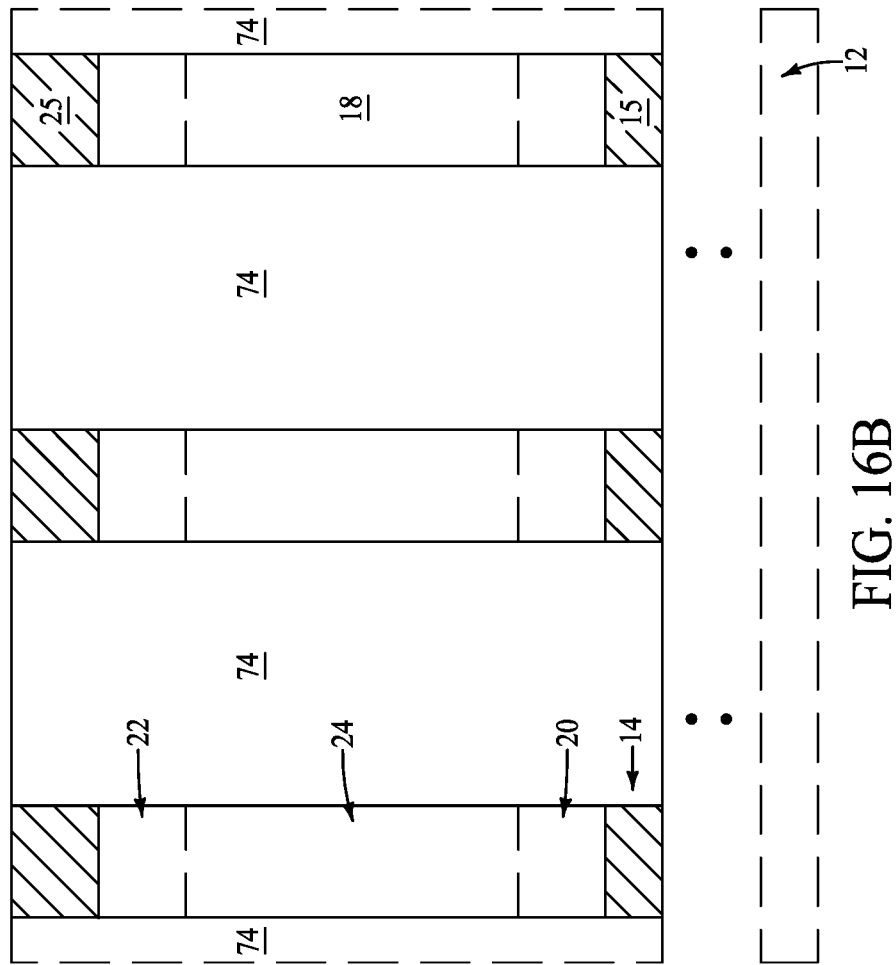

Referring to FIGS. 16-16B, the protective material 76 is selectively removed relative to the materials 88, 25 and 44. Such forms recesses 90 over the linear structures 84, and thus exposes the linear structures 84. The top view of FIG. 16 shows that the linear structures 84 comprise the alternating first and second column structures 86 and 88 described above with reference to FIGS. 9-9B.

Figure 17:
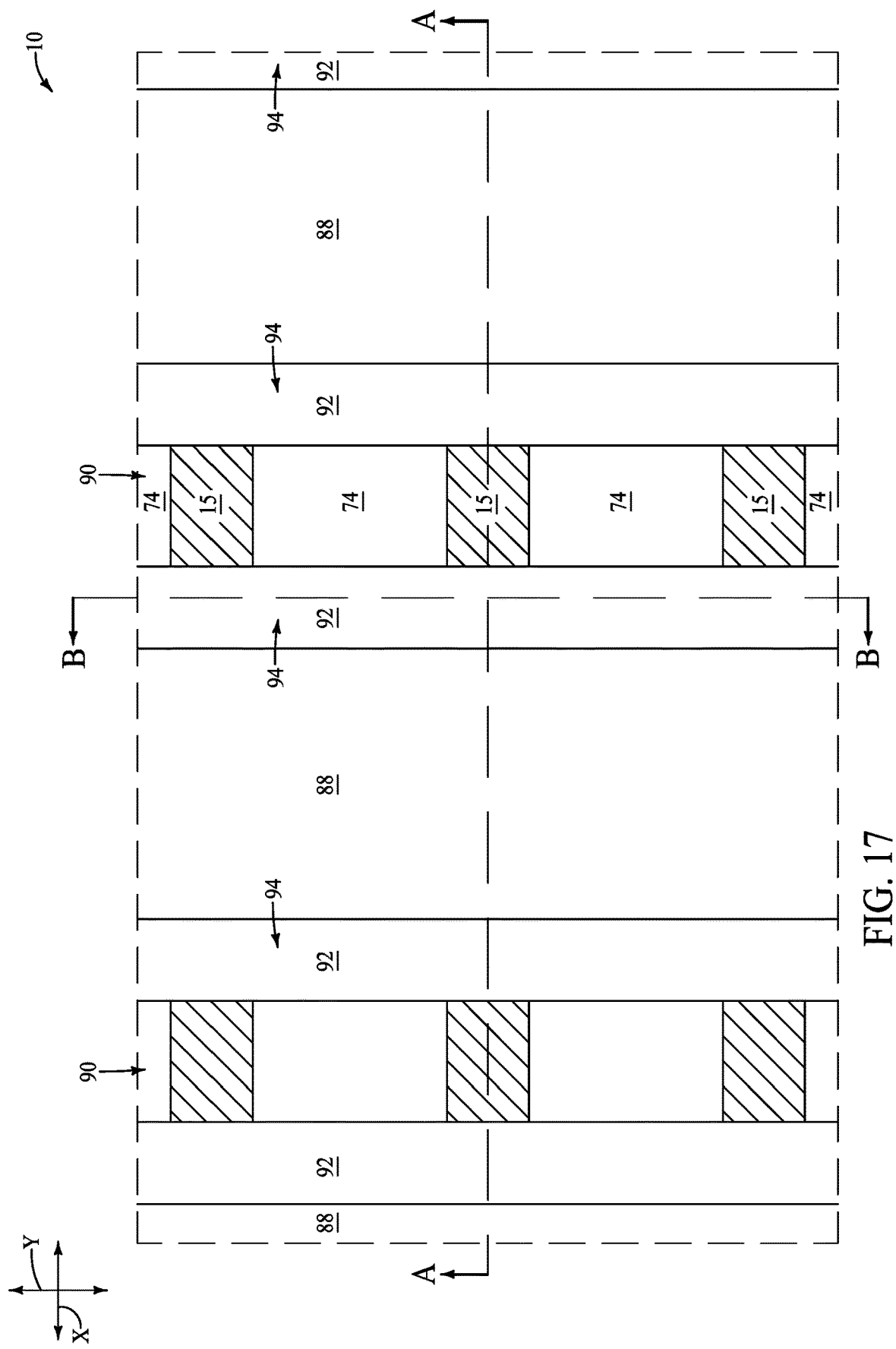
FIGS. 17-17B are a diagrammatic top-down view (FIG. 17) and diagrammatic cross-sectional side views (FIGS. 17A and 17B) of the example regions of the example integrated assembly at an example process stage following the process stage of FIGS. 16-16B. The views of FIGS. 17A and 17B are along the lines A-A and B-B, respectively, of FIG. 17.
Figure 17A:
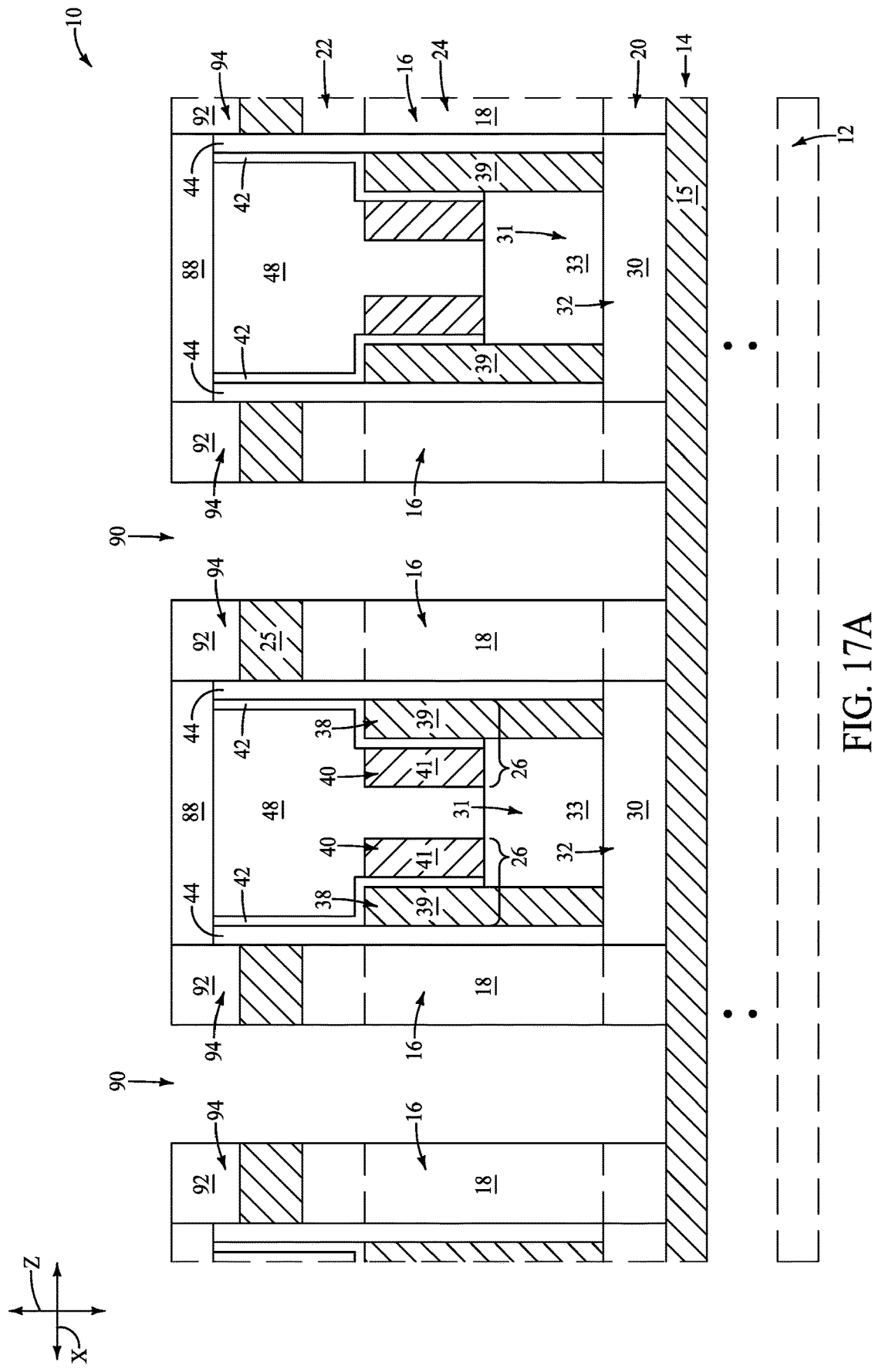
Figure 17B:
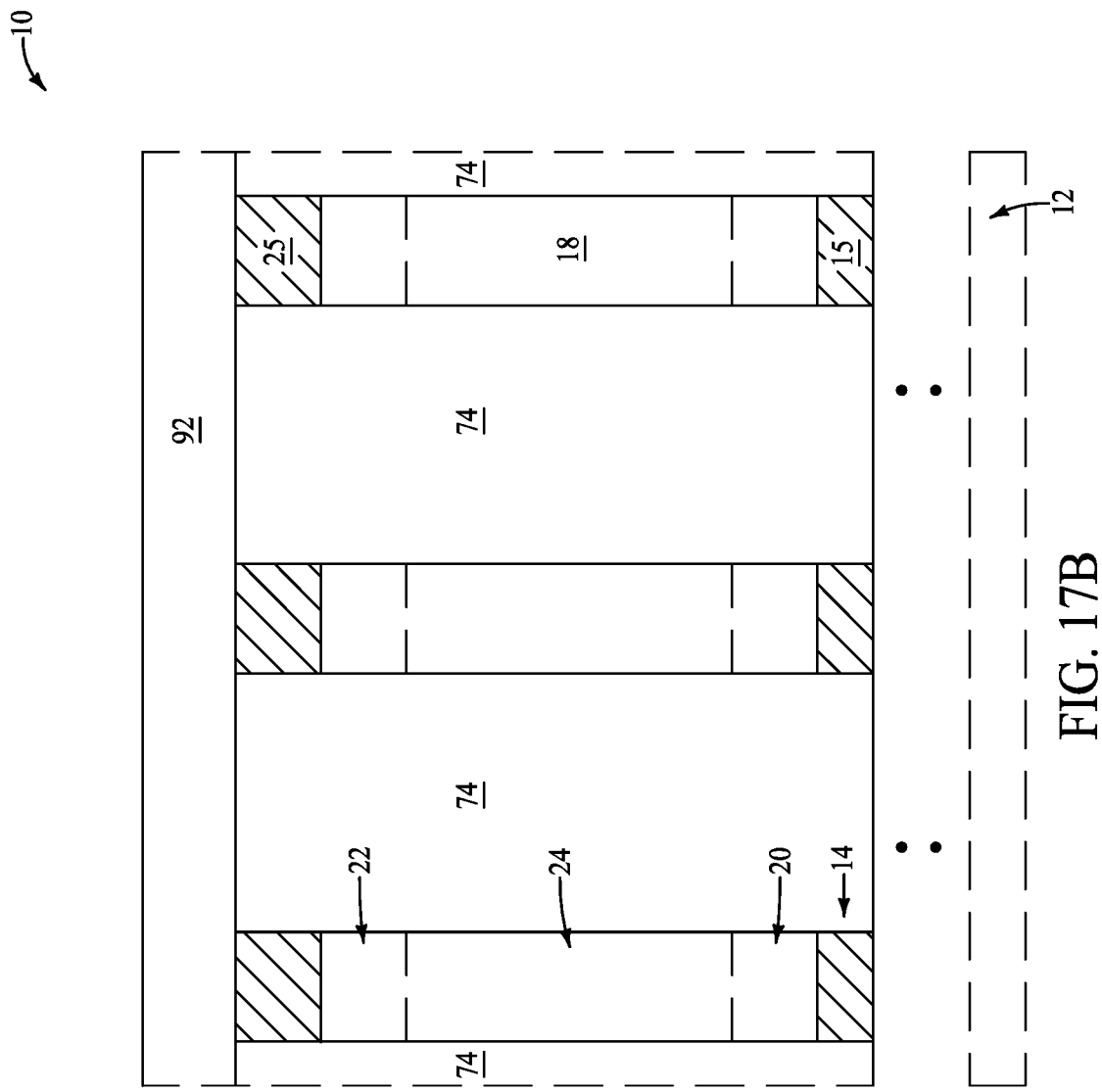

Referring to FIGS. 17-17B, protective material 92 is formed within the recesses 90, and is patterned into spacers 94. The spacers 94 narrow the recesses (gaps) 90. The narrowed recesses are extended through the linear structures 84 (FIG. 16) and pattern the column structures 86 (FIG. 16) into the pillars 16.

Figure 18:
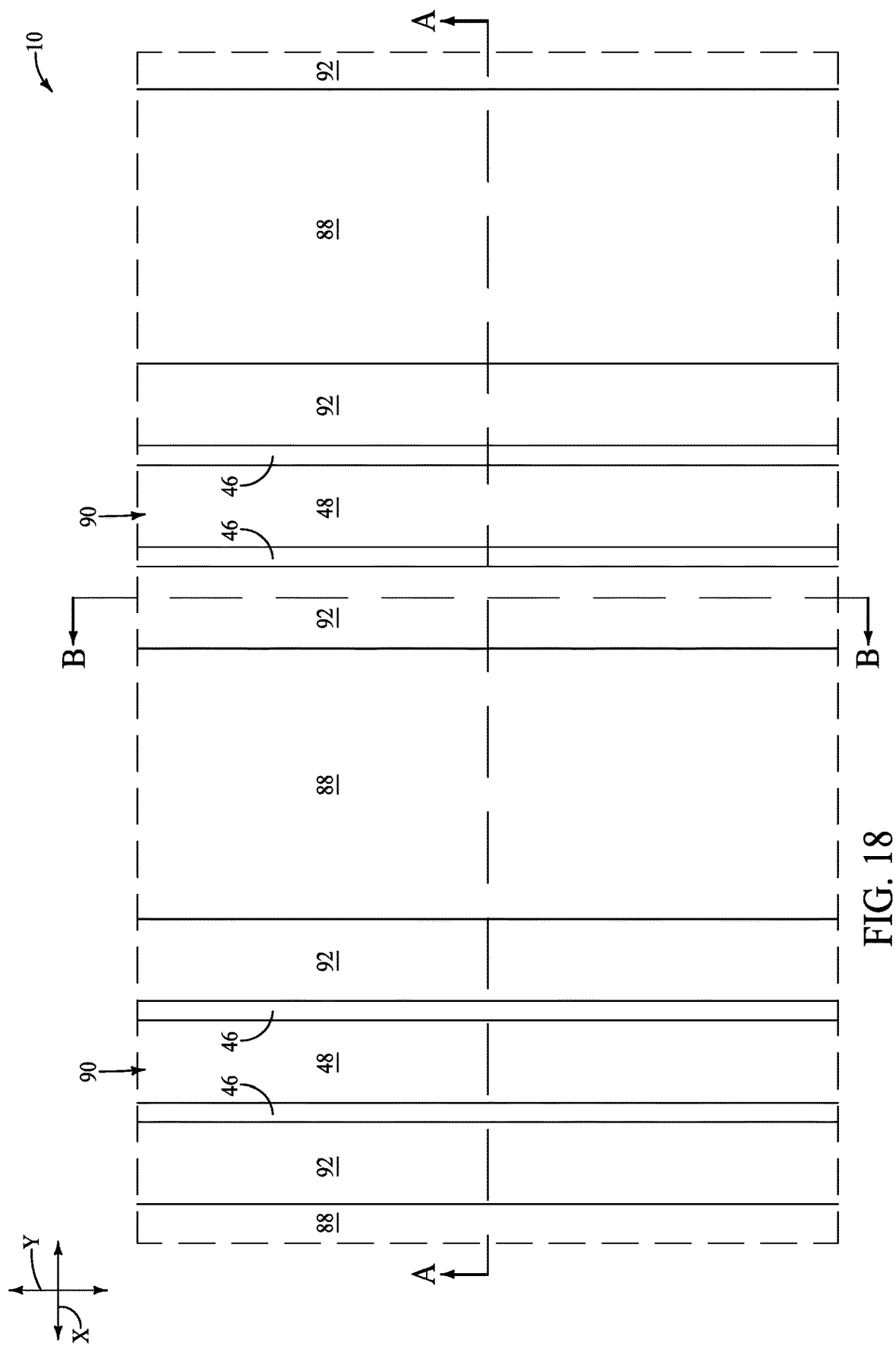
FIGS. 18-18B are a diagrammatic top-down view (FIG. 18) and diagrammatic cross-sectional side views (FIGS. 18A and 18B) of the example regions of the example integrated assembly at an example process stage following the process stage of FIGS. 17-17B. The views of FIGS. 18A and 18B are along the lines A-A and B-B, respectively, of FIG. 18.
Figure 18A:
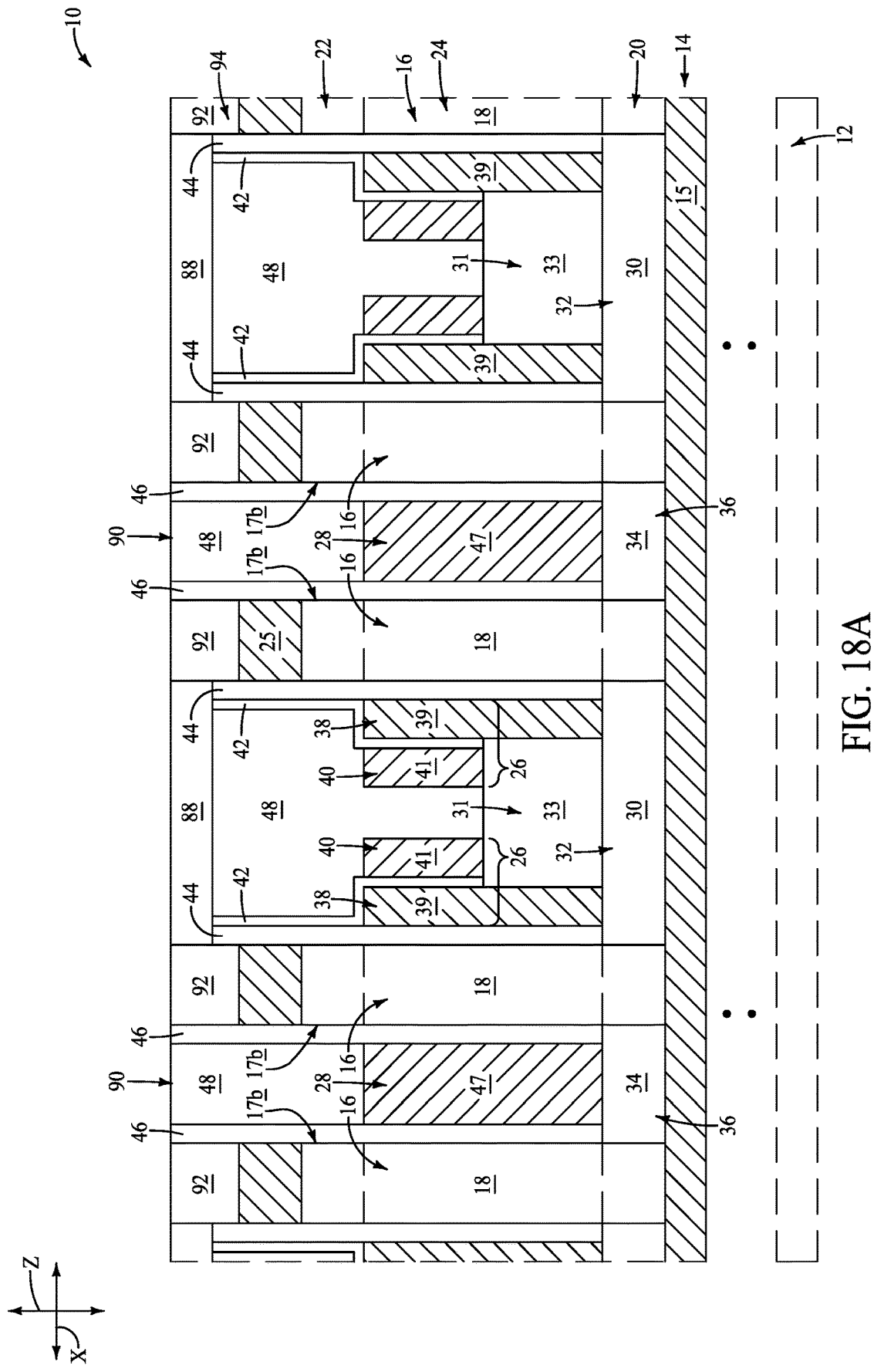
Figure 18B:
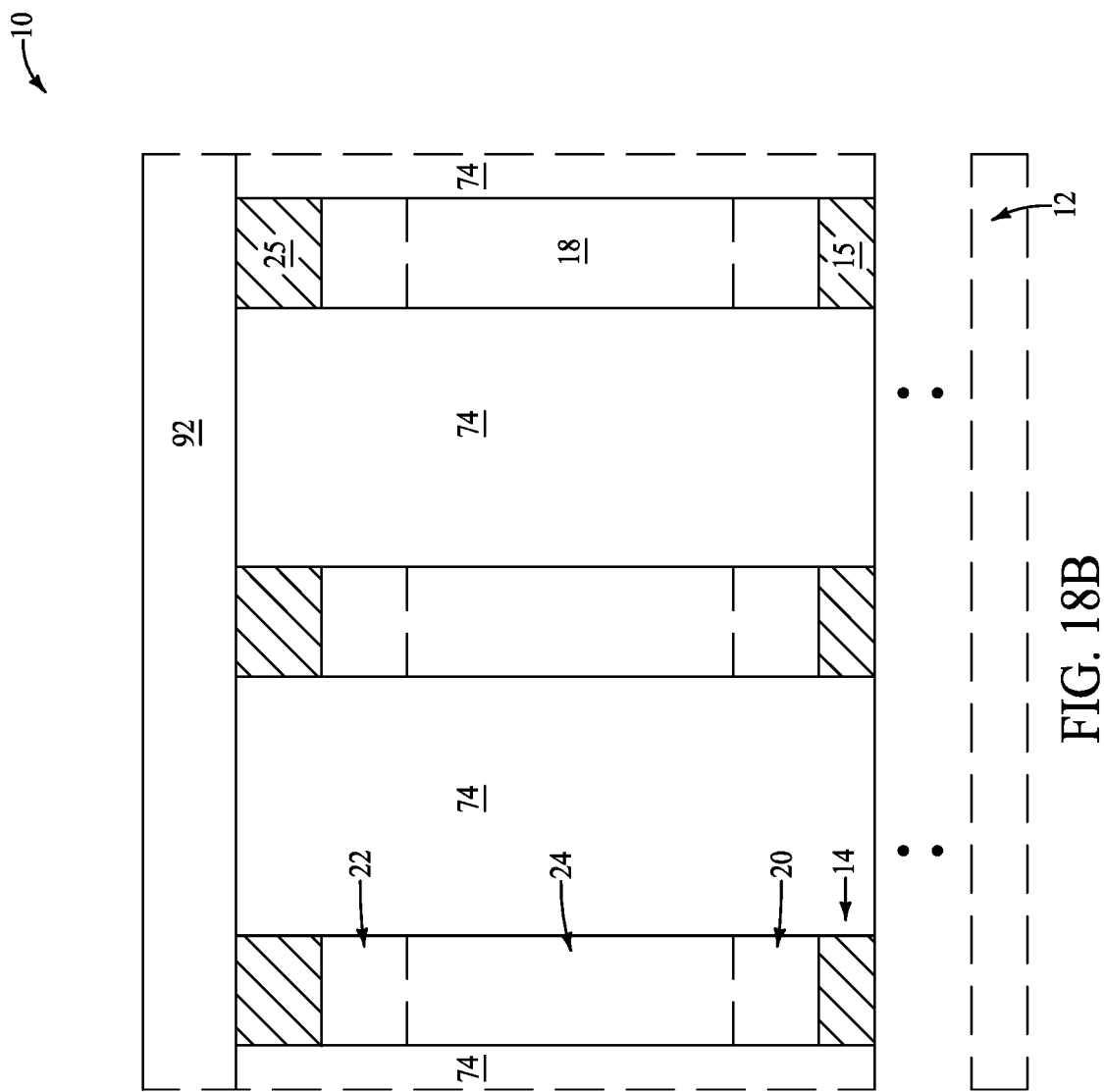

Referring to FIGS. 18-18B, the insulative material 34 is formed within the narrowed gaps 90 to form the steps 36. The insulative material 46 is formed along sidewall surfaces 17b of the pillars 16, and over the steps 36. Subsequently, the conductive material 47 is formed over the steps 34, and is patterned into the conductive structures 28. The insulative material 48 is then formed over the conductive structures 28. Although the insulative material 46 is shown being formed after the steps 36, in other embodiments the insulative material 46 may be formed prior to the steps 36, and accordingly may extend along sides of the steps 36.

Figure 19:
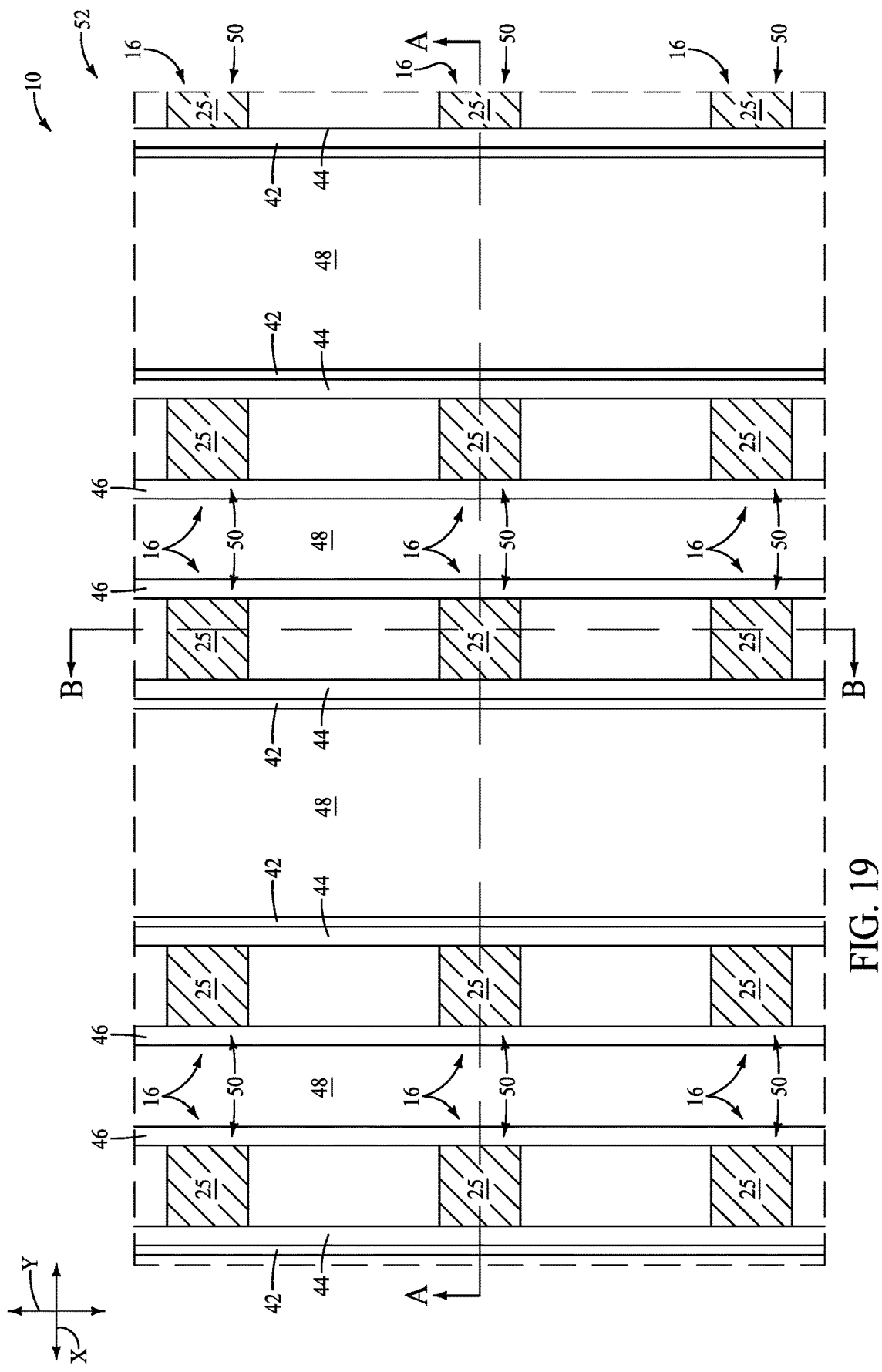
FIGS. 19-19B are a diagrammatic top-down view (FIG. 19) and diagrammatic cross-sectional side views (FIGS. 19A and 19B) of the example regions of the example integrated assembly at an example process stage following the process stage of FIGS. 18-18B. The views of FIGS. 19A and 19B are along the lines A-A and B-B, respectively, of FIG. 19.
Figure 19A:
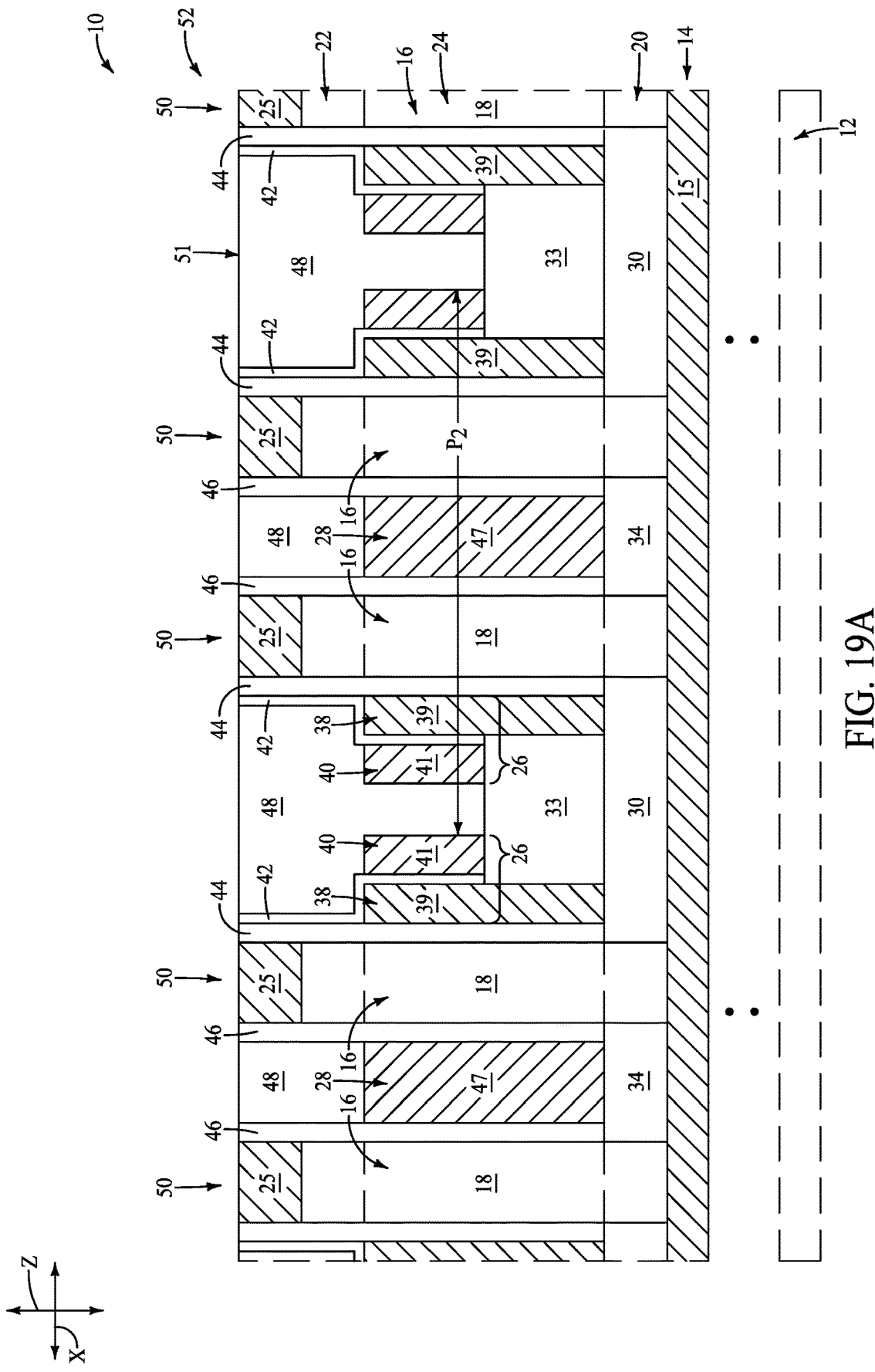
Figure 19B:
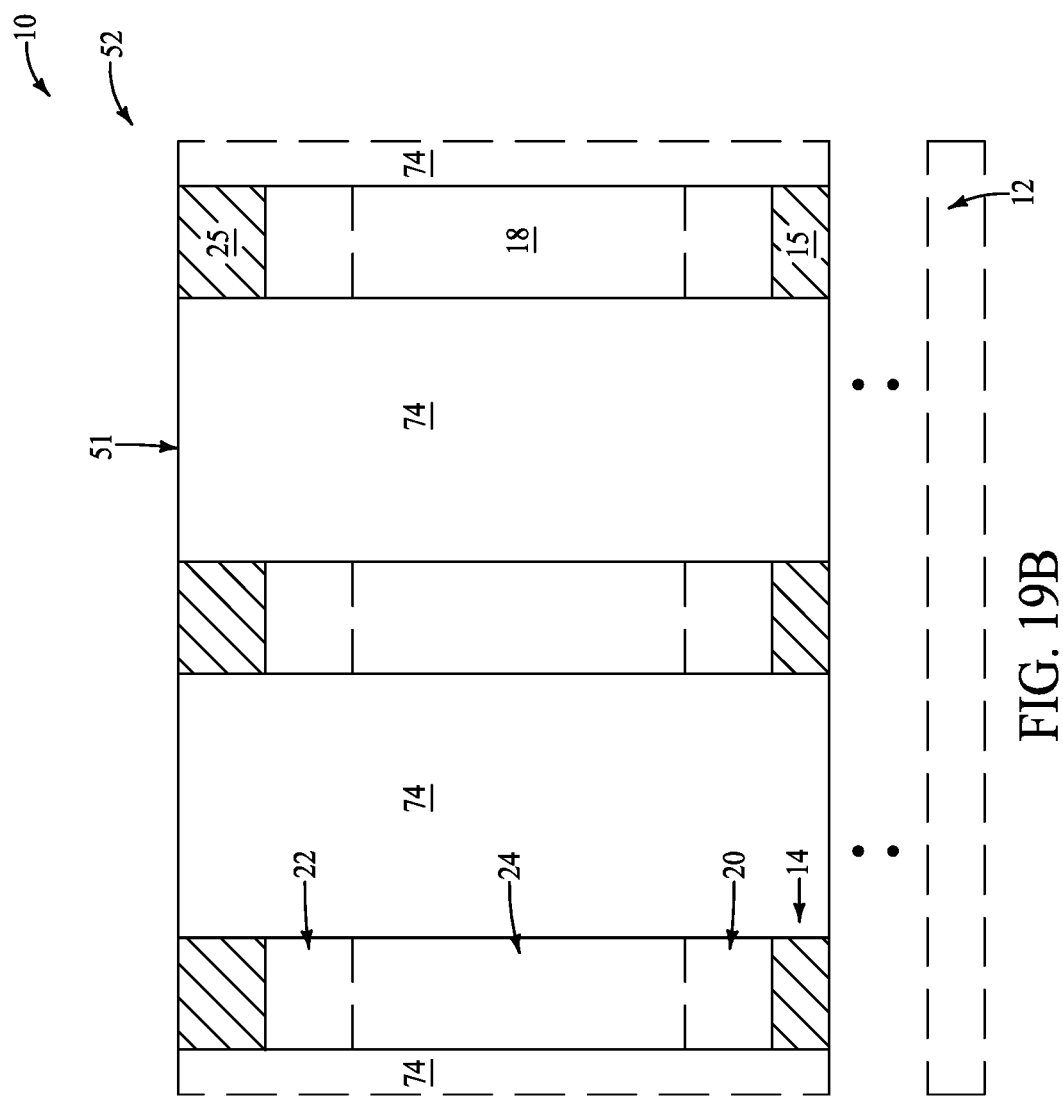

Referring to FIGS. 19-19B, the planarized surface 51 is formed to extend across the materials 25, 42, 44 and 48, and to thereby form a configuration analogous to that described above with reference to FIG. 1. The pillars 16 of FIGS. 19-19B may be considered to be arranged in an array (e.g., the memory array 52). The gating structures 26 may be considered to extend along rows of the array, and the conductive lines 14 may be considered to extend along columns of the array.

The conductive lines 14 may be considered to correspond to first linear structures which extend along the x-axis direction, and which are on the first pitch $P_1$ shown in FIG. 5. The conductive structures 26 may be considered to correspond to second linear structures which extend along the y-axis direction, and which are on a second pitch $P_2$ as shown in FIG. 19A. In some embodiments, the second pitch ($P_2$) may be about twice as large as the first pitch ($P_1$).

Figure 20:
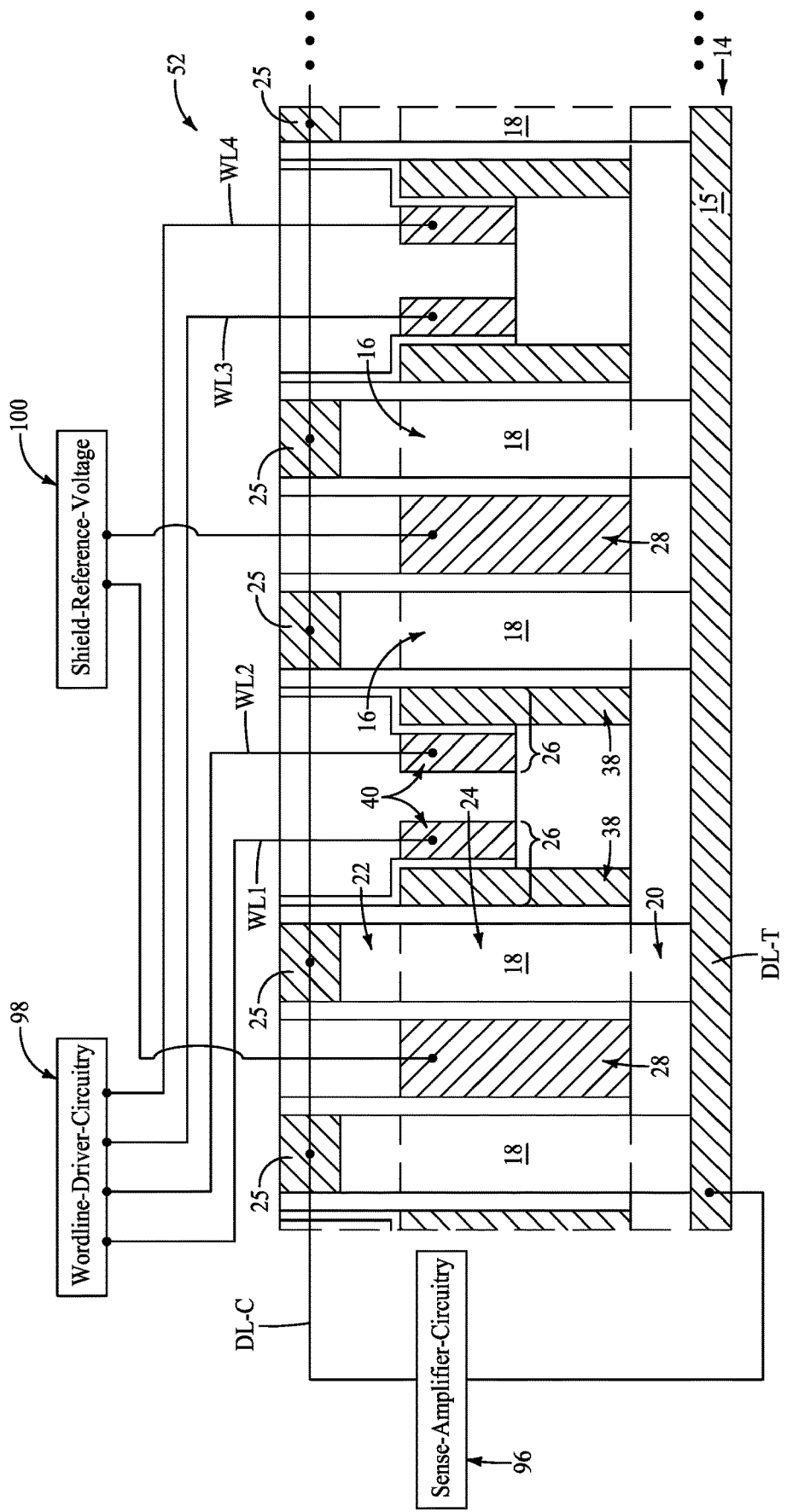
FIG. 20 is a diagrammatic cross-sectional side view of the assembly of FIG. 19A incorporated into an example integrated memory configuration.
Figure 21:
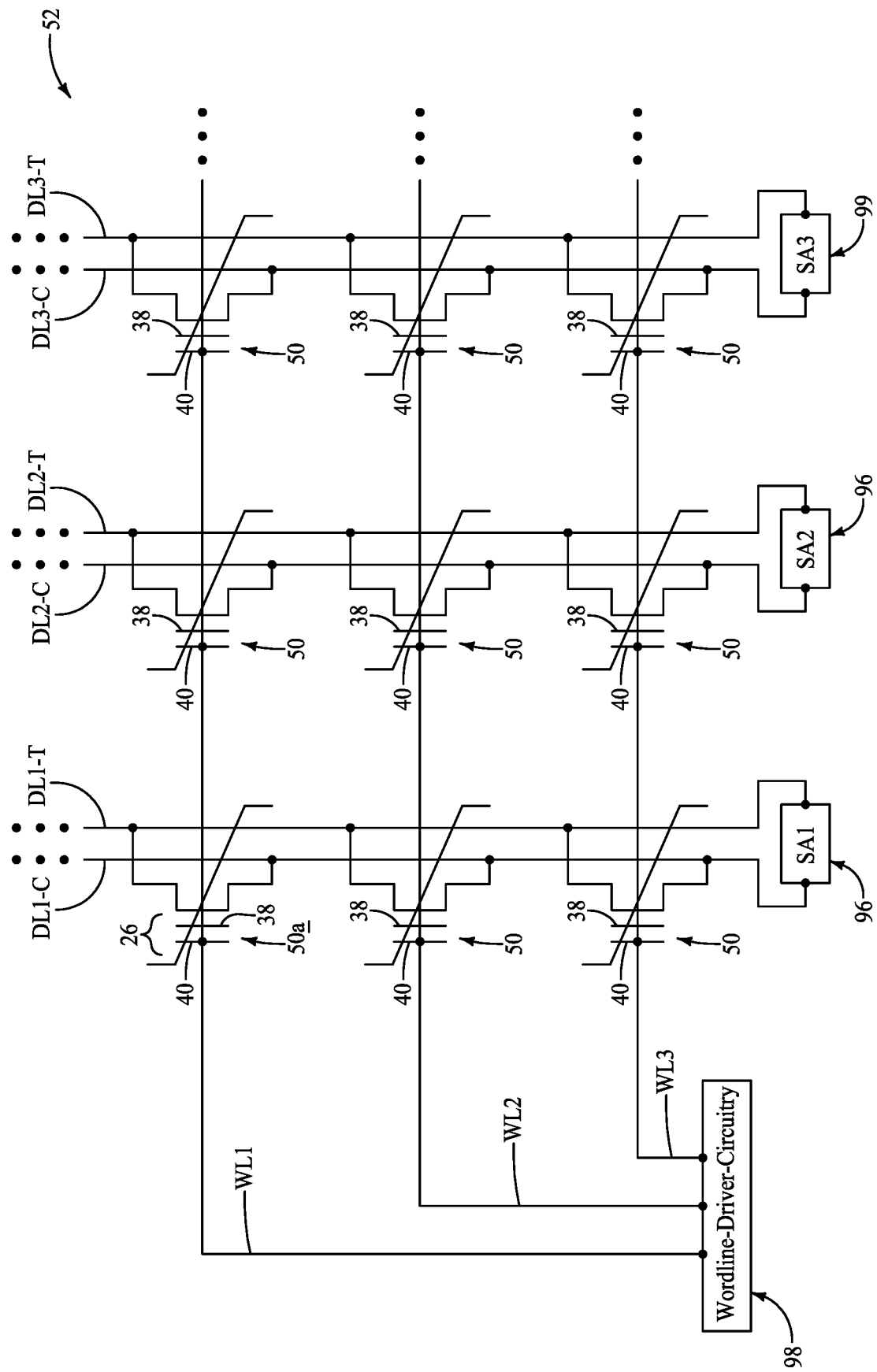
FIG. 21 is a diagrammatic schematic illustration of an example integrated memory array.

FIG. 20 shows the configuration of FIG. 19A incorporated into an example memory array 52. The conductive line 14 is a first comparative digit lines DL-T. The upper conductive material 25 of the pillars 26 is coupled to a second comparative digit line DL-C. The second comparative digit line is comparatively coupled to the first comparative digit line through sense-amplifier-circuitry 96. For purposes of understanding this disclosure and the claims that follow, a first digit line is "comparatively coupled" with a second digit line through sense-amplifier-circuitry if the sense-amplifier-circuitry is configured to compare electrical properties (e.g., voltages) of the first and second digit lines with one another.

The conductive components 40 of the gating structures 26 are coupled with wordline-driver-circuitry 98.

The conductive structures 28 are coupled with a shield-reference-voltage-source 100. The shield-reference-voltage-source may be any suitable voltage, and in some embodiments may be at a voltage within a range of from about ground to about VCC/2.

The memory array 52 may comprise any suitable configuration. An example configuration is shown schematically in FIG. 21. The memory array 52 includes a first set of digit lines corresponding to "true" digit lines, and comprising the digit lines DL1-T, DL2-T and DL3-T, and includes a second set of digit lines corresponding to "complementary" digit lines, and comprising the digit lines DL1-C, DL2-C and DL3-C. The terms "true" and "complementary" are arbitrary. The electrical values of the true and complementary digit lines are utilized together during reading/writing operations of the memory cells 50. Specifically, digit lines of the second set are paired with digit lines of the first set (e.g., DL1-T and DL1-C are paired together), and the paired digit lines are comparatively coupled to one another through the sense-amplifier-circuitry 96. For instance, the digit lines DL1-T and DL1-C are comparatively coupled to one another through the sense-amplifier-circuitry 96 labeled as SAL The circuitry 96 may be utilized to compare electrical properties of a true digit line (e.g., DL1-T) with those of a paired comparative digit line (e.g., DL1-C) during a READ operation. Alternatively, or additionally, the circuitry 96 may be utilized to impart desired electrical properties to the true and complementary comparative digit lines (e.g., DL1-T and DL1-C) during a programming (i.e., WRITE) operation.

The gating components 40 are along wordlines WL1-WL3, which are coupled with wordline-driver-circuitry. Each of the memory cells 50 is uniquely addressed by one of the wordlines in combination with one of the sets of paired comparative digit lines. For instance, one of the memory cells 50 is labeled as 50a so that it may be identified relative to the other memory cells. The memory cell 50a is addressed by the wordline WL1 in combination with the set of paired comparative digit lines DL1-C and DL1-T.

Figure 22:
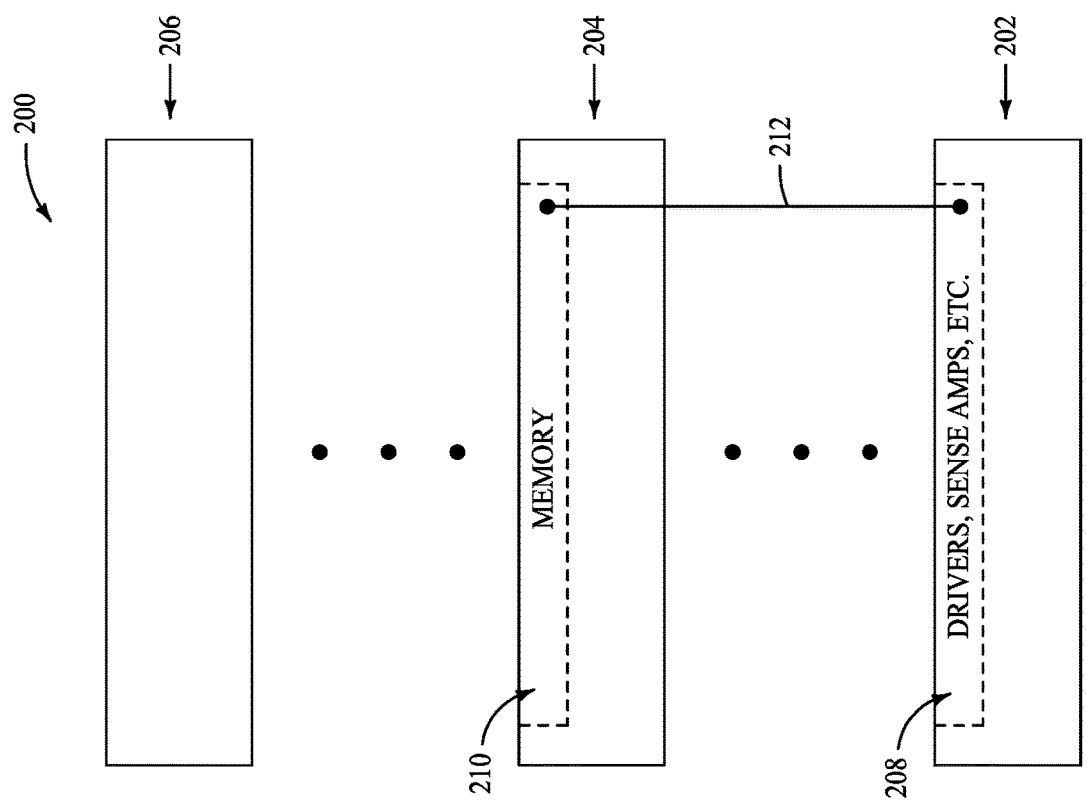
FIG. 22 is a diagrammatic cross-sectional side view of a region of an example multitier integrated assembly.

In some embodiments, the memory arrays discussed above (e.g., the memory arrays 52 of FIGS. 1, 2, 20 and 21) may be within a memory tier (i.e., memory deck) which is within a vertically-stacked arrangement of tiers (or decks). The vertically-stacked arrangement may be referred to as a multitier assembly. FIG. 22 shows a portion of an example multitier assembly 200 comprising a vertically-stacked arrangement of tiers 202, 204 and 206. The vertically-stacked arrangement may extend upwardly to include additional tiers. The tiers 202, 204 and 206 may be considered to be examples of levels that are stacked one atop the other. The levels may be within different semiconductor dies, or at least two of the levels may be within the same semiconductor die.

The bottom tier 202 may include control circuitry and/or sensing circuitry 208. The circuitry 208 may include, for example, drivers (e.g., wordline-driver-circuitry), sense-amplifier-circuitry, etc., and in some applications may comprise CMOS circuitry. The upper tiers 204 and 206 may include memory arrays, such as, for example, one or more of the memory arrays 52 described above; with an example memory array being shown as "memory" 210 within the tier 204.

The circuitry from the upper tiers may be electrically connected to the circuitry of the lower tiers through electrical interconnects. An example electrical interconnect 212 is shown electrically coupling the memory circuitry 210 from the tier 204 with the circuitry 208 of the tier 202. In some embodiments, the interconnect 212 may connect digit lines from the memory circuitry 210 with sense amplifiers of the circuitry 208, may connect wordlines, mux lines, etc., of the memory circuitry 210 with drivers of the circuitry 208, etc.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a ferroelectric transistor having an active region which includes a first source/drain region, a second source/drain region vertically offset from the first source/drain region, and a channel region between the first and second source/drain regions. A first conductive gate is operatively adjacent the channel region of the active region. Insulative material is between the first conductive gate and the channel region. A second conductive gate is adjacent the first conductive gate. The second conductive gate is vertically shorter than the first conductive gate. Ferroelectric material is between the first and second conductive gates.

Some embodiments include an integrated assembly having a first comparative digit line, and having pillars extending upwardly from the first comparative digit line. The pillars comprise semiconductor material. Each of the pillars includes, in ascending order, a first source/drain region, a channel region, and a second source/drain region. The first source/drain regions are coupled with the first comparative digit line. A second comparative digit line is coupled with the second source/drain regions. The first and second comparative digit lines are comparatively coupled to one another through sense-amplifier-circuitry. Each of the pillars has a first sidewall surface and an opposing second sidewall surface along a cross-section. Gating structures are adjacent the first sidewall surfaces and vertically overlap the channel regions. Each of the gating structures includes a first component which is electrically floating, a second component which is coupled with driver circuitry, and a ferroelectric material between the first and second components. Conductive structures are adjacent the second sidewall surfaces and vertically overlap the channel regions. The conductive structures are configured to drain excess carrier from the channel regions and thereby alleviate floating body effects.

Some embodiments include a method of forming an integrated assembly. A stack is formed to comprise an upper conductive material, a lower conductive material, and semiconductor material between the upper and lower conductive materials. The stack is patterned into first linear structures. The first linear structures extend along a first direction. Bottom portions of the first linear structures are conductive lines and comprise the lower conductive material. Upper portions of the first linear structures comprise the semiconductor material and the upper conductive material. First insulative material is formed between the first linear structures. The first insulative material and the upper portions of the first linear structures are patterned into second linear structures. The second linear structures extend in a second direction which intersects the first direction. Regions of the second linear structures are over the conductive lines. The second linear structures comprise first and second column structures which alternate with one another along the second direction. The first column structures comprise the upper portions of the first linear structures, and the second column structures comprise the first insulative material. First insulative steps are formed between the second linear structures. Second insulative material is formed along sidewall surfaces of the second linear structures. First conductive gate components are formed adjacent the second insulative material and are supported by the first insulative steps. Second insulative steps are formed between the first conductive gate components. Ferroelectric material is formed along sidewalls of the first conductive gate components. Second conductive gate components are formed adjacent the ferroelectric material and supported by the second insulative steps. The first column structures are separated into pillars. The pillars are arranged in an array. The first and second conductive gate components extend along rows of the array. The conductive lines extend along columns of the array.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A ferroelectric transistor, comprising:
an active region which includes a first source/drain region, a second source/drain region vertically offset from the first source/drain region, and a channel region between the first and second source/drain regions;
a first conductive gate operatively adjacent the channel region of the active region;
insulative material between the first conductive gate and the channel region;
a second conductive gate adjacent the first conductive gate, the second conductive gate being vertically shorter than the first conductive gate; and
ferroelectric material between the first and second conductive gates.

2. The ferroelectric transistor of claim 1 wherein:
the active region has a pair of opposing surfaces along a cross-section;
the first conductive gate is adjacent one of the opposing surfaces and a conductive structure is adjacent the other of the opposing surfaces;
the conductive structure vertically overlaps the channel region; and
the insulative material is a first insulative material, and a second insulative material is between the conductive structure and the channel region.

3. The ferroelectric transistor of claim 2 wherein the conductive structure is configured to drain excess carrier from the channel region and thereby alleviate floating body effects.

4. The ferroelectric transistor of claim 2 wherein the first and second insulative materials comprise a same composition as one another.

5. The ferroelectric transistor of claim 2 wherein the first and second insulative materials comprise different compositions relative to one another.

6. The ferroelectric transistor of claim 1 wherein an upper surface of the second conductive gate is at about a same height as an upper surface of the first conductive gate.

7. The ferroelectric transistor of claim 1 wherein the ferroelectric material extends above the first conductive gate.

8. The ferroelectric transistor of claim 1 wherein the ferroelectric material does not extend above the first conductive gate.

9. The ferroelectric transistor of claim 1 wherein the channel region comprises silicon.

10. The ferroelectric transistor of claim 1 wherein the channel region comprises semiconductor oxide.

11. The ferroelectric transistor of claim 1 wherein the channel region comprises indium, gallium, zinc and oxygen.

12. The ferroelectric transistor of claim 1 wherein the ferroelectric material has an average grain size associated therewith, and wherein the second conductive gate has a vertical length which is at least about twice as large as said average grain size.

13. The ferroelectric transistor of claim 12 wherein the average grain size is at least about 10 nm.

14. The ferroelectric transistor of claim 1 wherein the first conductive gate is more proximate the channel region than the second conductive gate.

15. The ferroelectric transistor of claim 1 wherein the second conductive gate extends vertically and terminates spaced from one of the first and second source/drain regions.

16. The ferroelectric transistor of claim 1 wherein the first and second conductive gates extend vertically and each terminate at one end in the same plane.

17. The ferroelectric transistor of claim 1 wherein the ferroelectric material extends over a terminal end of the first conductive gate.

18. The ferroelectric transistor of claim 1 wherein the ferroelectric material and the first conductive gate each terminate at one end in the same plane.

19. The ferroelectric transistor of claim 1 wherein the ferroelectric material, the first conductive gate and the second conductive gate each terminate at one end in the same plane.

20. The ferroelectric transistor of claim 1 wherein the active region has a pair of opposing surfaces along a cross-section, the first conductive gate is adjacent one of the opposing surfaces and a conductive structure is adjacent the other of the opposing surfaces.

21. The ferroelectric transistor of claim 20 wherein the conductive structure vertically overlaps the channel region.

22. The ferroelectric transistor of claim 20 wherein the conductive structure is configured to drain excess carrier from the channel region and thereby alleviate floating body effects.

23. The ferroelectric transistor of claim 1 wherein the conductive structure and the first conductive gate extend vertically and each terminate at one end in the same plane.

24. The ferroelectric transistor of claim 1 wherein the conductive structure and the second conductive gate extend vertically and each terminate at one end in the same plane.

25. The ferroelectric transistor of claim 1 wherein the conductive structure and the ferroelectric material extend vertically and each terminate at one end in the same plane.

26. The ferroelectric transistor of claim 1 wherein the ferroelectric material, the first conductive gate, the second conductive gate and the conductive structure each terminate at one end in the same plane.

* * * * *